US006498392B2

(12) United States Patent
Azuma

(10) Patent No.: US 6,498,392 B2
(45) Date of Patent: Dec. 24, 2002

(54) SEMICONDUCTOR DEVICES HAVING DIFFERENT PACKAGE SIZES MADE BY USING COMMON PARTS

(75) Inventor: Kosuke Azuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/767,761

(22) Filed: Jan. 23, 2001

(65) Prior Publication Data

US 2001/0009301 A1 Jul. 26, 2001

(30) Foreign Application Priority Data

Jan. 24, 2000 (JP) ........................................ 2000-013794

(51) Int. Cl.[7] ............................................. H01L 23/495
(52) U.S. Cl. ....................... 257/676; 257/783; 257/787
(58) Field of Search ................................. 257/676, 666, 257/787, 783, 782

(56) References Cited

U.S. PATENT DOCUMENTS 4,884,124 A * 11/1989 Mori et al.
5,397,915 A * 3/1995 Nose
6,025,650 A * 2/2000 Tsuji et al.

FOREIGN PATENT DOCUMENTS

| JP | 8-115989 | 5/1996 |
| JP | 8-115991 | 5/1996 |
| JP | 9-162348 | 6/1997 |
| JP | 9-252014 | 9/1997 |
| JP | 10-22440 | 1/1998 |

* cited by examiner

Primary Examiner—Sheila V. Clark
(74) Attorney, Agent, or Firm—Hayes Soloway PC

(57) ABSTRACT

A semiconductor device having a semiconductor element and a plurality of segments formed by dividing a conductive plate. Some of the segments are electrically coupled with electrodes of said semiconductor element and constitute lead pad portions as mounting electrodes of the semiconductor device. Other segments among the plurality of divided segments constitute die pad portions on which the semiconductor element is mounted. The plurality of divided segments and the semiconductor element are sealed and supported together by a resin material portion. The resin material portion fills the space between the divided segments as the lead pad portions. Semiconductor devices having various package sizes can be fabricated by using standardized common parts.

49 Claims, 38 Drawing Sheets

133
113b 131

133  105(133) 103(133) 113b  105(133)
     113b 101d  141

101d
141

131f   133h   141

PRIOR ART

PRIOR ART

SEMICONDUCTOR DEVICES HAVING DIFFERENT PACKAGE SIZES MADE BY USING COMMON PARTS

FIELD OF THE INVENTION

The present invention relates generally to a surface mount type semiconductor device having a lead-less structure, and more particularly to a semiconductor device and a method of manufacturing the same in which common parts can be used among semiconductor devices having different package sizes.

BACKGROUND OF THE INVENTION

Recently, packages of components such as semiconductor integrated circuits, transistors, diodes and the like are downsized and made thin. In such components, existence of connecting leads gives large influence on the package size. Therefore, there is proposed a surface mount type semiconductor device having a lead-less structure in which connecting leads are not used. Especially, in a semiconductor integrated circuit device, it is required that a disposition pitch of connecting leads of a lead frame is minute, in order to realize a device having many lead pins. Also, width or thickness of each lead must be reduced and there is a possibility that the leads bend easily, causing short circuit between the leads. Alternatively, it is required that the package size is enlarged to realize a large disposition pitch of the leads.

Japanese patent laid-open publication No. 9-162348 discloses a semiconductor device having such lead-less structure. FIG. 40 is a cross sectional view of the semiconductor device disclosed in Japanese patent laid-open publication No. 9-162348. As shown in FIG. 40, a semiconductor element (element chip) 303 is fixed onto an element fixing resin board 301, and the upper side and peripheral area of the semiconductor element 303 are molded by package resin 305. Also, there are provided a plurality of projected portions 307 on the bottom surface of the package resin 305. The surface of each of the projected portions 307 is coated by a metal film 309. The metal films 309 are electrically coupled with the semiconductor element 303 via bonding wires 311, within the package resin 305. Thereby, the metal films 309 function as mounting electrodes for mounting the semiconductor device onto a printed circuit board and the like. Thus, in the semiconductor device shown in FIG. 40, mounting electrodes are formed directly on the bottom surface of the package, and it is not necessary to use a lead-frame. Therefore, it is possible to avoid the above-mentioned disadvantages caused by the lead-frame. Also, the package is effectively downsized and made thin.

Japanese patent laid-open publication No. 9-252014 discloses another semiconductor device of this type. FIG. 41 is a cross sectional view of a semiconductor device disclosed in Japanese patent laid-open publication No. 9-252014. The semiconductor device of FIG. 41 is fabricated as follows. First, a metal foil is shaped into predetermined patterns to form a die pad portion 401 and a plurality of electrode portions 403. On the die pad portion 401, a semiconductor element 405 is mounted by using mounting material 407. The electrode portions 403 are then electrically coupled with the semiconductor element 405 by using bonding wires 409. Thereafter, the semiconductor element 405 and the bonding wires 409 are molded by package resin 411. In the semiconductor device shown in FIG. 41, the electrode portions 403 are exposed at the bottom surface of the package resin 411. Thereby, it is possible to realize a surface mount type semiconductor device having a lead-less structure. Thus, it is possible to downsize and thin down the package. In Japanese patent laid-open publication No. 9-252014, a method is also disclosed in which, before patterning a metal foil, a semiconductor element is mounted on the metal foil and wire bonding is performed, and thereafter the metal foil is patterned into desired patterns. Also, Japanese patent laid-open publication No. 10-22440 discloses a technology similar to that described above.

Further, there is known a technology disclosed in Japanese patent laid-open publication No. 8-115989 and Japanese patent laid-open publication No. 8-115991. FIG. 42 is a cross sectional view of a semiconductor device disclosed in Japanese patent laid-open publication No. 8-115989 and Japanese patent laid-open publication No. 8-115991. The semiconductor device shown in FIG. 42 has a frame-like terminal portion 501, and a plurality of column-like terminal portions 503 which are disposed within the frame-like terminal portion 501 and which are insulated from each other and from the frame-like terminal portion 501 via resin portion 505. A semiconductor element 509 is disposed on a patterned layer 507 formed on the frame-like terminal portion 501 and the column-like terminal portions 503. The semiconductor element 509 is electrically coupled with the patterned layer 507 via bonding wires 511. Thereby, the semiconductor element 509 is electrically coupled with the column-like terminal portions 503 via conducting pattern portions of the patterned layer 507. Further, the semiconductor element 509, the bonding wires 511 and the like are molded by resin 513. In this semiconductor device, the column-like terminal portions 503 are disposed in an area just under the semiconductor element 509 as electrodes for mounting. Therefore, it is possible to realize a semiconductor device having a grid array structure.

In each of the conventional semiconductor devices mentioned above, a relatively large number of fabrication steps are required and fabrication process becomes complicated, thereby manufacturing costs are increased. That is, in the semiconductor device shown in FIG. 40, it is necessary to provide the projected portions 307 at the bottom surface of the package resin 305, and to form the metal film 309 on the surface of the projected portions 307. The method of manufacturing such semiconductor device disclosed in Japanese patent laid-open publication No. 9-162348 is as follows. First, a metal base member is formed in which recessed portions are provided at portions corresponding to the projected portions 307. The metal film 309 is then selectively formed in each of the recessed portions. Then, mounting of the semiconductor element 303 and electrical connection between the semiconductor element 303 and the metal film 309 via bonding wires 311 are performed. Thereafter, molding by the package resin 305 is performed. The metal base member is finally removed to fabricate the semiconductor device. In this method, number of processes for selectively forming the metal film 309 is relatively large, and it is necessary to use the metal base member which becomes unnecessary after the completion of manufacturing. Therefore, manufacturing cost of the semiconductor device becomes large.

In the semiconductor device shown in FIG. 41, an etching process is required to pattern a metal foil into desired patterns when the die pad portions 401 and the electrode portions 403 are formed. Therefore, manufacturing process becomes complicated. Also, it is necessary to use a base member for supporting the metal foil when the metal foil is patterned. Since this base member becomes unnecessary after manufacturing the semiconductor device, it causes an increase in the manufacturing cost of the semiconductor device, as in the semiconductor device shown in FIG. 40. When the metal foil is patterned after packaging the semiconductor element, the base member becomes unnecessary. However, since the etching process is performed by wet etching, it is necessary to perform water-resistant protection of the package when the etching is performed. Therefore, manufacturing process becomes complicated and, in this respect, manufacturing costs of the semiconductor device become large.

Further, in the semiconductor device shown in FIG. 42, the pattern layer 507 is required between the frame-like terminal portion and the column-like terminal portions 501 and 503 and the semiconductor element 509 mounted thereon for selectively and electrically coupling the bonding wires 511 with the column-like terminal portions 503. Therefore, a large number of components are required and manufacturing costs of the semiconductor device become large. Also, number of manufacturing processes increases and manufacturing process becomes complicated.

Also, the above-mentioned conventional semiconductor devices have common problems as follows. In order to fabricate the above-mentioned semiconductor devices, components such as the metal film portions 309, the electrode portions 403 each made of a metal foil, the column-like terminal portions 503, the pattern layer 507 and the like are required as mounting terminals. It is necessary that these components are previously designed and manufactured into predetermined electrode arrangement patterns and sizes in compliance with kinds and sizes of the semiconductor elements 303, 405 and 509. Therefore, when a semiconductor element having different kind or size is to be mounted, it is necessary to again design and fabricate the above-mentioned components having different patterns and sizes. Also, when the components are to be previously fabricated and prepared, it is necessary to prepare a plurality kinds of components applicable to a plurality kinds or sizes of semiconductor elements. Therefore, manufacturing and management of the components used for fabricating the semiconductor devices become complicated.

SUMMARY OF THE INVENTION

Therefore, it is an object of the present invention to provide a surface mount type semiconductor device having a lead-less structure and a method of manufacturing the same in which the above-mentioned disadvantages of the prior art technology can be obviated.

It is another object of the present invention to provide a surface mount type semiconductor device having a lead-less structure and a method of manufacturing the same in which a simplified structure of the semiconductor device and a simplified manufacturing process thereof can be realized.

It is still another object of the present invention to provide a surface mount type semiconductor device having a lead-less structure and a method of manufacturing the same in which common parts can be utilized for making the semiconductor devices having different kinds and sizes.

According to an aspect of the present invention, there is provided a semiconductor device comprising: a semiconductor element; a plurality of divided segments formed by dividing a conductive plate, at least one of the divided segments being electrically coupled with an electrode of the semiconductor element; and a resin material portion supporting the plurality of divided segments and the semiconductor element together.

In this case, it is preferable that the at least one of the segments electrically coupled with the electrodes of the semiconductor element constitute lead pad portions as mounting electrodes, and at least one of other segments among the plurality of segments constitute die pad portions on which the semiconductor element is mounted.

It is also preferable that, among the plurality of segments, at least one of the segments located under the semiconductor element constitute die pad portions, and at least one of the segments which are disposed in the peripheral portion of the segments constituting the die pad portions and which are electrically coupled with the electrodes of the semiconductor element via bonding wires constitute lead pad portions.

It is further preferable that the resin material portion seals the semiconductor element and the bonding wires, and fills the space between the segments as the lead pad portions among the plurality of segments.

It is advantageous that the semiconductor element is mounted on the at least one of the segments as die pad portions via mounting material or tape-like adhesive.

It is also advantageous that a part of the segments located under the semiconductor element constitute die pad portions, and other part of the segments located under the semiconductor element are electrically coupled with electrodes of the semiconductor element via bumps and constitute lead pad portions.

It is further advantageous that the resin material portion seals the semiconductor element, and fills the space between the semiconductor element and the segments located under the semiconductor element and the space between the segments located under the semiconductor element.

It is preferable that the plurality of segments are formed by dividing a conductive plate into a lattice-like arrangement.

It is also preferable that each of the segments has a crank-like cross section in the direction of thickness of the conductive plate.

It is further preferable that the plurality of segments are disposed around the semiconductor element but are not disposed under the semiconductor element, at least one of the segments are electrically coupled with electrodes of the semiconductor element via bonding wires and constitute lead pad portions as mounting electrodes, and the resin material portion seals the semiconductor element and the bonding wires and fills the space between respective segments of the plurality of segments.

It is advantageous that the semiconductor element is a semiconductor integrated circuit chip, and electrodes of the semiconductor integrated circuit chip are respectively coupled with the segments as lead pad portions among the plurality of segments.

It is also advantageous that the semiconductor element is a diode chip, the diode chip is mounted on one of the plurality of segments, and an electrode of the diode chip is electrically coupled with other one of the segments adjacent the divided segment on which the diode chip is mounted.

It is further advantageous that the semiconductor element is a transistor chip, the transistor chip is mounted on one of the plurality of segments, and electrodes of the transistor chip are electrically coupled with two of the segments adjacent the divided segment on which the transistor chip is mounted.

It is preferable that a ball-like electrode is formed on the backside surface of the at least one of the segments constituting said lead pad portions.

It is also preferable that the bumps are solder bumps or studbumps.

It is further preferable that a resist film is formed on the backside surface of the at least one of the segments constituting said die pad portions.

It is advantageous that an outer dimension of a group of the segments which constitute the die pad portions and the lead pad portions is larger than an outer dimension of the semiconductor element.

It is also advantageous that an outer dimension of a group of the segments which constitute the die pad portions and the lead pad portions is substantially equal to an outer dimension of the semiconductor element.

According to another aspect of the present invention, there is provided a method of manufacturing a semiconductor device comprising: preparing a conductive plate; forming concave trenches in the conductive plate to form a plurality of segments; preparing a semiconductor element; mounting a semiconductor element on the conductive plate having the concave trenches formed therein; disposing resin material on the conductive plate wherein a part of the resin material enters at least a part of the concave trenches; and removing the backside portion of the conductive plate so as to expose bottom portions of the concave trenches.

In this case, it is preferable that, in the removing the backside of the conductive plate, the backside of the conductive plate is polished or etched so as to expose bottom portions of the concave trenches.

It is also preferable that, in the mounting a semiconductor element on the conductive plate, the semiconductor element is mounted on at least one of the segments; wherein the method further comprises electrically coupling electrodes of the semiconductor element with segments disposed around the at least one of the segments on which the semiconductor element is mounted; and wherein, in the disposing the resin material on the conductive plate, the semiconductor element and the bonding wires are sealed by the resin material, and the resin material fills the concave trenches between segments disposed around the at least one of the segments on which the semiconductor element is mounted.

It is further preferable that, in the preparing a semiconductor element, a semiconductor element having bumps formed thereon is prepared; wherein, in the mounting the semiconductor element on the conductive plate, electrodes of the semiconductor element are electrically coupled with at least one of segments disposed under the semiconductor element via the bumps; and wherein, in the disposing the resin material on the conductive plate, the semiconductor element is sealed by the resin material, and the resin material fills a space between the semiconductor element and the conductive plate.

It is advantageous that, in the forming concave trenches in the conductive plate to form a plurality of segments, the concave trenches are formed in lattice-like arrangement.

It is also advantageous that, in the forming concave trenches in the conductive plate to form a plurality of segments, the concave trenches are formed by using a technology selected from a group consisting of half-cut dicing, half-etching and press working.

It is further advantageous that, in the mounting a semiconductor element on the conductive plate, the semiconductor element is mounted on the conductive plate via mounting material or tape-like adhesive.

It is preferable that the method further comprises caving a portion of the conductive plate to form a concave portion, before the mounting a semiconductor element on the conductive plate; wherein, in the mounting a semiconductor element on the conductive plate, the semiconductor element is mounted in the concave portion via mounting material; wherein the method further comprises electrically coupling electrodes of the semiconductor element with segments disposed around the concave portion via bonding wires; wherein, in the disposing the resin material on the conductive plate, the semiconductor element and the bonding wires are sealed by the resin material, and the resin material fills the concave trenches between segments disposed around the concave portion; and wherein, in the removing the backside portion of the conductive plate, the mounting material is exposed.

It is also preferable that the semiconductor element is a semiconductor integrated circuit chip.

It is further preferable that the semiconductor element is a diode chip; wherein, in the mounting the semiconductor element on the conductive plate, the diode chip is mounted on one of the plurality of segments; wherein the method further comprises electrically coupling an electrode of the diode chip with one of the segments adjacent the divided segment on which the diode chip is mounted via a bonding wire; and wherein, in the disposing the resin material on the conductive plate, the diode chip and the bonding wire are sealed by the resin material, and the resin material fills the concave trench between the divided segment electrically coupled with the electrode of the diode chip and the divided segment on which the diode chip is mounted.

It is advantageous that the semiconductor element is a transistor chip; wherein, in the mounting the semiconductor element on the conductive plate, the transistor chip is mounted on one of the plurality of segments; wherein the method further comprises electrically coupling electrodes of the transistor chip with two of the segments adjacent the divided segment on which the transistor chip is mounted via bonding wires; and wherein, in the disposing the resin material on the conductive plate, the transistor chip and the bonding wires are sealed by the resin material, and the resin material fills the concave trenches between the segments electrically coupled with the electrodes of the transistor chip and the divided segment on which the transistor chip is mounted.

It is also advantageous that, in the disposing the resin material on the conductive plate, the resin material is disposed by using a technology selected from a group consisting of molding by a metal die, coating, and potting.

It is further advantageous that, in the preparing a semiconductor element, a plurality of semiconductor elements are prepared; wherein, in the mounting the semiconductor element on the conductive plate, the plurality of semiconductor elements are mounted on the conductive plate; and wherein, in the disposing the resin material on the conductive plate, the plurality of semiconductor elements are sealed by the resin material.

It is preferable that the method further comprises, after removing the backside portion of the conductive plate, cutting the resin material in predetermined locations to form separate semiconductor devices each including at least one semiconductor element.

It is also preferable that, in the forming concave trenches in the conductive plate to form a plurality of segments, the concave trenches are formed in lattice-like arrangement; wherein, in the preparing a semiconductor element, a semiconductor wafer on which a plurality of semiconductor elements are formed is prepared; wherein, in the mounting the semiconductor element on the conductive plate, the semiconductor wafer is mounted on the conductive plate and electrodes of each semiconductor element formed in the semiconductor wafer are electrically coupled with corresponding segments of the plurality of segments via bumps; wherein, in the disposing the resin material on the conductive plate, the resin material fills a space between the semiconductor wafer and the conductive plate; and wherein the method further comprises, after removing the backside portion of the conductive plate, cutting the semiconductor wafer and the resin material in predetermined locations to form separate semiconductor devices each including at least one semiconductor element.

According to still another aspect of the present invention, there is provided a method of manufacturing a semiconductor device comprising: preparing a conductive plate; preparing a supporting sheet; sticking the conductive plate on the supporting sheet; cutting the conductive plate stuck on the supporting sheet to form a plurality of segments supported by the supporting sheet; preparing a semiconductor element; mounting a semiconductor element on at least one of the plurality of segments; and disposing resin material on the plurality of segments, wherein a part of the resin material enters at least a part of spaces between the segments.

In this case, it is preferable that the method further comprises peeling the supporting sheet, after disposing the resin material.

It is also preferable that the supporting sheet has opening portions at predetermined locations, and is made of material which does not adhere to solder; and wherein, in the cutting the conductive plate stuck on the supporting sheet to form a plurality of segments supported by the supporting sheet, at least one of the segments is exposed via the opening portions of the supporting sheet.

It is further preferable that the method further comprises electrically coupling electrodes of the semiconductor element with segments disposed around the at least one of the segments on which the semiconductor element is mounted via bonding wires; and wherein, in the disposing the resin material, the semiconductor element and the bonding wires are sealed by the resin material, and the resin material fills spaces between segments disposed around the at least one of the segments on which the semiconductor element is mounted.

It is advantageous that, in the preparing a semiconductor element, a semiconductor element having electrodes on which bumps are formed is prepared; wherein, in the mounting a semiconductor element on at least one of the plurality of segments, electrodes of the semiconductor element are electrically coupled with at least one of the segments located under the semiconductor element via the bumps; and wherein, in the disposing the resin material, the semiconductor element is sealed by the resin material, and the resin material fills spaces between segments disposed under the semiconductor element and spaces between the semiconductor element and the segments located under the semiconductor element.

It is also advantageous that, in the cutting the conductive plate stuck on the supporting sheet to form a plurality of segments supported by the supporting sheet, the conductive plate is cut into lattice-like arrangement, and the supporting sheet is not cut substantially.

It is further advantageous that, in the mounting a semiconductor element on at least one of the segments, the semiconductor element is mounted on the at least one of the segments via mounting material or tape-like adhesive.

It is preferable that the semiconductor element is a semiconductor integrated circuit chip.

It is also preferable that the semiconductor element is a diode chip; wherein, in the mounting the semiconductor element on at least one of the segments, the diode chip is mounted on one of the plurality of segments; wherein the method further comprises electrically coupling an electrode of the diode chip with one of the segments adjacent the divided segment on which the diode chip is mounted via a bonding wire; and wherein, in the disposing the resin material, the diode chip and the bonding wire are sealed by the resin material, and the resin material fills a space between the divided segment electrically coupled with the electrode of the diode chip and the divided segment on which the diode chip is mounted.

It is further preferable that the semiconductor element is a transistor chip; wherein, in the mounting the semiconductor element on at least one of the segments, the transistor chip is mounted on one of the plurality of segments; wherein the method further comprises electrically coupling electrodes of the transistor chip with two of the segments adjacent the divided segment on which the transistor chip is mounted via bonding wires; and wherein, in the disposing the resin material, the transistor chip and the bonding wires are sealed by the resin material, and the resin material fills spaces between the segments electrically coupled with the electrodes of the transistor chip and the divided segment on which the transistor chip is mounted.

It is advantageous that, in the disposing the resin material, the resin material is disposed by using a technology selected from a group consisting of molding by a metal die, coating, and potting.

It is also advantageous that, in the preparing a semiconductor element, a plurality of semiconductor elements are prepared; wherein, in the mounting the semiconductor element on at least one of the segments, the plurality of semiconductor elements are mounted on the segments; and wherein, in the disposing the resin material, the plurality of semiconductor elements are sealed by the resin material.

It is further advantageous that, in the cutting the conductive plate stuck on the supporting sheet to form a plurality of segments supported by the supporting sheet, the conductive plate is cut into lattice-like arrangement; wherein, in the preparing a semiconductor element, a semiconductor wafer on which a plurality of semiconductor elements are formed is prepared; wherein, in the mounting a semiconductor element on at least one of the plurality of segments, the semiconductor wafer is mounted on the plurality of segments supported by the supporting sheet, and electrodes of each semiconductor element formed on the semiconductor wafer are electrically coupled with corresponding segments of the plurality of segments via bumps; wherein, in the disposing resin material, the resin material fills a space between the semiconductor wafer and a plurality of segments supported by the supporting sheet and spaces between respective segments of the plurality of segments; and wherein the method further comprises cutting the semiconductor wafer and the resin material in predetermined locations to form separate semiconductor devices each including at least one semiconductor element.

According to still another aspect of the present invention, there is provided a method of manufacturing a semiconductor device comprising: preparing a semiconductor element having electrodes on which bumps are formed; preparing a conductive plate; forming a first set of concave trenches in a lattice-like arrangement on the face side of the conductive plate; forming a second set of concave trenches in a lattice-like arrangement on the backside of the conductive plate, the second set of concave trenches are shifted from the first set of concave trenches in the direction along the surface of the conductive plate; mounting the semiconductor element on the face surface of the conductive plate, wherein electrodes of the semiconductor element are electrically coupled with segments divided by the first set of concave trenches via bumps; filling a space between the semiconductor element and the conductive plate with resin material; and cutting the conductive plate at locations shifted in the directions along the surface of the conductive plate from the first and second sets of concave trenches.

In this case, it is preferable that, in the preparing a semiconductor element having electrodes on which bumps are formed, a semiconductor wafer on which a plurality of semiconductor elements are formed thereon is prepared, and each of the semiconductor element has electrodes on which bumps are formed; wherein, in the mounting the semiconductor element on the face surface of the conductive plate, the semiconductor wafer is mounted on the face surface of the conductive plate, and electrodes of each of the semiconductor elements are electrically coupled with segments divided by the first set of concave trenches via bumps; wherein, in the filling a space between the semiconductor element and the conductive plate with resin material, the resin material fill a space between the semiconductor wafer and the conductive plate; and wherein the method further comprises cutting the semiconductor wafer and the resin material in predetermined locations to form separate semiconductor devices each including at least one semiconductor element.

It is also preferable that the forming a second set of concave trenches in a lattice-like arrangement on the backside of the conductive plate is performed after filling a space between the semiconductor element and the conductive plate with resin material; wherein, in the forming a second set of concave trenches in a lattice-like arrangement on the backside of the conductive plate, the second set of concave trenches partially overlap the first set of the concave trenches and the conductive plate is separated by the first and second sets of concave trenches; and thereby obviating the cutting the conductive plate at locations shifted in the directions along the surface of the conductive plate from the first and second sets of concave trenches.

It is further preferable that, in the forming a first set of concave trenches in a lattice-like arrangement on the face side of the conductive plate and in the forming a second set of concave trenches in a lattice-like arrangement on the backside of the conductive plate, the first and second sets of concave trenches are formed by using a technology selected from a group consisting of half-cut dicing, half-etching and press working.

As mentioned above, in a semiconductor device according to the present invention, a plurality of segments or divided segments are formed from a conductor plate or board, and lead pad portions are constituted of the segments which are electrically coupled with electrodes of a semiconductor element. Therefore, by appropriately determining which divided segments are used as lead pad portions depending on the size and kind of each of the semiconductor elements, it is possible to commonly utilize the divided segments for the semiconductor elements having different sizes and kinds to form device packages. Also, it is possible to form die pad portions by using portions of the divided segments and to mount a semiconductor element on the die pad portions. In this case, other portions of the divided segments are used as lead pad portions and electrodes of the semiconductor element are electrically coupled with the lead pad portions. Alternatively, it is possible to electrically couple bumps provided on electrodes of a semiconductor element with divided segments to form lead pad portions. Thereby, it is possible to mount or dispose a semiconductor element in face-up condition or in face-down condition. The lead pad portions may be disposed in the periphery of the package, or may be disposed in the bottom portion of the package in lattice-like arrangement. The same standard conducting plate can be utilized to fabricate surface-mount type semiconductor devices having lead-less structure, even if the semiconductor devices have different sizes and/or kinds.

In the method of manufacturing a semiconductor device according to the present invention, segments or divided segments are defined by forming concave trenches in a conductor plate. A semiconductor element is mounted on the divided segments, and the semiconductor element and the divided segments are electrically coupled. Thereafter, the backside portion of the conductor plate is removed to form individual divided segments. Therefore, it is possible to easily perform a process of mounting a semiconductor element, a process of electrical connection between the semiconductor element and the divided segments, and a process of forming a package resin portion. Also, it is possible to fabricate a semiconductor device which has a plurality of lead pad portions finally insulated from each other. Therefore, according to the present invention, the number of parts and the number of process steps do not increase uselessly, and manufacturing process can be simplified.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
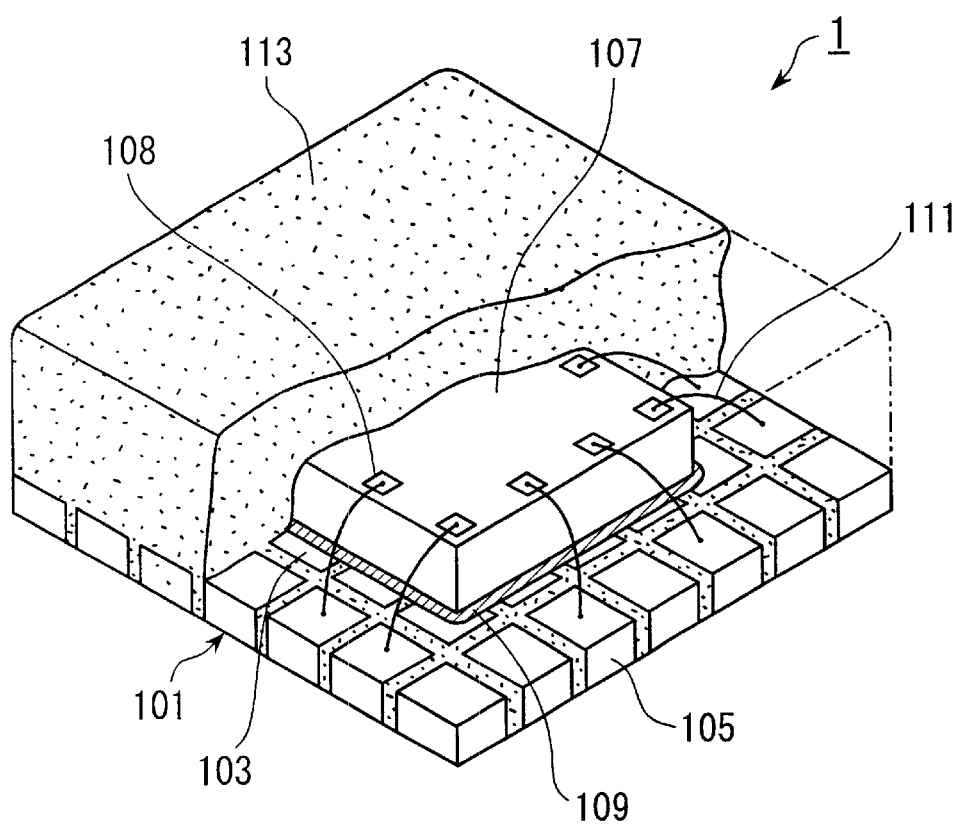
FIG. 1 is an outside perspective view of a semiconductor device according to a first embodiment of the present invention wherein a part of the semiconductor device is cut away.
Figure 2A:
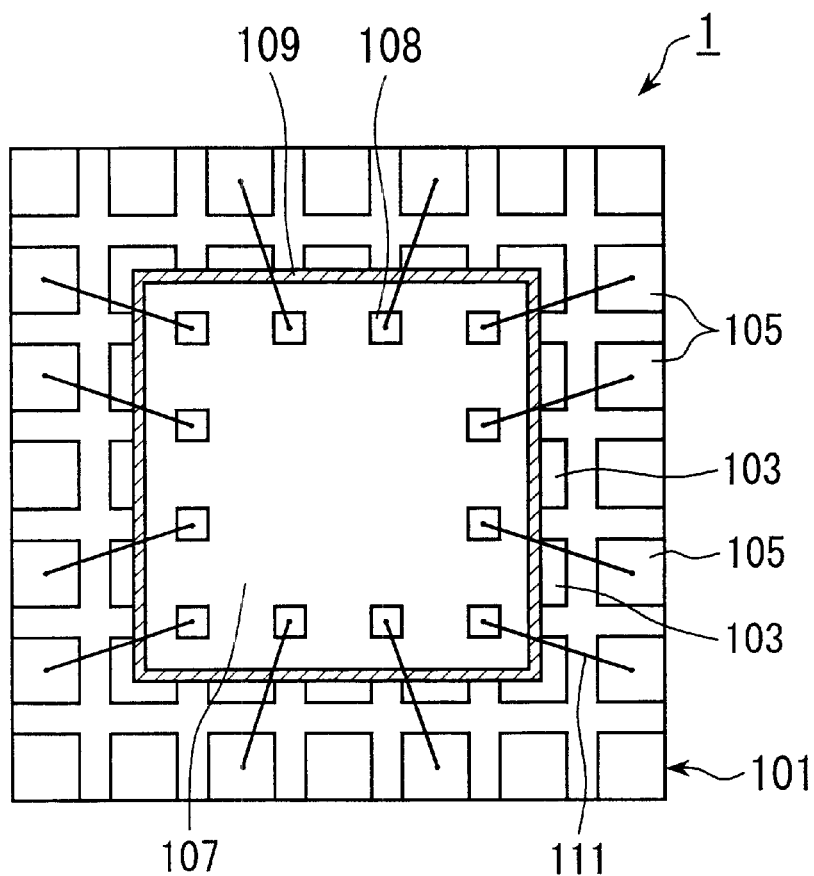
FIG. 2A is a plan view schematically showing an internal structure of the semiconductor device of FIG. 1.
Figure 2B:
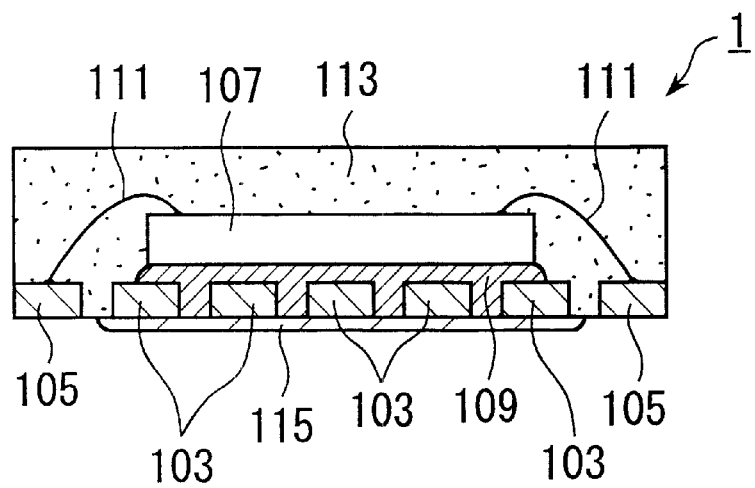
FIG. 2B is a cross sectional view of the semiconductor device of FIG. 1.

With reference to the drawings, embodiments of the present invention will now be described in detail. FIG. 1 is an outside perspective view of a semiconductor device according to a first embodiment of the present invention wherein a part of the semiconductor device is cut away. FIG. 2A is a plan view schematically showing an internal structure of the semiconductor device of FIG. 1. FIG. 2B is a cross sectional view of the semiconductor device of FIG. 1 taken along the center line thereof. The semiconductor 1 device shown in these drawings comprises die pad portions 103, lead pad portions 105, a semiconductor element 107 such as a semiconductor integrated circuit chip, bonding wires 111, and package resin or a package resin portion 113. The die pad portions 103 and the lead pad portions 105 are formed from a conductive plate member, here a metal plate 101. The semiconductor element 107 is mounted on the die pad portions 103 via mounting material 109 made of silver paste and the like. The bonding wires 111 electrically couple between electrode pads 108 of the semiconductor element 107 and the lead pad portions 105. The packaging resin 113 covers and seals the semiconductor element 107 and the bonding wires 111. A part of the package resin 113 enters between the die pad portions 103 and the lead pad portions 105 and, thereby, the die pad portions 103 and the lead pad portions 105 are joined together.

Here, each of the die pad portions 103 and the lead pad portions 105 has a structure in which one board-like metal plate 101 is divided into square segments. Among the segments divided from the metal plate 101, a plurality of segments in the central area form the above-mentioned die pad portions 103. Also, a plurality of segments around the central area form the above-mentioned lead pad portions 105. In this embodiment, a resist film 115 made of an insulating material is formed on the backside surface of the die pad portions 103 such that the segments forming the die pad portions 103 are not exposed at the backside surface of the package.

Figure 3A:
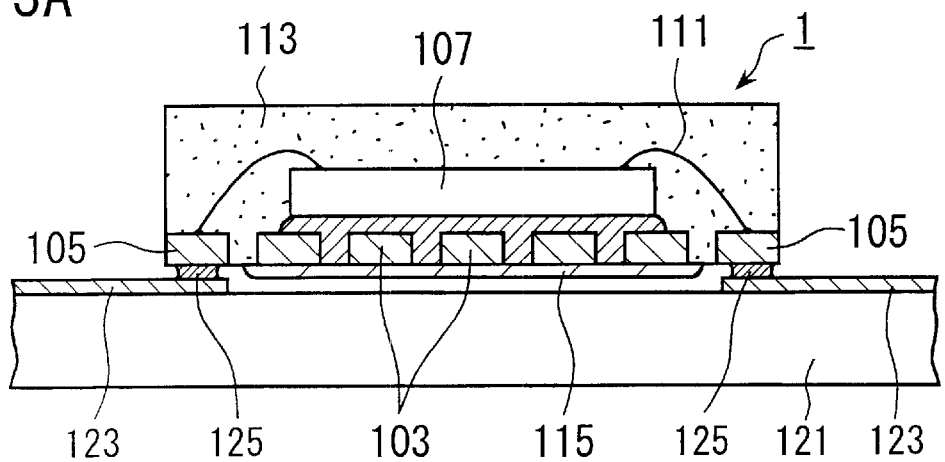
FIG. 3A is a cross sectional view showing a condition in which the semiconductor device of FIG. 1 is mounted on a mounting substrate.
Figure 3B:
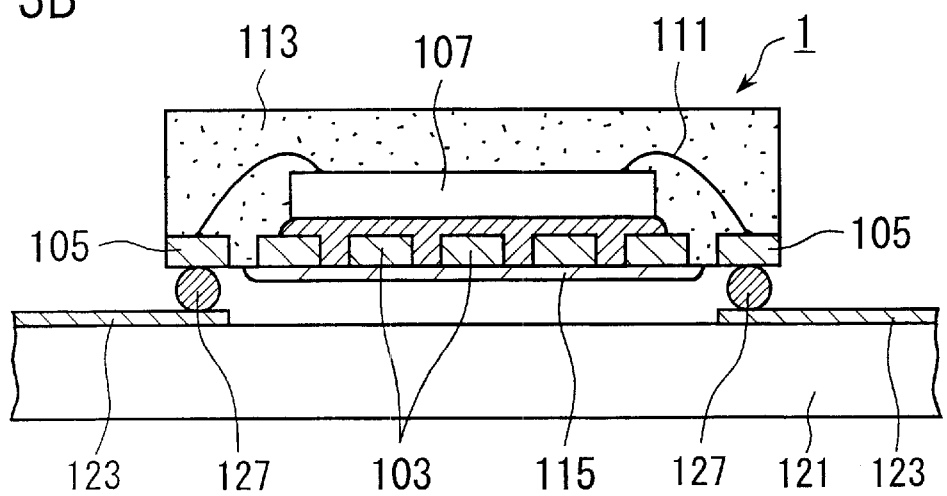
FIG. 3B is a cross sectional view showing another condition in which the semiconductor device of FIG. 1 is mounted on a mounting substrate.

FIGS. 3A and FIG. 3B are cross sectional views each showing a condition in which the semiconductor device 1 having the above-mentioned structure is mounted on a mounting substrate 121. The mounting substrate shown in FIGS. 3A and 3B has a wiring circuit portion 123 made of a conductive film formed into predetermined patterns. As shown in FIG. 3A, the semiconductor device 1 can be mounted on the mounting substrate 121 as follows. That is, first, the semiconductor device 1 is placed on the mounting substrate 121. Then, solder portions 125 previously formed by a printing method and the like are reflowed by heating. Thereby, lead pad portions 105 as mounting electrodes of the semiconductor device 1 are soldered onto the wiring circuit portion 123. Alternatively, as shown in FIG. 3B, the semiconductor device 1 can be mounted on the mounting substrate 121 as follows. That is, first, on the bottom surface of lead pad portions 105, solder balls 127 are attached. The semiconductor device 1 and the solder balls 127 are pressed onto the wiring circuit 123 of the mounting substrate 121 while heating the solder balls 127 and the like. Thereby, the lead pad portions 105 of the semiconductor device 1 are coupled with the wiring circuit 123. When the solder balls 127 are used as shown in FIG. 3B, there is little possibility that the bottom surface of the die pad portions 103 contact the wiring circuit 123. Therefore, it is possible to omit the resist film 115.

An explanation will now be made on a method of manufacturing a semiconductor device according to the first embodiment of the present invention. FIGS. 4A–9A and FIGS. 4B–9B are top or bottom plan views and cross sectional views taken along the center lines of the top or bottom plan views, illustrating a method of manufacturing a semiconductor device according to the first embodiment in order of manufacturing steps.

Figure 4A:
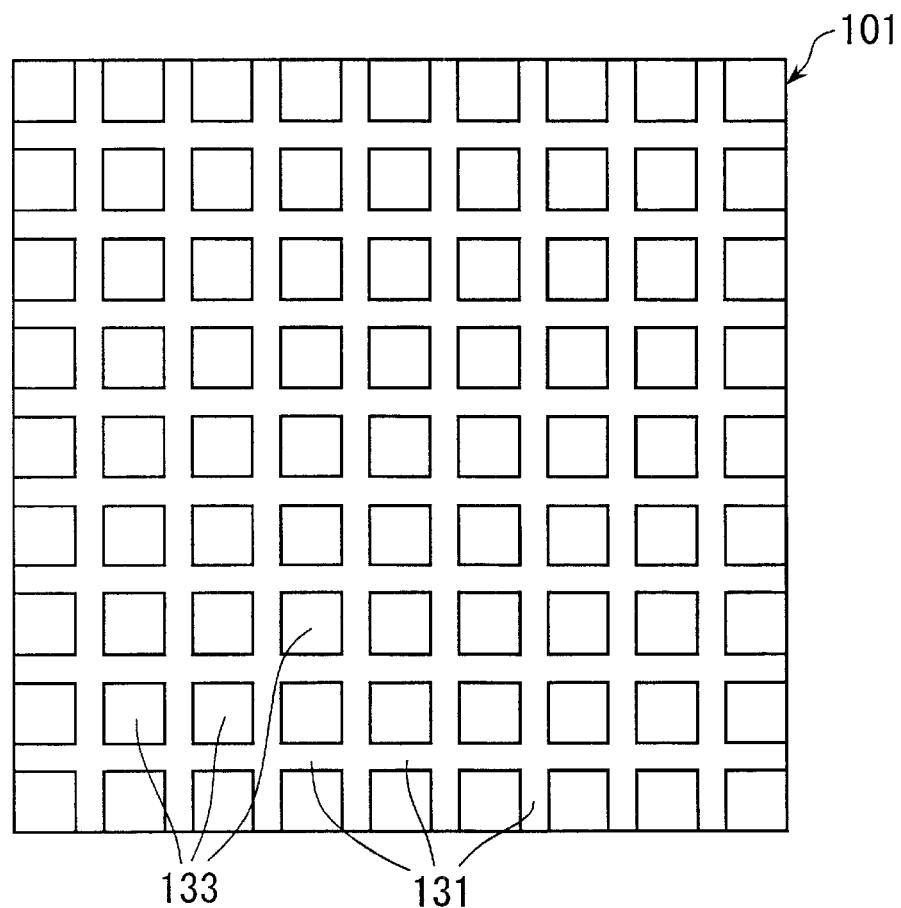
FIG. 4A is a top plan view illustrating a method of manufacturing a semiconductor device according to the first embodiment in a first manufacturing step.
Figure 4B:
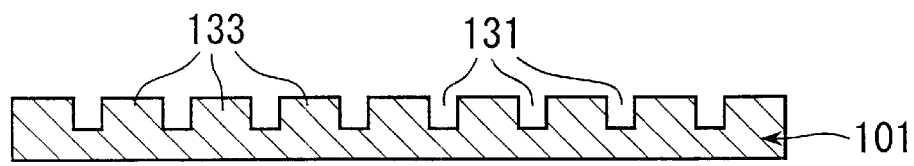
FIG. 4B is a cross sectional view taken along the center line portion of the workpiece of FIG. 4A illustrating a method of manufacturing a semiconductor device according to the first embodiment in the first manufacturing step.

As shown in the top plan view of FIG. 4A and in the cross sectional view of FIG. 4B, there is prepared a metal plate 101 which has a rectangular shape, here a square shape, and which is made of copper, 42 alloy and the like. The metal plate 101 has a thickness of, for example, approximately 0.1–2 mm. Then, a plurality of concave trenches 131 are formed on the surface of the metal plate 101 in each of X direction and Y direction. The concave trenches 131 are formed, for example, by using a dicing saw and the like which are used for cutting a semiconductor wafer into separate chips. In this case, half-cut dicing is performed such that the concave trenches 131 are formed to a depth which is approximately a half of the thickness of the metal plate 101. Thereby, the surface portion of the metal plate 101 is zoned into squares or into a lattice-like arrangement. It is also possible to form the concave trenches 131 on the surface of the metal plate 101 by press working which uses a metal die. Further, it is possible to form the concave trenches 131 by etching which uses a photolithographic technology. Here, the width of each of the concave trenches 131 may vary depending on a type and the like of the semiconductor device. However, it is preferable that the width of each concave trench 131 is sufficiently large such that enough insulation between terminals can be obtained. Also, the sizes in lateral and longitudinal directions of each area between the concave trenches 131, that is, an individual piece in the lattice arrangement zoned or divided by the concave trenches 131 are determined by the wire-bondable pitch size, the size of external terminals, and the like. Here, the individual piece zoned by the concave trenches 131 is finally divided into a separate piece and, therefore, is referred to as a divided segment or a segment.

Figure 5A:
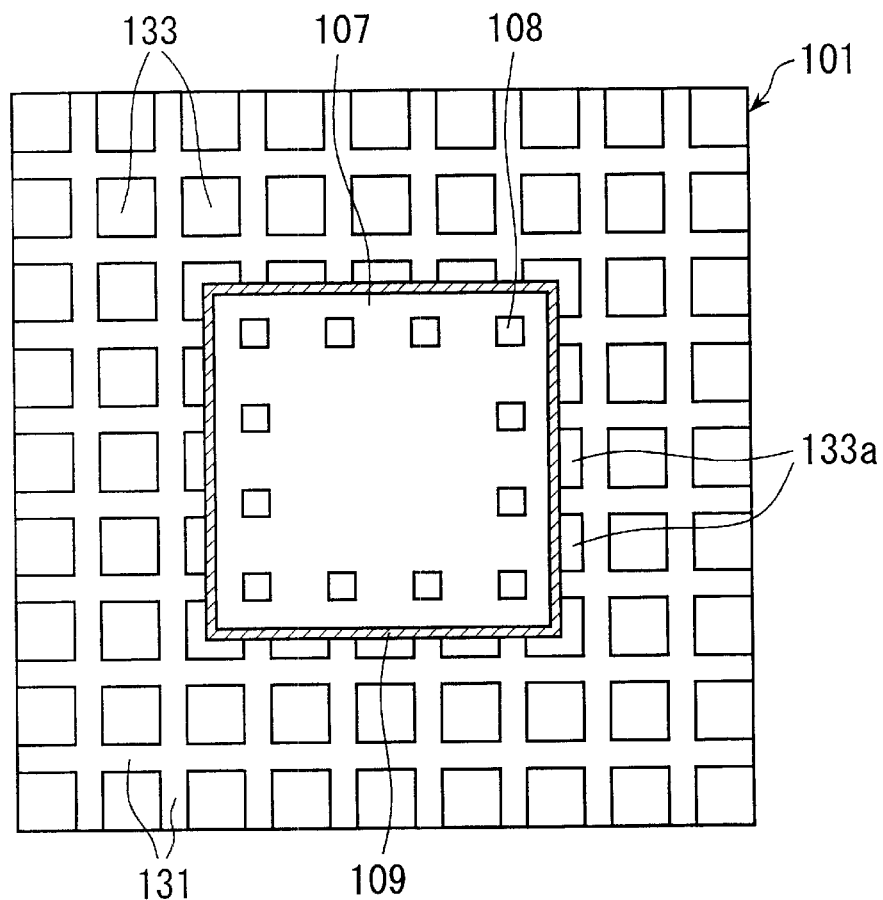
FIG. 5A is a top plan view illustrating a method of manufacturing a semiconductor device according to the first embodiment in a second manufacturing step.
Figure 5B:
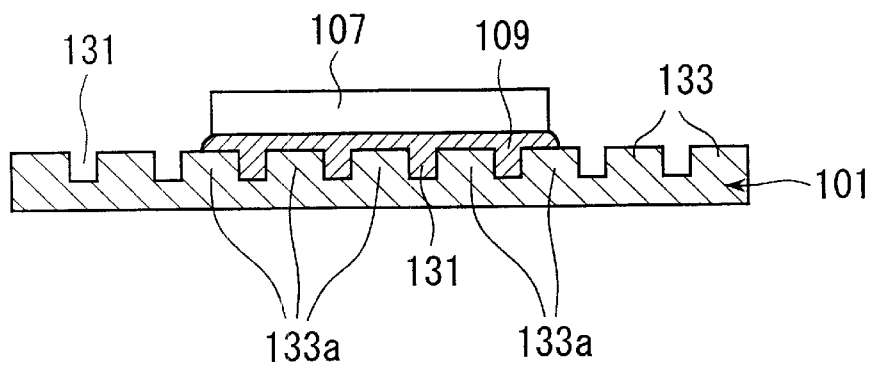
FIG. 5B is a cross sectional view taken along the center line portion of the workpiece of FIG. 5A illustrating a method of manufacturing a semiconductor device according to the first embodiment in the second manufacturing step.

Next, as shown in the top plan view of FIG. 5A and in the cross sectional view of FIG. 5B, a semiconductor element 107 is mounted on the surface of the metal plate 101 via mounting material 109. As the mounting material 109, metal solder such as silver past and the like, conductive resin, and the like are used. The semiconductor element 107 is positioned such that the surface having electrodes 108 thereon faces toward upside, and the backside surface of the semiconductor element 107 is bonded onto the face surface of the metal plate 101, here the upper surfaces of a plurality of segments 133 divided by the concave trenches 131. In this case, the mounting material 109 enters and fills the concave trenches 131 in an area under the semiconductor element 107 mounted on the metal plate 101. Thereby, among the segments 133, the segments 133a existing in an area under the semiconductor element 107 are joined together by the mounting material 109. These segments 133a later form die pad portions 103.

Figure 6A:
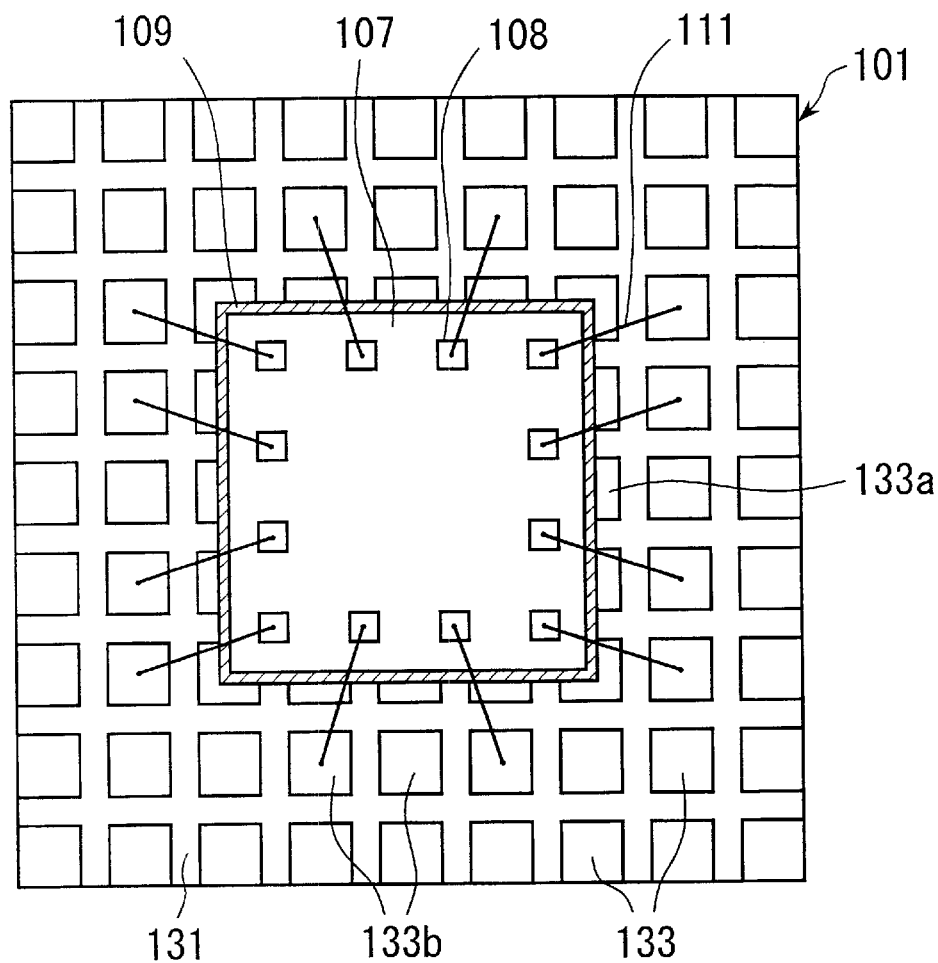
FIG. 6A is a top plan view illustrating a method of manufacturing a semiconductor device according to the first embodiment in a third manufacturing step.
Figure 6B:
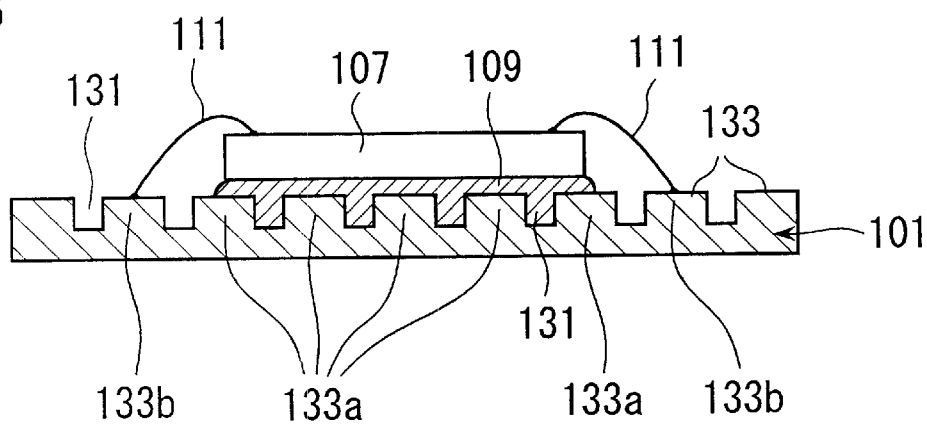
FIG. 6B is a cross sectional view taken along the center line portion of the workpiece of FIG. 6A illustrating a method of manufacturing a semiconductor device according to the first embodiment in the third manufacturing step.

Thereafter, as shown in the top plan view of FIG. 6A and in the cross sectional view of FIG. 6B, the electrodes 108 of the semiconductor element 107 and the upper surface portions of the segments 133 are respectively coupled by bonding wires 111. In this case, the segments 133 which are coupled with the electrodes 108 of the semiconductor element 107 are those not joined together by the mounting material 109. That is, among the segments 133, all or part of the segments 133b which are disposed outside the above-mentioned segments 133a are selected as the segments to be wire bonded. These segments 133b later form lead pad portions 105.

Figure 7A:
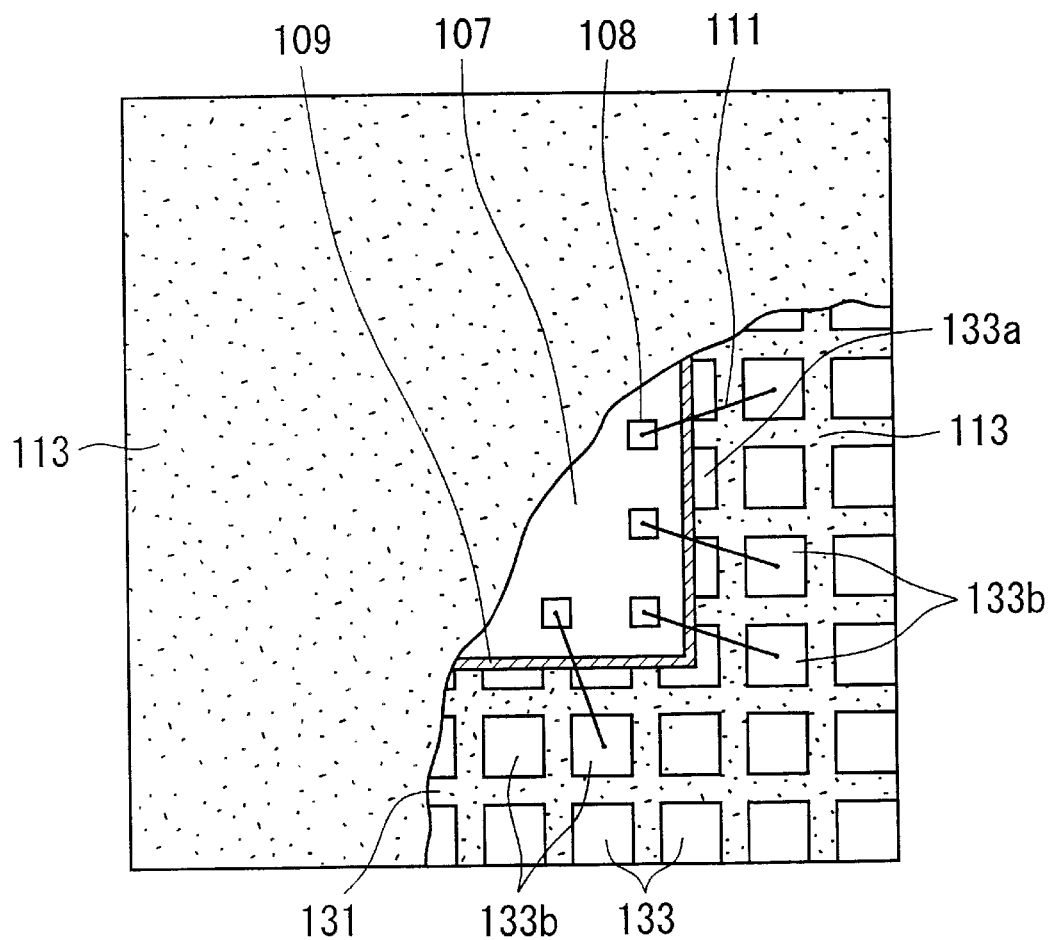
FIG. 7A is a top plan view illustrating a method of manufacturing a semiconductor device according to the first embodiment in a fourth manufacturing step.
Figure 7B:
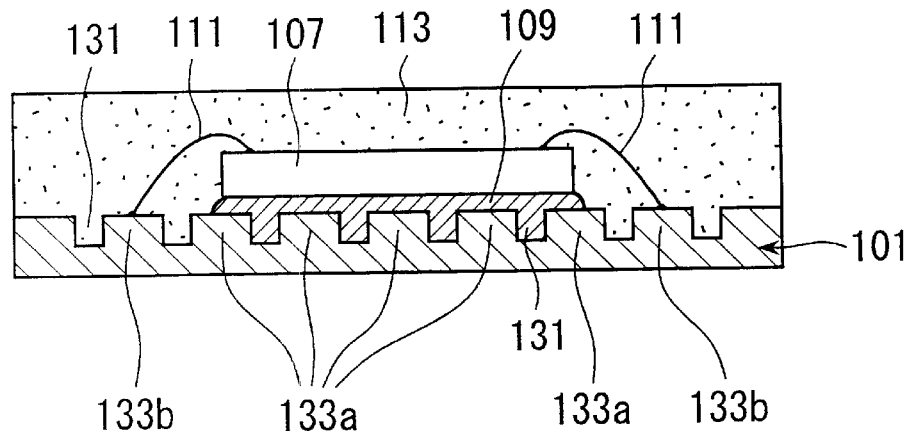
FIG. 7B is a cross sectional view taken along the center line portion of the workpiece of FIG. 7A illustrating a method of manufacturing a semiconductor device according to the first embodiment in the fourth manufacturing step.

As shown in the top plan view of FIG. 7A and in the cross sectional view of FIG. 7B, a package resin portion 113 is then formed. This is done, for example, as follows. First, the metal plate 101 is set in a metal mold for shaping resin not shown in the drawing, and the package resin portion 113 is formed by resin molding on the surface of the metal plate 101. Alternatively, resin is applied on the metal plate 101 to a predetermined thickness. Thereby, the package resin portion 113 is formed. Here, it should be noted that FIG. 7A is a partially cut away plan view. The semiconductor element 107 on the metal plate 101 and the bonding wires 111 are resin molded by the package resin 113. In this case, portion of the package resin 113 fills the concave trenches 131 which separate between the segments 133a corresponding to the die pad portions 103 under the semiconductor element 107 and the segments 133b corresponding to the lead pad portions 105 in the peripheral portion of the semiconductor element 107. Also, portion of the package resin 113 fills the concave trenches 131 which divide between the segments 133b. Therefore, each of the segments 133b corresponding to the lead pad portions 105 is joined to the adjacent segments 133b, and to the segments 133a corresponding to the die pad portions 103, via the insulating resin portion 113.

Figure 8A:
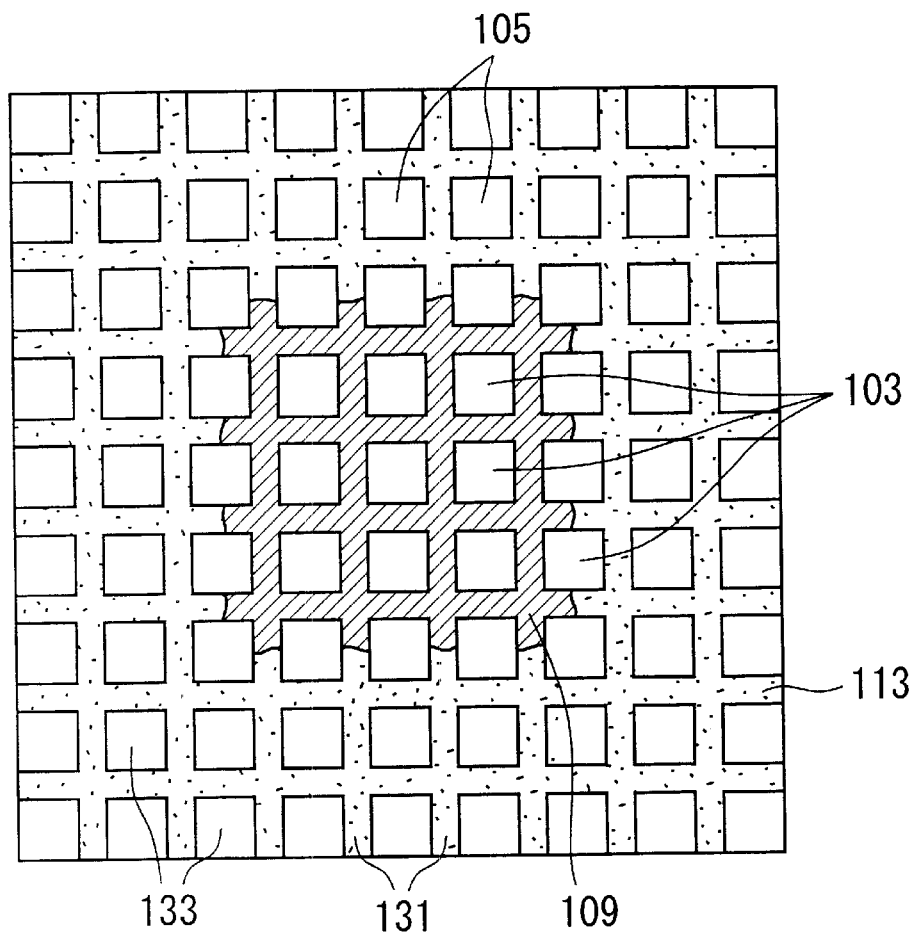
FIG. 8A is a top plan view illustrating a method of manufacturing a semiconductor device according to the first embodiment in a fifth manufacturing step.
Figure 8B:
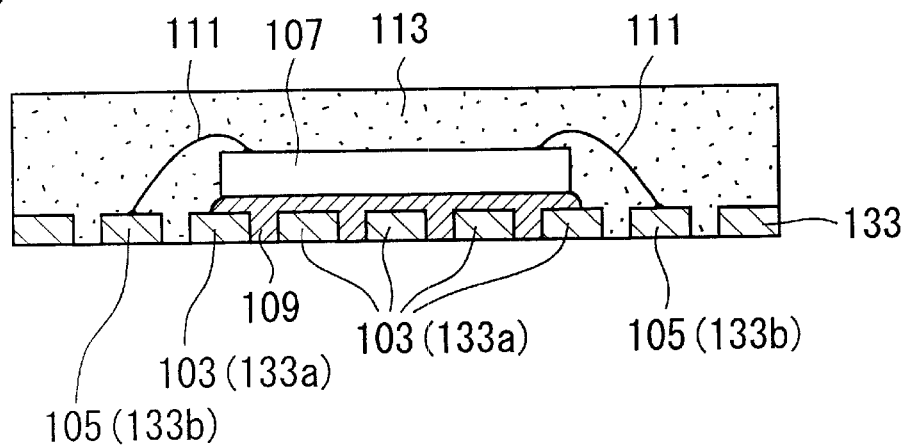
FIG. 8B is a cross sectional view taken along the center line portion of the workpiece of FIG. 8A illustrating a method of manufacturing a semiconductor device according to the first embodiment in the fifth manufacturing step.

Then, as shown in the bottom plan view of FIG. 8A and in the cross sectional view of FIG. 8B, the bottom side of the metal plate 101 is polished away such that at least half of the thickness of the metal plate 101 is removed. This is done, for example, by mechanical polishing, or by chemical polishing such as etching and the like. By this polishing, the bottom portions of the concave trenches 131 of the metal plate 101 are also removed and, as a result, each of the segments 131 is formed as a piece completely zoned by the concave trenches 131. However, since, as mentioned above, the segments 131 are joined together by the mounting material 109 and the package resin portion 113, these segments are not separated from each other. Thereafter, as shown in FIGS. 2A and 2B, an insulating resist film 115 is selectively applied on an area where the segments 133a corresponding to the die pad portions 103 exist, on the bottom surface of the semiconductor device 1. Alternatively, the resist film 115 may be formed by a printing method. Thereby, the bottom surface of the die pad portions 103 are coated by an insulator. It is also possible to apply the resist film 115 after a package separating process mentioned later. Further, if unnecessary, it is possible to omit forming the resist film 115. For the sake of easy understanding, the resist film 115 is not illustrated in FIGS. 8A and 8B.

Figure 9A:
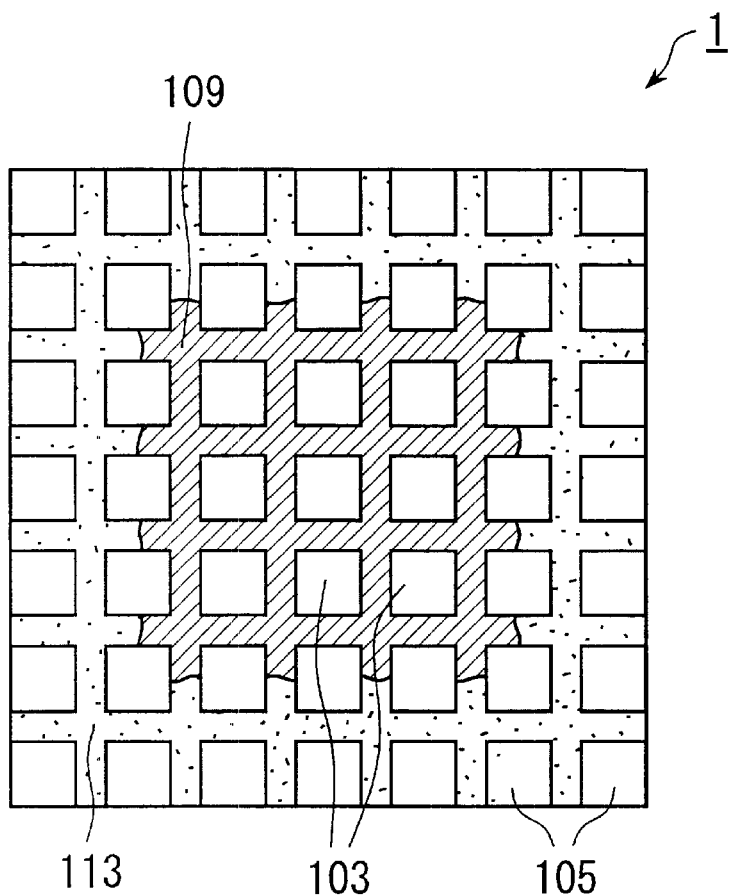
FIG. 9A is a top plan view illustrating a method of manufacturing a semiconductor device according to the first embodiment in a sixth manufacturing step.
Figure 9B:
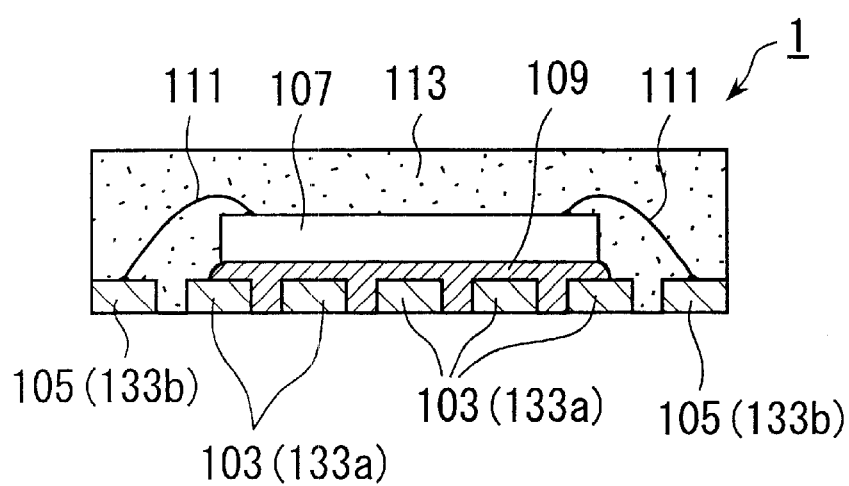
FIG. 9B is a cross sectional view taken along the center line portion of the workpiece of FIG. 9A illustrating a method of manufacturing a semiconductor device according to the first embodiment in the sixth manufacturing step.

As shown in the bottom plan view of FIG. 9A and in the cross sectional view of FIG. 9B, the package resin portion 113 is cut along the concave trenches 131 in the outside portions of the segments 133b corresponding to the lead pad portions 105 by full-cut dicing. Thereby, the semiconductor device 1 is formed which has a rectangular outer shape and which has a plurality of lead pad portions 105 comprising a plurality of segments 133b disposed along the periphery of the bottom surface of the semiconductor device 1. A conductive surface of each of the segments 133b as the lead pad portions 105 is exposed in the periphery of the bottom surface of the semiconductor device 1. Therefore, the segments 133b can function as mounting electrodes. In this way, the semiconductor device 1 shown in FIG. 1 is completed. In case the semiconductor device is a semiconductor device which requires a high heat dissipating effect at the die pad portions 103, for example, a semiconductor device in which a power semiconductor element is mounted, it is possible to use a structure in which the resist film 115 is not formed.

As mentioned above, in the semiconductor device according to the first embodiment, the semiconductor element 107 is mounted via the mounting material 109 on the metal plate 101 having the concave trenches 131 formed into a grid or lattice shape. The electrodes 108 of the semiconductor element 107 and the segments 133b which are disposed in the periphery of the semiconductor element 107 and which are not joined by the mounting material 109 are then electrically coupled via the bonding wires 111. Then, molding by the package resin 113 is performed and thereby the semiconductor device 1 can be fabricated. In the metal plate 101, the concave trenches 131 are previously formed by half-cut dicing, and the metal plate 101 is divided into separate segments 133 after performing resin molding. Therefore, it is not necessary to use a base member for supporting a plurality of pad portions like the prior art method, and it is possible to decrease the number of components necessary to fabricate a semiconductor device. Also, in a polishing process of the metal plate 101 after the molding by the package resin 113, it is possible to adopt a mechanical polishing process, so that a manufacturing process does not become complicated. Further, a patterned layer required in the prior art for electrically coupling lead pad portions and electrodes of a semiconductor element is not required in the present embodiment. As a result, a structure of a semiconductor device becomes simple, and a manufacturing process thereof can also be simplified.

Also, in this embodiment, a plurality of segments 133 divided by the concave trenches 131 formed in the metal plate 101 are used as die pad portions 103 or as lead pad portions 105. In this respect, it is possible to freely select any segment 133 as a die pad portion 133 or a lead pad portion 105. Thus, it is possible, for example, to manufacture semiconductor devices from semiconductor elements having different sizes, i.e., different outer dimensions or from semiconductor elements having different number of electrodes, by using the same metal plate 101.

Figure 10A:
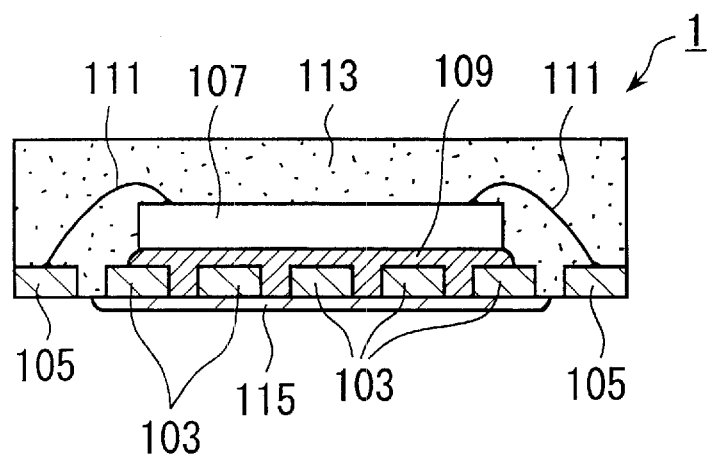
FIG. 10A is a cross sectional view of a semiconductor device in which a semiconductor element shown in FIG. 1 is mounted.
Figure 10B:
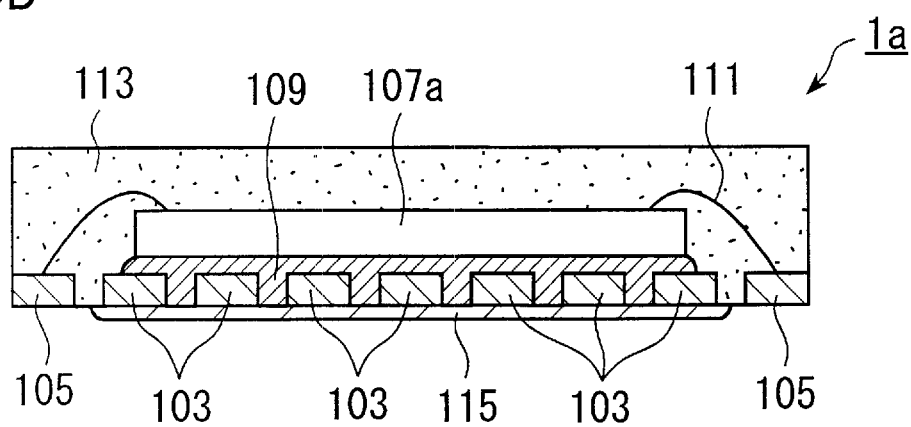
FIG. 10B is a cross sectional view of a semiconductor device in which a semiconductor element having a size larger than that of the semiconductor element of FIG. 1 is mounted.

FIGS. 10A and 10B are cross sectional views illustrating examples of such semiconductor devices. FIG. 10A shows a cross section of a semiconductor device 1 in which a semiconductor element 107 shown in FIG. 1 is mounted. FIG. 10B shows a cross section of a semiconductor device 1a in which a semiconductor element 107a having a size larger than that of the semiconductor element 107. Both semiconductor devices 1 and 1a can be fabricated by the same manufacturing process. That is, the semiconductor elements 107 and 107a are mounted the respective metal plates 101 having the same concave trenches 131. However, since the semiconductor element 107 and the semiconductor element 107a have mutually different sizes, the number of divided segments 133a joined together by the mounting material 109 under the semiconductor element 107 and the number of divided segments 133a joined under the semiconductor element 107a differ from each other. That is, the area of the semiconductor device 1 in which the die pad portions 103 exist differs from that of the semiconductor device 1a. Also, corresponding to such difference, the number and locations of the divided segments 133b disposed in the periphery of the semiconductor element 107 differ from those of the divided segments 133b disposed in the periphery of the semiconductor element 107a. That is, the number and/or locations of the lead pad portions 105 of the semiconductor device 1 differ from those of the lead pad portions 105 of the semiconductor device 1a. In this condition, the molding process is performed by the package resin 113, and the package resin 113 is cut at the outer periphery of the lead pad portions 105. Thereby, the semiconductor device 1 and the semiconductor device 1a having different package sizes are fabricated. The same kind of the metal plate 101 can be used for fabricating the semiconductor devices 1 and 1a. Thus, it is possible to fabricate the semiconductor devices 1 and 1a which have different sizes and which include semiconductor elements 107 and 107a having different sizes, by using the same metal plate 101. Although not shown in the drawing, when a semiconductor element having different number and/or locations of the electrodes is to be mounted, the number of the divided segments 133b used as lead pad portions 105 can be changed accordingly. It is also possible to change or select the divided segments 133b to which the bonding wires are coupled. Thereby, it is possible to easily realize semiconductor devices which use various kind and/or sizes of semiconductor elements.

An explanation will now be made on a method of manufacturing a semiconductor device as variations of the first embodiment of the present invention.

Figure 11A:
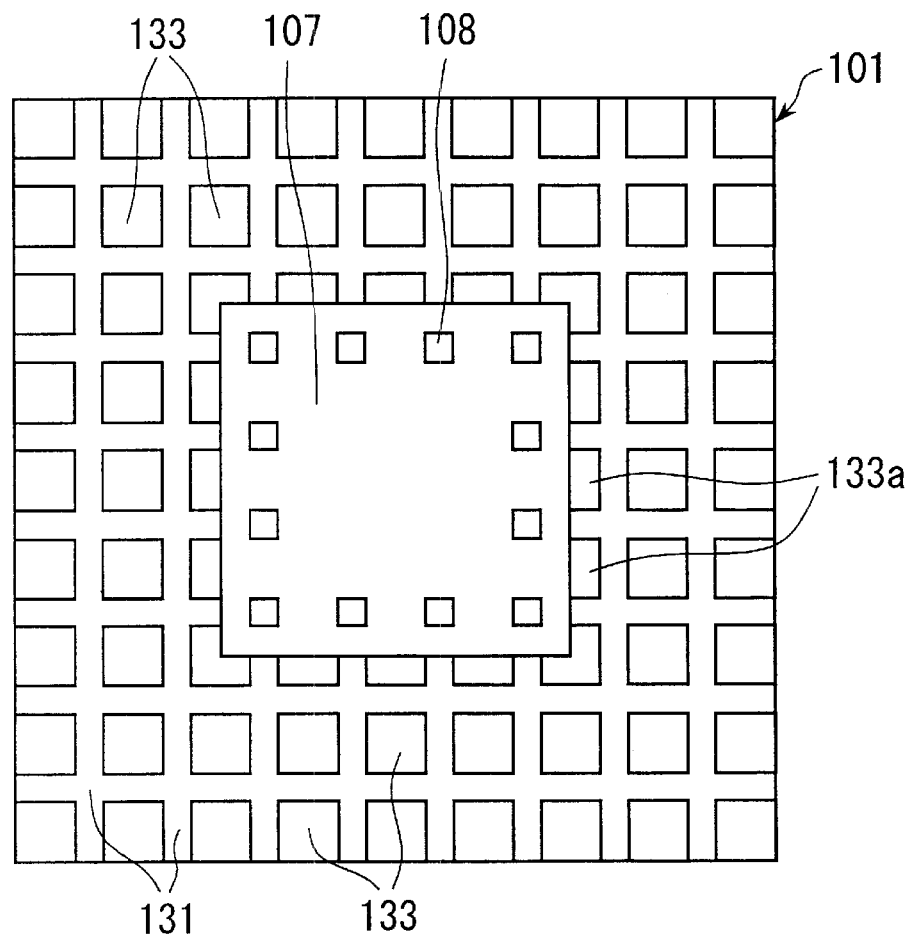
FIG. 11A is a top plan view illustrating a condition of a semiconductor device during manufacture as a first variation of the first embodiment.
Figure 11B:
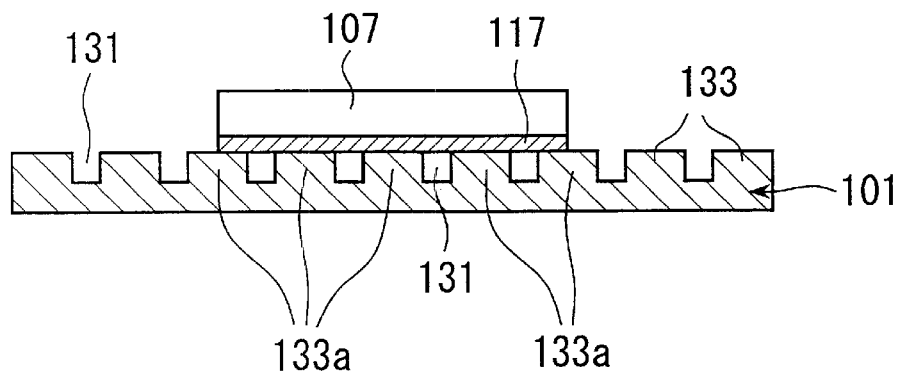
FIG. 11B is a cross sectional view illustrating a condition of a semiconductor device during manufacture as the first variation of the first embodiment.

FIGS. 11A and 11B are a top plan view and a cross sectional view, respectively, illustrating a condition of a semiconductor device as a first variation during manufacture. FIGS. 11A and 11B show a condition corresponding to that shown in FIGS. 5A and 5B in the manufacturing process according to the first embodiment. The process steps performed before obtaining this condition are the same as those in the first embodiment, and explanation thereof is omitted here.

As shown in FIGS. 11A and 11B, in the method as a first variation of the first embodiment, when the semiconductor element 107 is mounted on a metal plate 101, a mounting tape 117 is used as mounting material. The mounting tape 117 is a double-faced adhesive tape. The lower surface of the mounting tape 117 is adhered to surfaces of the divided segments 133 formed in the metal plate 101. The upper surface of the mounting tape 117 is adhered to the backside of the semiconductor element 107. The process steps after this condition may be the same as those described with reference to FIGS. 6A and 6B in the first embodiment, and detailed description thereof is omitted here.

In the method according to the first variation of the first embodiment, the semiconductor element 107 can be mounted on the metal plate 101 by a simple process. That is, it is only necessary that the mounting tape 117 is adhered to a surface of the metal plate 101, and that the semiconductor element 107 is placed on the mounting tape 117. Therefore, in the first variation, when compared with the process of the first embodiment in which the mounting material 109 is applied onto the metal plate 101, it is possible to easily fabricate the semiconductor device. Here, the plurality of the divided segments 133a constituting the die pad portions 103 just under the semiconductor element 107 are mutually joined by the mounting tape 117.

Figure 12A:
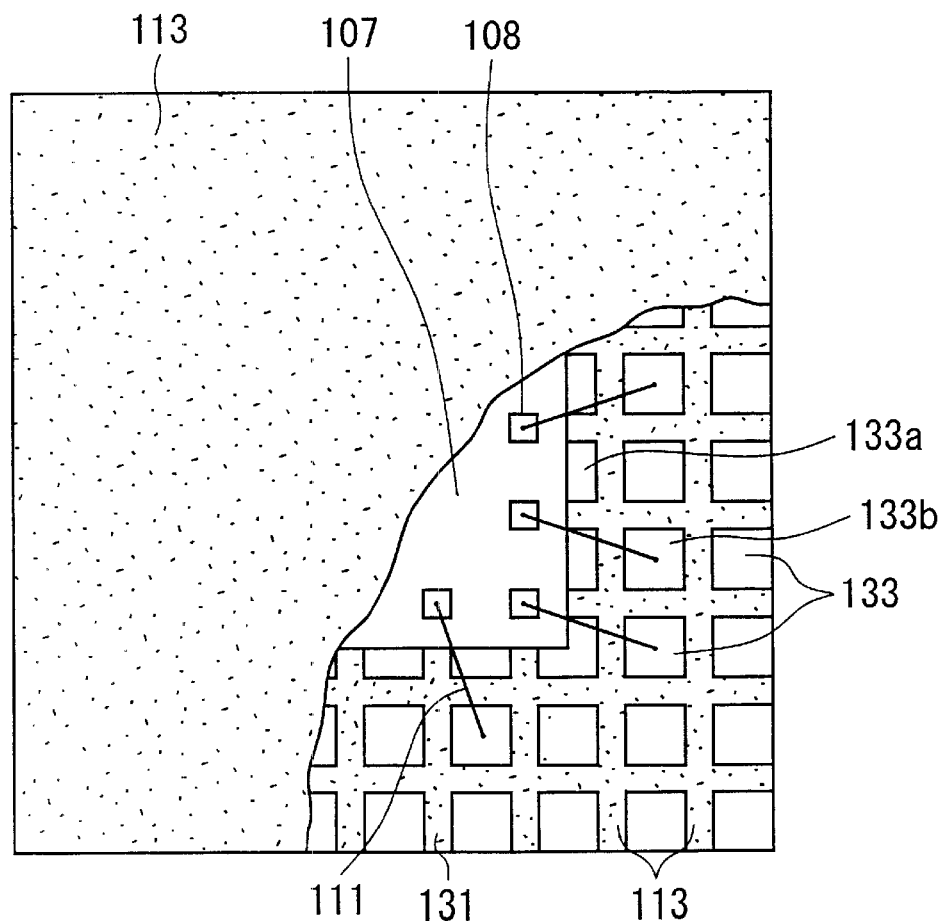
FIG. 12A is a partially cutaway top plan view illustrating another condition of a semiconductor device during manufacture as the first variation of the first embodiment.
Figure 12B:
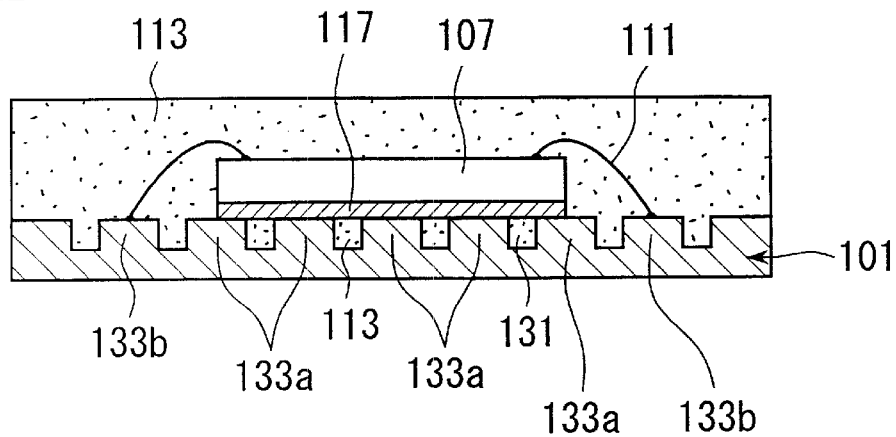
FIG. 12B is a cross sectional view illustrating another condition of a semiconductor device during manufacture as the first variation of the first embodiment.

FIGS. 12A and 12B are a partially cutaway top plan view and a cross sectional view, respectively, illustrating a condition of the semiconductor device according to the first variation corresponding to the above-mentioned condition shown in FIGS. 7A and 7B. As shown in FIGS. 12A and 12B, when the molding by the package resin 113 is performed, it is preferable that portions of the package resin 113 enter into and fill the concave trenches 131 between the divided segments 133a. Thereby, it is possible to enhance the strength of unifying the divided segments 133a, i.e., the die pad portions by the package resin 113.

Figure 13A:
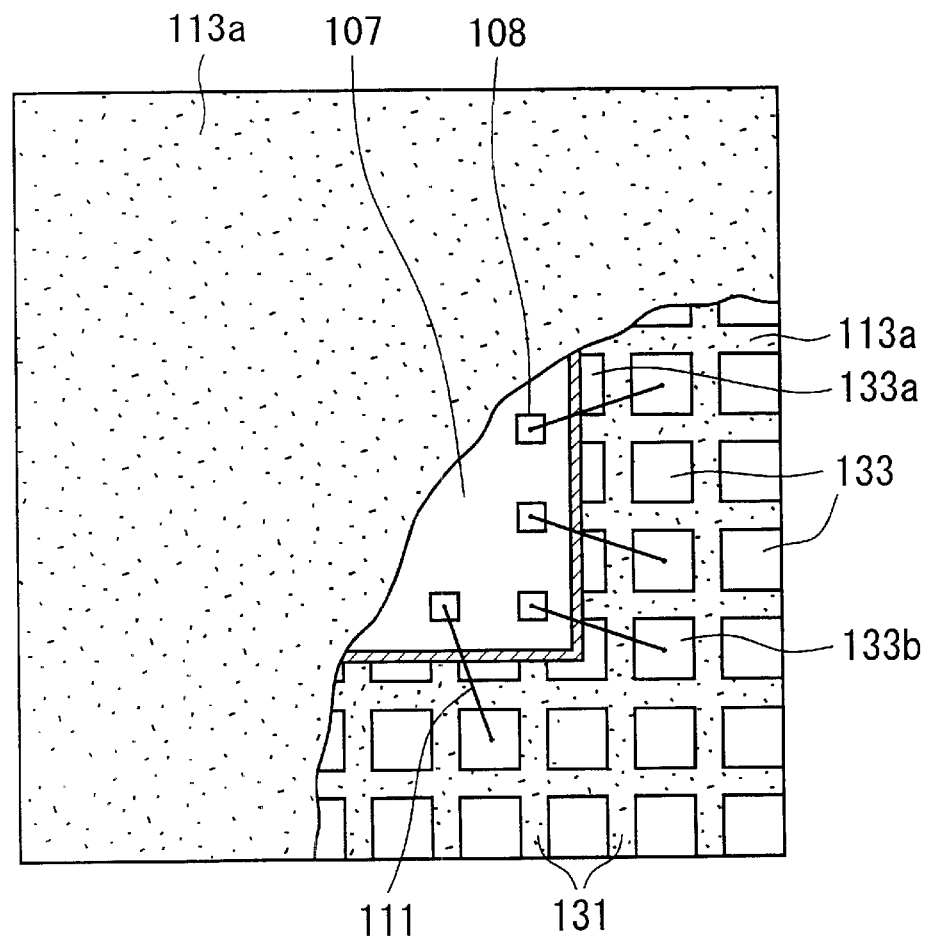
FIG. 13A is a partially cutaway top plan view illustrating another condition of a semiconductor device during manufacture as a second variation of the first embodiment.
Figure 13B:
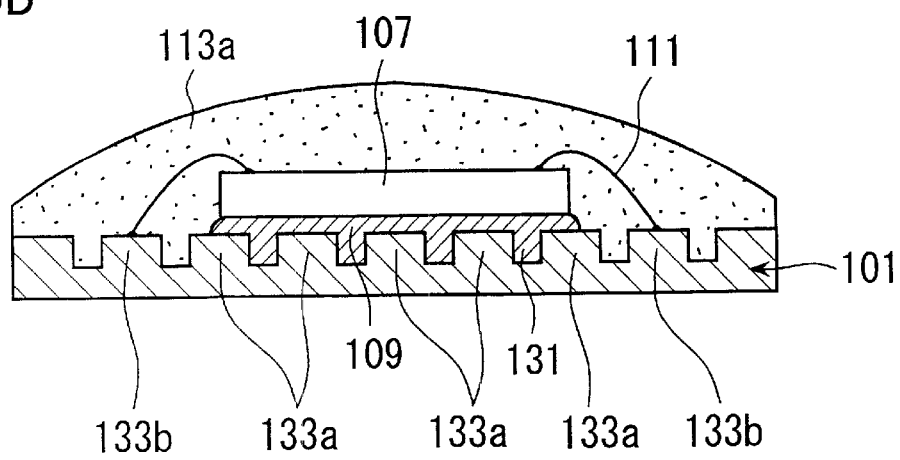
FIG. 13B is a cross sectional view illustrating another condition of a semiconductor device during manufacture as the second variation of the first embodiment.

An explanation will now be made on a method of manufacturing a semiconductor device as a second variation of the first embodiment of the present invention. FIGS. 13A and 13B are a partially cutaway top plan view and a cross sectional view, respectively, illustrating a condition of a semiconductor device as the second variation during manufacture. FIGS. 13A and 13B show a condition corresponding to that shown in FIGS. 7A and 7B in the manufacturing process according to the first embodiment. In this variation, during a molding process by resin material, the package resin portion 113a is formed by potting or dropping the resin material from just above the semiconductor element 107. The process steps performed before and after obtaining this condition are the same as those in the first embodiment, and explanation thereof is omitted here.

According to the second variation, it is possible to make the shape of the upper surface of the package resin portion 113a into an arced surface or a spherical shape, or into a surface shape near the spherical shape, by the surface tension. Thus, it is possible to reduce the thickness of the package resin portion 113a at the cutting portions. Therefore, when the package resin portion 113a is cut into separate semiconductor devices, the quantity of the resin portion to be cut becomes very small and, therefore, it is possible to cut the package resin portion 113a quite easily. Also, since there exists a resin material for the potting process which has a relatively low hardness when cured, it is also possible to cut the package resin portion 113a into separate semiconductor devices by using a metal die. Therefore, it is possible to reduce cutting costs. Further, each of the semiconductor devices cut by this method does not have corner portions on the top surface thereof. Thus, probability of chipping or cracking of the package resin portion 113a becomes small. As a result, it is possible to improve reliability of semiconductor devices.

Figure 14A:
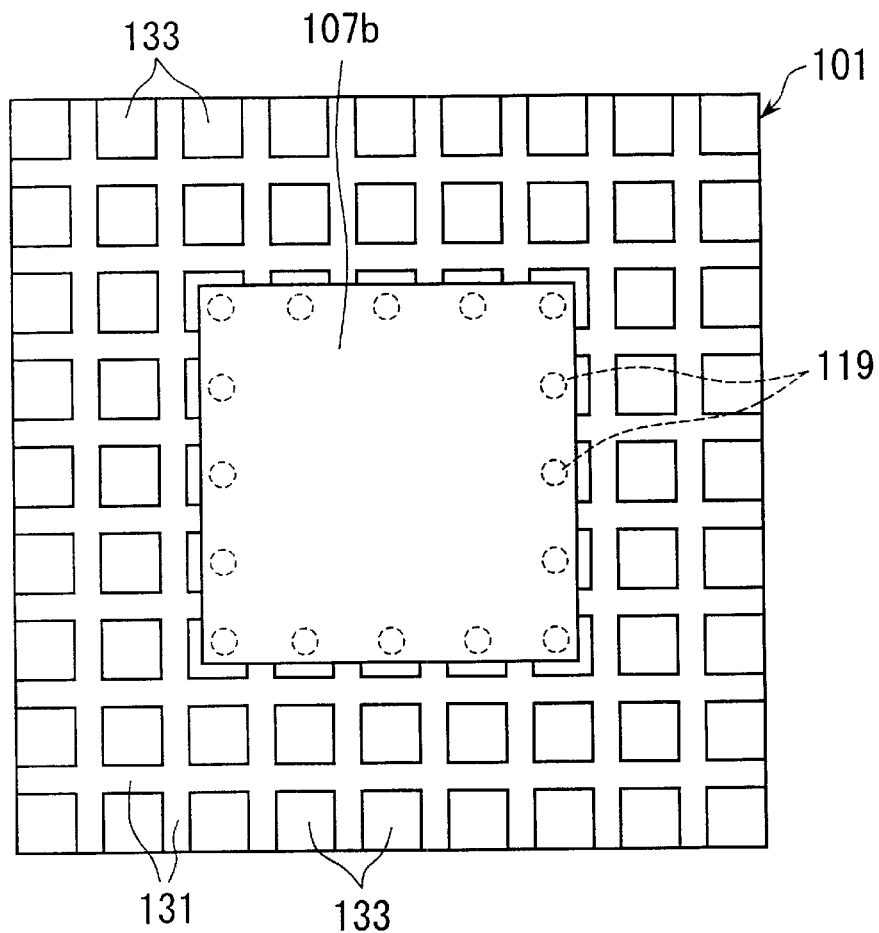
FIG. 14A is a top plan view illustrating a method of manufacturing a semiconductor device according to a second embodiment in a first manufacturing step.
Figure 14B:
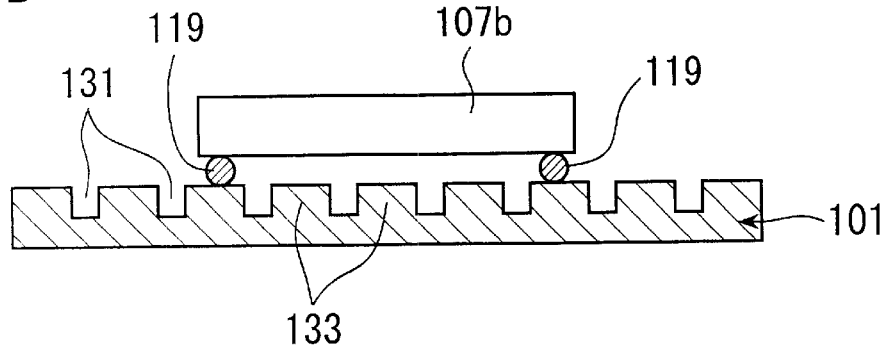
FIG. 14B is a cross sectional view taken along the center line portion of the workpiece of FIG. 14A illustrating a method of manufacturing a semiconductor device according to the second embodiment in the first manufacturing step.
Figure 15:
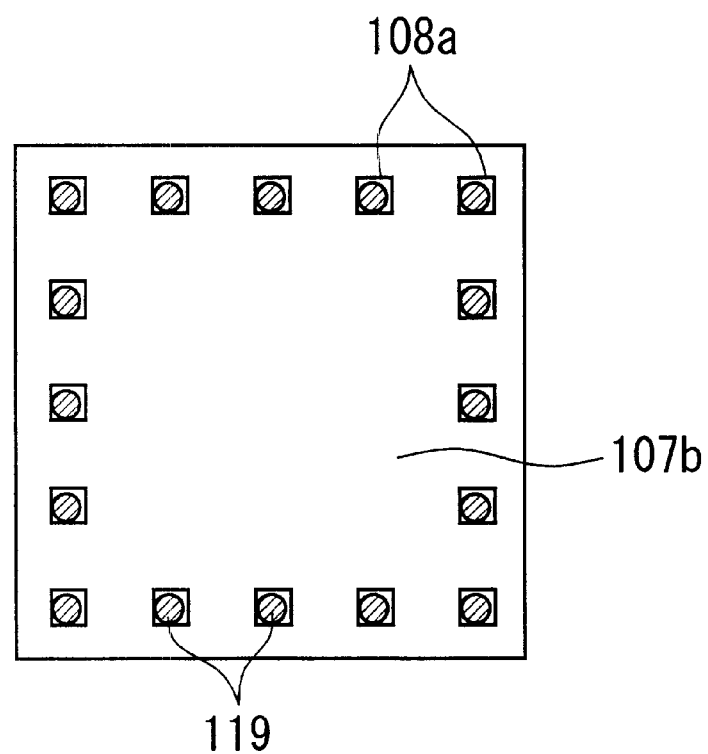
FIG. 15 is a plan view showing a semiconductor element used in the first manufacturing step illustrated in FIG. 14A and FIG. 14B.

Next, an explanation will be made on a method of manufacturing a semiconductor device according to the second embodiment of the present invention in order of manufacturing steps. First, in a manner similar to the process in the first embodiment shown in FIGS. 4A and 4B, grid shaped or lattice shaped concave trenches 131 are formed in a metal plate 101 by half-cut dicing and, thereby, divided segments 133 are formed. Then, as shown in a top plan view of FIG. 14A and in a cross sectional view of FIG. 14B, semiconductor element 107b is mounted facedown on the metal plate 101. FIG. 15 is a plan view showing the face side surface, that is, the surface which is mounted on the metal plate 101, of the semiconductor element 107b. On the face side surface of the semiconductor element 107b, there are disposed electrodes 108a along the peripheral portion thereof. Locations of the electrodes 108a correspond to the divided segments 133 formed in the metal plate 101. That is, in this embodiment, the electrodes 108a are disposed along the periphery of the semiconductor element 107b in a pitch corresponding to that of the divided segments 133. On each of the electrodes 108a, there is formed a ball-like bump 119 which is made of metal such as solder, gold and the like. The bumps 119 can also be formed by selective plating. The face surface of the semiconductor element 107b is opposed to and pressed toward the metal plate 101 while heating the bumps 119 and the like, thereby the bumps 119 are respectively bonded to the surfaces of the corresponding divided segments 133. That is, the flip-chip bonding is performed. Therefore, each of the electrodes 108*a* of the semiconductor element 107*b* is electrically coupled with a corresponding one of the divided segments 133.

Figure 16A:
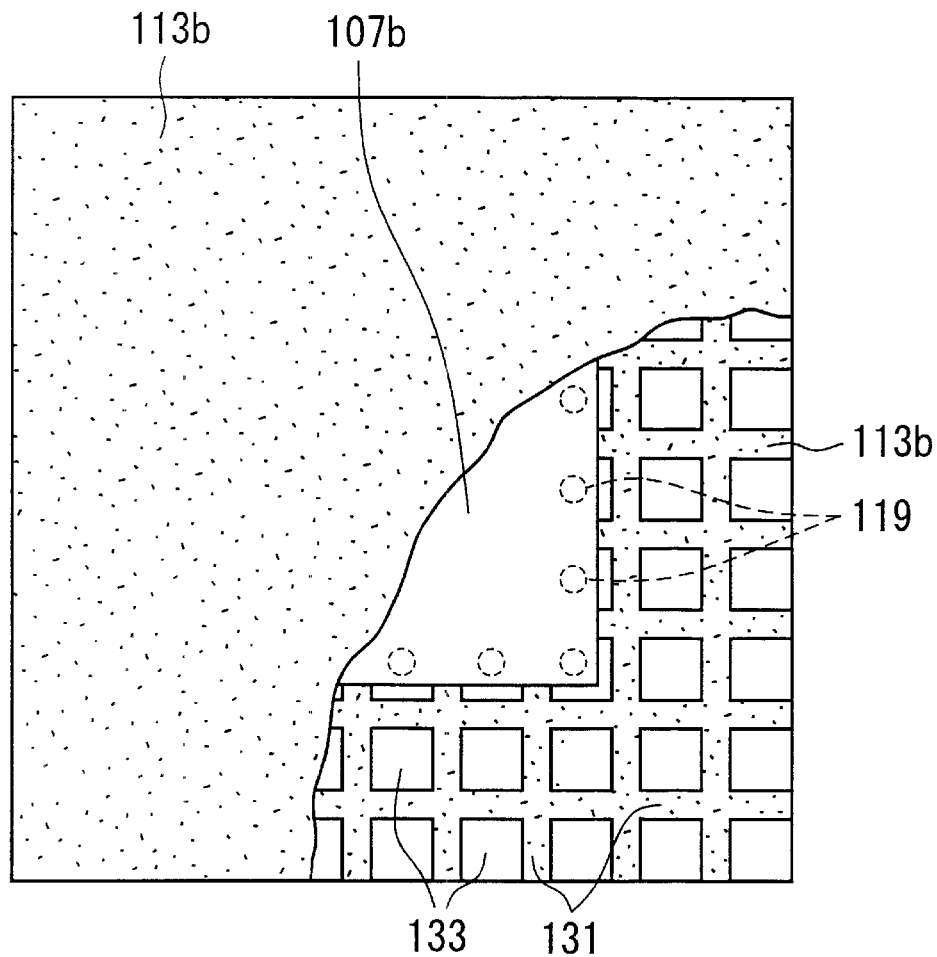
FIG. 16A is a top plan view illustrating a method of manufacturing a semiconductor device according to the second embodiment in a second manufacturing step.
Figure 16B:
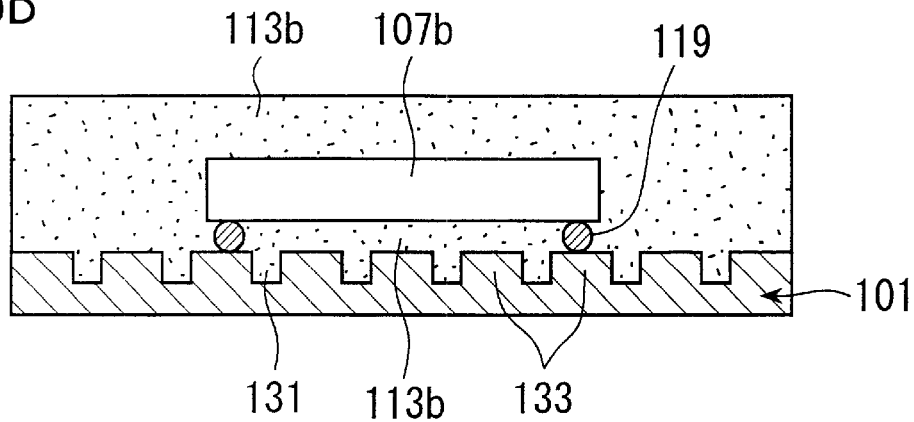
FIG. 16B is a cross sectional view taken along the center line portion of the workpiece of FIG. 16A illustrating a method of manufacturing a semiconductor device according to the second embodiment in the second manufacturing step.
Figure 17A:
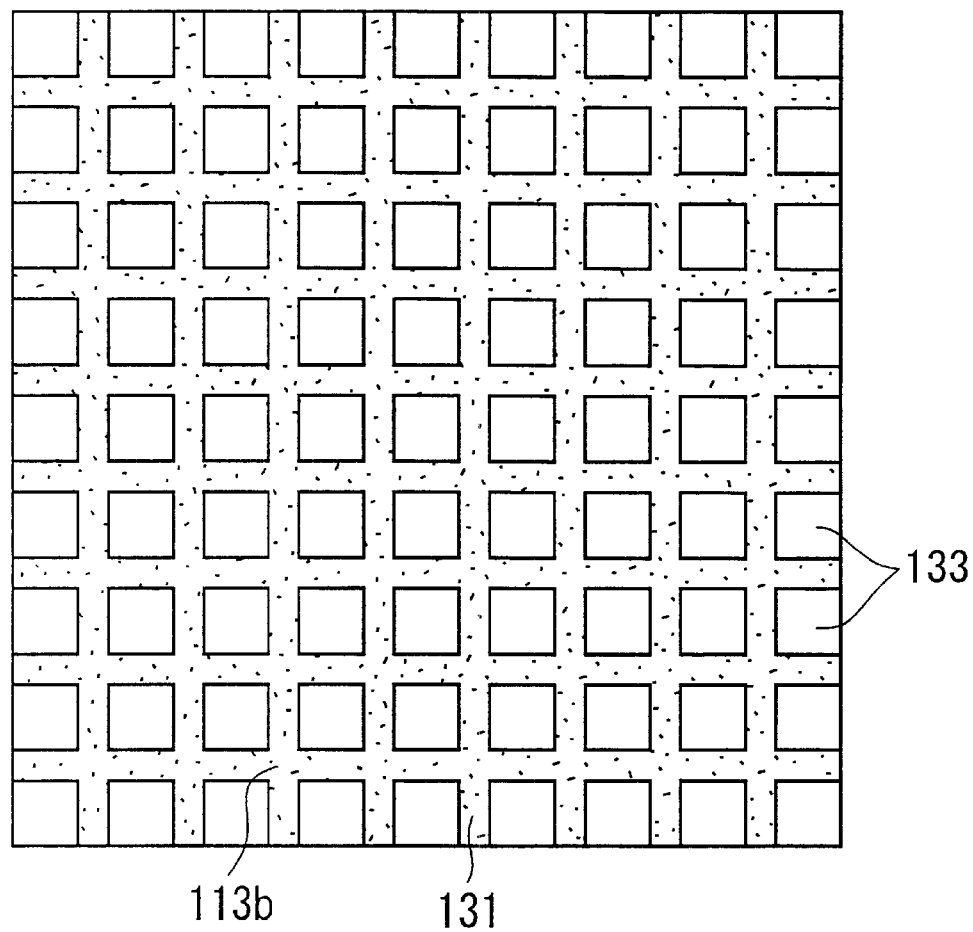
FIG. 17A is a top plan view illustrating a method of manufacturing a semiconductor device according to the second embodiment in a third manufacturing step.
Figure 17B:
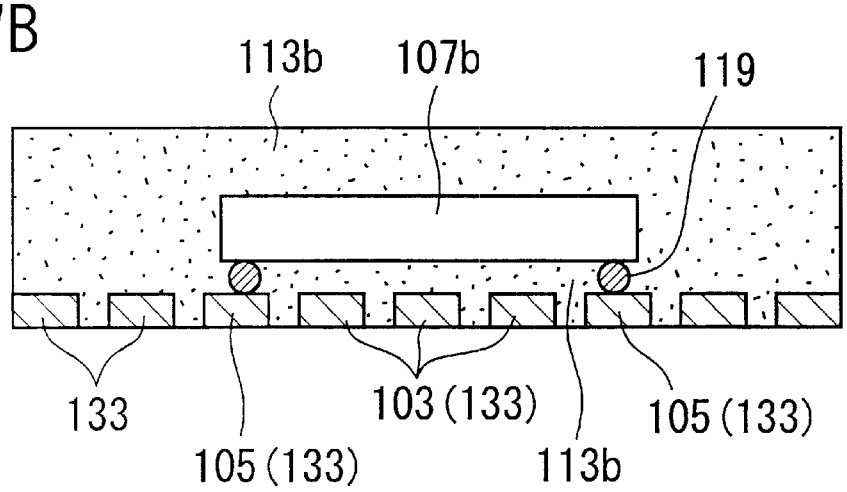
FIG. 17B is a cross sectional view taken along the center line portion of the workpiece of FIG. 17A illustrating a method of manufacturing a semiconductor device according to the second embodiment in the third manufacturing step.

Thereafter, as shown in a partially cutaway plan view of FIG. 16A and in a cross sectional view of FIG. 16B, a package resin portion 113*b* is formed. In the second embodiment, the molding by the package resin portion 113*b* is performed such that portions of the package resin portion 113*b* enter into and fill the concave trenches 131 between the divided segments 133 and the space between the semiconductor element 107*b* and the metal plate 101. Thereafter, as shown in the bottom plan view of FIG. 17A and in the cross sectional view of FIG. 17B, the bottom side of the metal plate 101 is polished away such that the bottom portions of the concave trenches 131 of the metal plate 101 are removed. As a result, each of divided segments 133 is formed as a piece completely zoned by the concave trenches 131. In this case, since, as mentioned above, the divided segments 133 are joined together by the package resin portion 113*b*, these divided segments are not separated from each other. Among the divided segments 133, the divided segments 133 bonded with the bumps 119 of the semiconductor element 107*b* constitute lead pad portions 105, and function as mounting electrodes. The divided segments 133 which are located under the semiconductor element 107*b* and which are not bonded with the bumps 119 constitute die pad portions 103 which are insulated from the lead pad portions 105 and which hold the semiconductor element 107*b*. Thereafter, although not shown in the drawing, the package resin portion 113*b* is cut along the concave trenches 131 in the outside portions of the segments 133 corresponding to the lead pad portions 105. Thereby, the semiconductor device 1*b* is completed as shown in a bottom plan view of FIG. 18A and in a cross sectional view of FIG. 18B.

Figure 18A:
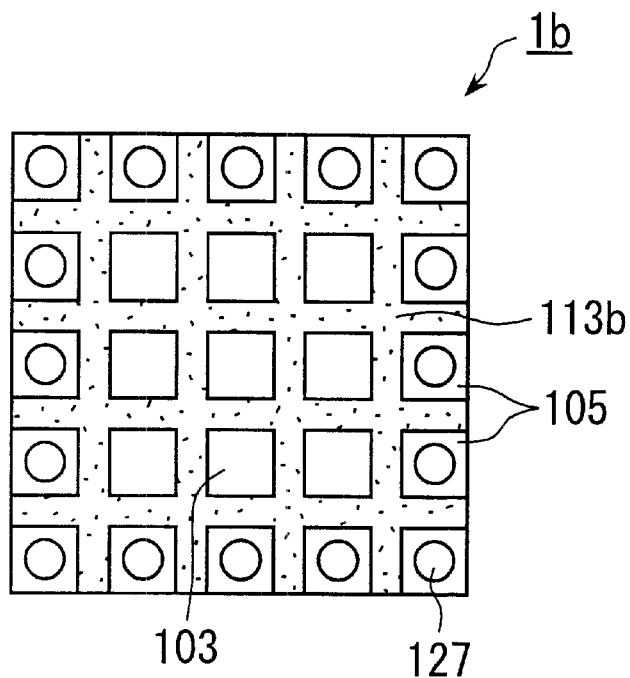
FIG. 18A is a top plan view illustrating a method of manufacturing a semiconductor device according to the second embodiment in the fourth manufacturing step.
Figure 18B:
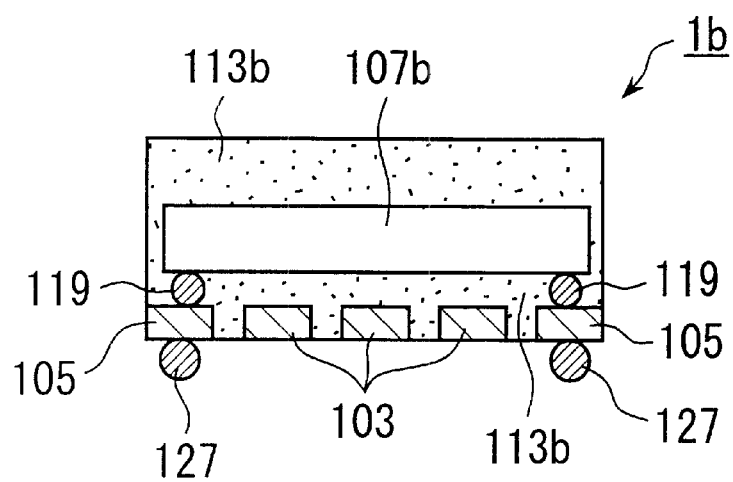
FIG. 18B is a cross sectional view taken along the center line portion of the workpiece of FIG. 18A illustrating a method of manufacturing a semiconductor device according to the second embodiment in the fourth manufacturing step.

In this embodiment, it is also possible to form solder balls 127 on the backside of the divided segments 133 as the lead pad portions 105 as shown in FIGS. 18A and 18B. In this way, it is possible to mount the semiconductor device 1*b* on a mounting substrate by using the solder balls 127, in a manner similar to the semiconductor device shown in FIG. 3B.

Here, as the second embodiment, an example is shown in which a semiconductor device is fabricated by mounting a semiconductor element 107*b* that is previously separated into a chip on the metal plate 101. However, it is also possible to fabricate semiconductor devices by using a semiconductor wafer which includes semiconductor elements but which is not yet separated into individual chips. This method is now explained as a third embodiment. FIGS. 19A and 19B and FIGS. 20A–20D are perspective views and cross sectional views, respectively, illustrating a method of manufacturing a semiconductor device according to the third embodiment in order of manufacturing steps. First, as shown schematically in the perspective view of FIG. 19A, a plurality of semiconductor elements 203 disposed in a lattice like arrangement are formed on a semiconductor wafer having a disk shape, for example, a silicon wafer 201. Then, bumps 205 are formed in the periphery of each of the semiconductor elements 203 in a manner similar to that of the above-mentioned second embodiment. Since the semiconductor elements 203 can be fabricated on the silicon wafer 201 by using a conventional technology, an explanation thereof is omitted here. On the other hand, as shown schematically in the perspective view of FIG. 19B, a square metal plate 101*a* is prepared which has a side length approximately equal to a diameter of the silicon wafer 201. As in the first embodiment, concave trenches 131*a* are formed on whole surface of the metal plate 101*a* in lattice shape by half-dicing, thereby divided segments 133*c* are formed. In this case, a pitch of disposition of the divided segments 133*c* is set equal to a pitch of the bumps 205 along the periphery of the semiconductor element 203, or to a pitch of the lattice arrangement of the bumps 205.

Figure 20A:
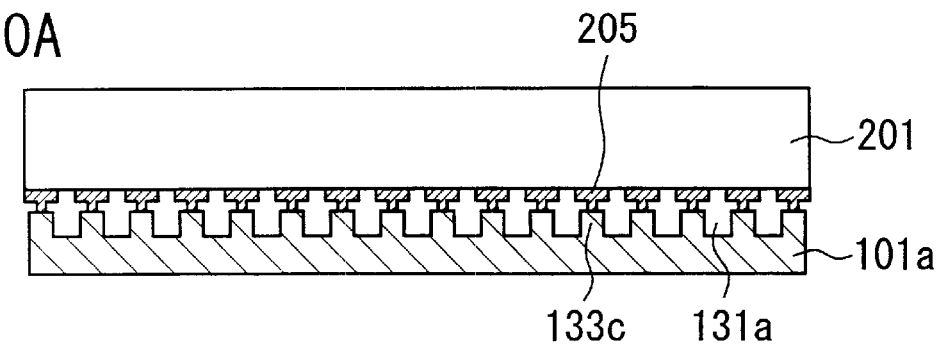
FIG. 20A is a cross sectional view illustrating a condition of workpiece during manufacture according to a method of manufacturing a semiconductor device of the third embodiment.
Figure 20B:
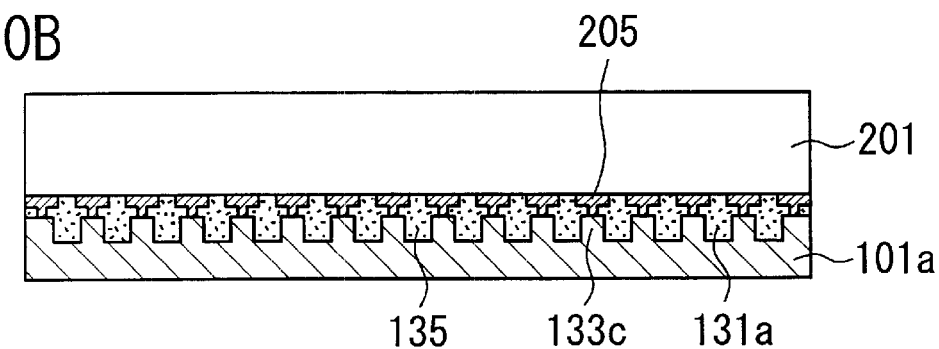
FIG. 20B is a cross sectional view illustrating another condition of workpiece during manufacture according to a method of manufacturing a semiconductor device of the third embodiment.
Figure 20C:
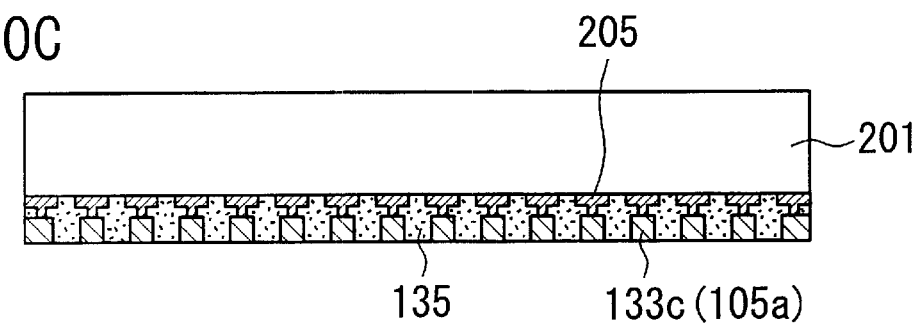
FIG. 20C is a cross sectional view illustrating still another condition of workpiece during manufacture according to a method of manufacturing a semiconductor device of the third embodiment.
Figure 20D:
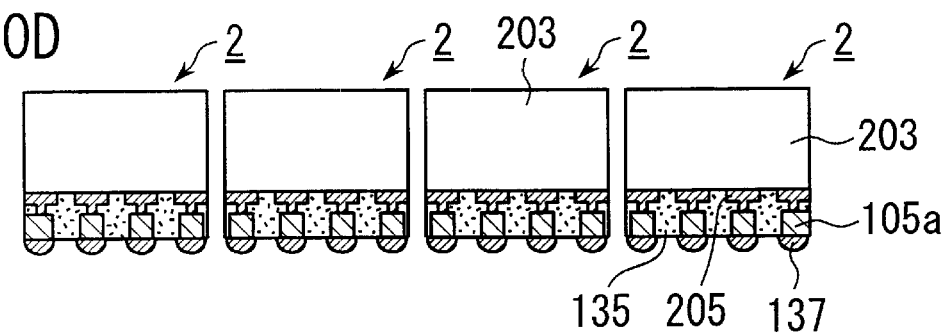
FIG. 20D is a cross sectional view illustrating still another condition of workpiece during manufacture according to a method of manufacturing a semiconductor device of the third embodiment.

As shown in a cross sectional view of FIG. 20A, the surface of the silicon wafer 201 is opposed to the metal plate 101*a* and the silicon wafer 201 is pressed onto the metal plate 101*a* while heating the silicon wafer 201 and the metal plate 101*a*. Thereby, the bumps 205 of the silicon wafer 201 are face-down bonded onto the corresponding divided segments 133*c* of the metal plate 101*a*. Then, as shown in a cross sectional view of FIG. 20B, resin 135 is injected into a space between the silicon wafer 201 and the metal plate 101*a*, that is, in each of the concave trenches 131*a* of the metal plate 101*a* and between the stud bumps 205 of the silicon wafer 201, and the space is sealed with the resin 135. As shown in the cross sectional view of FIG. 20C, the backside of the metal plate 101*a* is then polished until the bottom portions of the divided segments 133*a* are exposed, that is, until the resin 135 filling the concave trenches 131*a* is exposed. By this polishing, the individual divided segments 133*c* are separated from each other. However, the divided segments 133*c* are kept unified by the resin 135 filling the concave trenches 131*a* but electrically isolated with each other. The divided segments 133*c* to which the bumps 205 are bonded function as lead pad portions 105*a*, that is, mounting electrodes. In FIG. 20C, die pad portions are not shown, but the semiconductor device has the die pad portions. Thereafter, as shown in the cross sectional view of FIG. 20D, the silicon wafer 201 and the metal plate 101*a* are cut along dicing lines, that is, scribe lines, of the semiconductor element 203 by full-cut dicing. Thereby, the silicon wafer 201 is divided into separate semiconductor elements 203, and the metal plate 101*a* is also divided at the portions of the resin 135. Thus, a plurality of semiconductor devices 2 are fabricated. Also, before or after the dividing process, solder balls 137 are formed on the surface of the lead pad portions 105*a*.

The structure of the semiconductor device 2 according to the third embodiment resembles the structure of the semiconductor device according to the above-mentioned second embodiment. However, in the semiconductor device 2 according to the third embodiment, both the semiconductor element 203 and the group of the lead pad portions 105*a* have the same external size. Also, in the semiconductor device 2, a package resin which coats and seals the semiconductor element 203 does not exist and does not cover the semiconductor element 203. Therefore, it is possible to make the semiconductor devices more compact and thinner. In the semiconductor device according to the third embodiment, although the resin 135 filling the space between the silicon wafer 201 and metal plate 101*a* is used, the package resin is not required. Therefore, it is possible to reduce the quantity of resin required for manufacturing the semiconductor devices, and cost of the semiconductor devices can be reduced. Further, in the manufacturing process of the semiconductor device according to the third embodiment, it is possible to perform a dicing process for dividing the silicon wafer 201 into a plurality of semiconductor elements 203 and a dicing process for cutting the resin 135 in the metal plate 101*a* at the same time. Also, it is possible to omit a process of individually mounting a plurality of semiconductor element chips onto the respective metal plates. Therefore, it is possible to simplify the whole manufacturing process.

Figure 21:
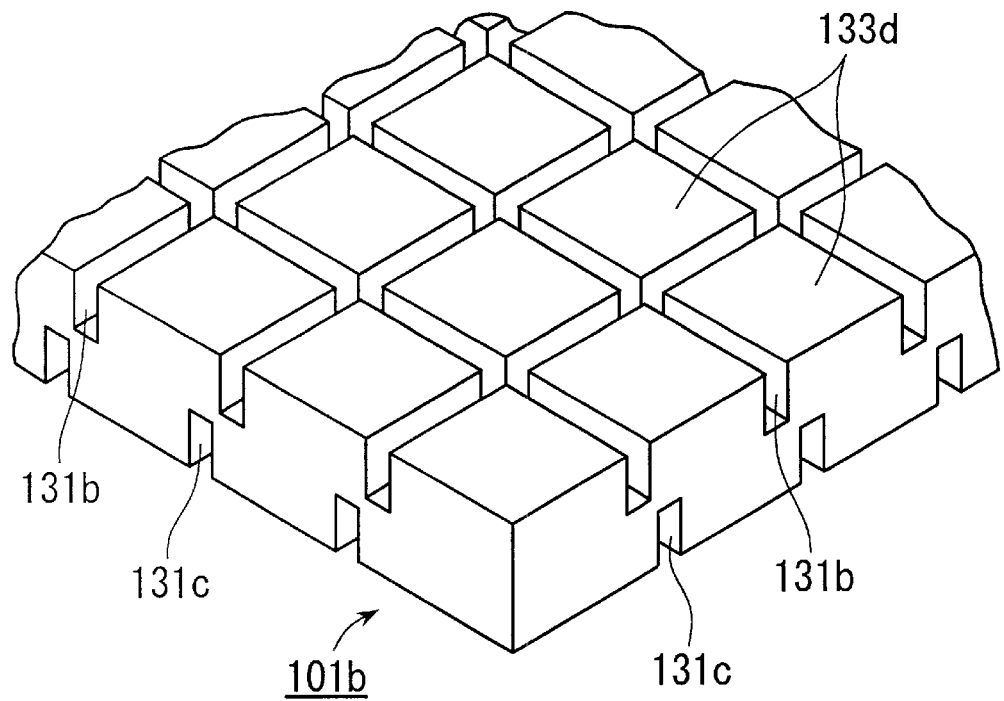
FIG. 21 is a partially enlarged perspective view showing a metal plate used in a method of manufacturing a semiconductor device according to a first variation of the third embodiment.
Figure 22:
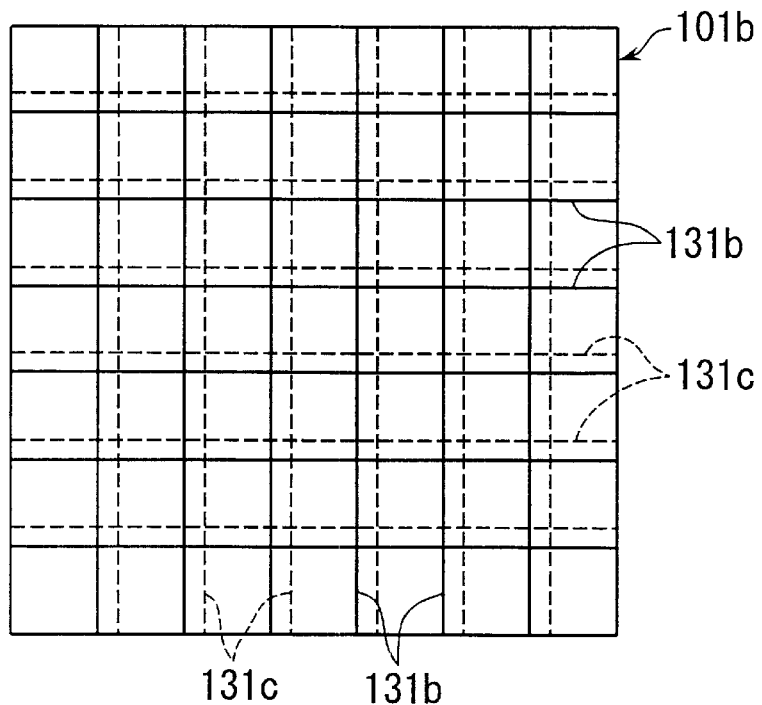
FIG. 22 is a schematic plan view showing a relationship between concave trenches in a metal plate used in a method of manufacturing a semiconductor device according to the first variation of the third embodiment.

With reference to the drawings, an explanation will now be made on a first variation of the third embodiment. In this variation, divided segments constituting lead pad portions and die pad portions are formed such that the cross section of each of the divided segments has a crank shape. Thereby, it is possible to mitigate thermal stress caused between a semiconductor device and a mounting substrate when the semiconductor device is mounted on the mounting substrate. Thus, a reliability of a semiconductor device in a condition it is mounted can be improved. A silicon wafer used in this variation is worked similarly to the silicon wafer 201 used in the above-mentioned third embodiment. However, a metal plate 101b used in this variation differs from the metal plate 101a used in the third embodiment. FIG. 21 is a partial enlarged perspective view of the metal plate 101b used in this variation. As shown in FIG. 21, the metal plate 101b is a square shaped metal board which has concave trenches 131b and concave trenches 131c formed on the face surface and on the backside surface thereof respectively. The concave trenches 131b on the face side surface each have a depth approximately 40–50 percent of the thickness of the metal plate 101b and are formed in X and Y directions in a lattice shape. The concave trenches 131c on the backside surface each have a depth approximately 40–50 percent of the thickness of the metal plate 101b and are formed in X and Y directions in a lattice shape. FIG. 22 is a schematic plan view showing a relationship between the concave trenches 131b and the concave trenches 131c in the metal plate 101b. In FIG. 22, for the sake of easy understanding, widths of the concave trenches 131b and 131c are neglected. The concave trenches 131b on the face surface side (shown by solid lines in FIG. 22) and the concave trenches 131c on the back side (shown by dotted lines in FIG. 22) have the same width of the trenches and the same pitch of the trenches. However, the concave trenches 131c are shifted from the concave trenches 131b both in the X and Y directions by distances corresponding to the width of the trenches.

Figure 25:
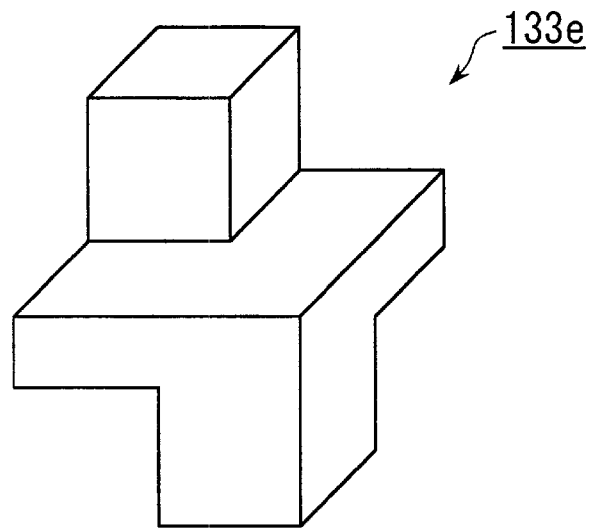
FIG. 25 is a perspective view showing a divided segment made from a metal plate and illustrating a method of manufacturing a semiconductor device according to first variation of the third embodiment.
Figure 24:
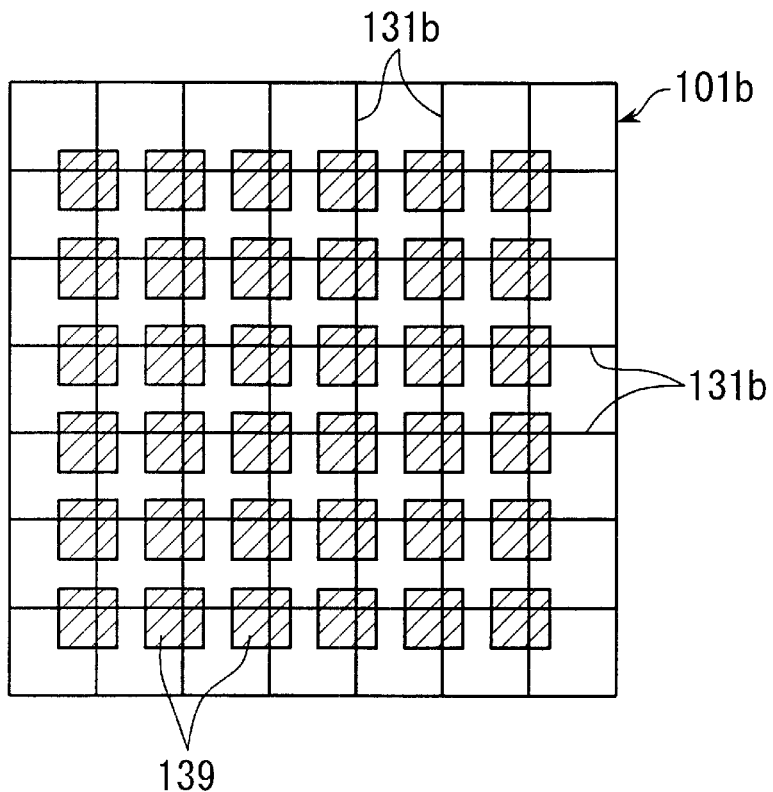
FIG. 24 is a schematic plan view illustrating areas in which a photoresist mask is to be formed according to the first variation of the third embodiment.
Figure 23A:
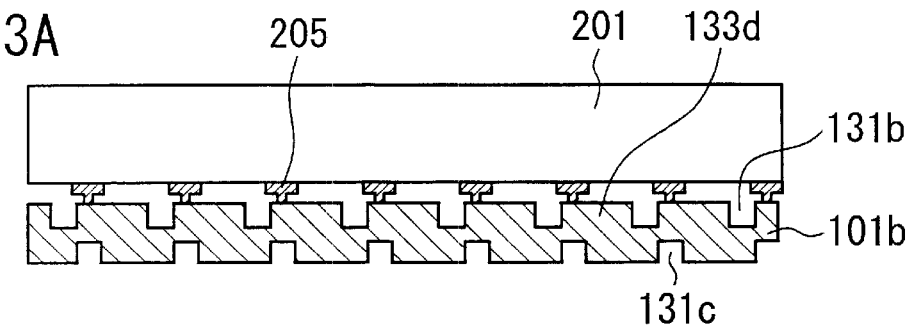
FIG. 23A is a cross sectional view showing a method of manufacturing a semiconductor device by using the metal plate shown in FIG. 21 according to the first variation of the third embodiment.
Figure 23B:
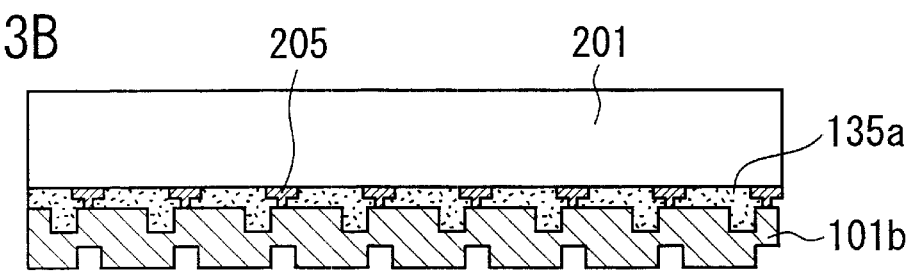
FIG. 23B is a cross sectional view showing a method of manufacturing a semiconductor device by using the metal plate shown in FIG. 21 according to the first variation of the third embodiment.
Figure 23C:
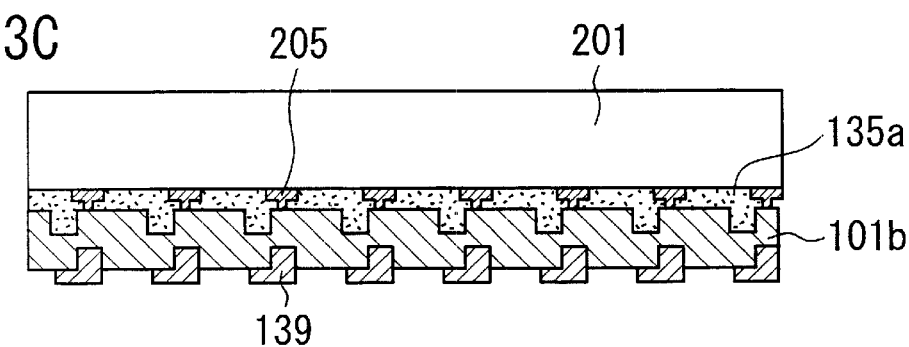
FIG. 23C is a cross sectional view showing a method of manufacturing a semiconductor device by using the metal plate shown in FIG. 21 according to the first variation of the third embodiment.
Figure 23D:
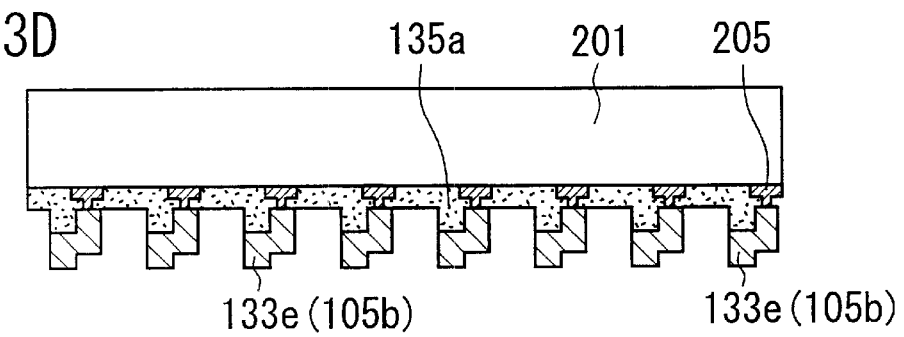
FIG. 23D is a cross sectional view showing a method of manufacturing a semiconductor device by using the metal plate shown in FIG. 21 according to the first variation of the third embodiment.

FIGS. 23A through 23E are cross sectional views showing a method of manufacturing a semiconductor device by using the above-mentioned metal plate 101b according to the first variation of the third embodiment in order of process steps. As shown in FIG. 23A, the bumps 205 of the silicon wafer 201 are bonded to the divided segments 133d on the face side surface of the metal plate 101b as in the above-mentioned third embodiment. Then, as shown in FIG. 23B, resin 135a is injected into a space between the silicon wafer 201 and the metal plate 101b. As shown in FIG. 23C, a photoresist mask 139 is formed on the back side surface of the metal plate 101b. The photoresist mask 139 covers areas which are to be left as lead pad portions and die pad portions in the metal plate 101b. FIG. 24 is a schematic plan view illustrating the areas in which the photoresist mask 139 is to be formed. For the sake of easy understanding, schematic locations of the concave trenches 131b are also shown in FIG. 24, although the width of each of the concave trenches 131b is neglected. As shown in FIG. 24, the photoresist mask 139 is formed as minute rectangular pattern portions which are disposed regularly in the X and Y directions and which have the same pitches as those of the concave trenches 131b or the concave trenches 131c. When the concave trenches 131b and the concave trenches 131c are perspectively viewed from the back surface side of the metal plate 101b, each of the minute patterns of the photoresist mask 139 is disposed such that both a part of a concave trench 131b and a part of a concave trench 131c are covered by the minute pattern. Since a portion of each minute patterns of the photoresist mask 139 is buried into a concave trench 131b, each minute pattern of the photoresist mask 139 has a gourd-like solid shape. Then, as shown in FIG. 23D, the metal plate 101b is etched through the whole thickness by using the photoresist mask 139 as an etching mask. Thereby, divided segments 133e are formed as independent pieces. Thereafter, the remained photoresist mask 139 is removed. FIG. 25 is a schematic perspective view illustrating a solid shape of each of the divided segments 133e. As can be seen from FIG. 25, a cross section of each of the divided segments 133e in the direction of the thickness becomes a crank shape. Among the divided segments 133e, the divided segments 133e bonded to the bump 205 of the silicon wafer 201 are formed as lead pad portions 105b. The lead pad portions 105b are unified and joined with the silicon wafer 201 due to the bonding by the bumps 205 and due to the bonding by the resin 135a.

Figure 23E:
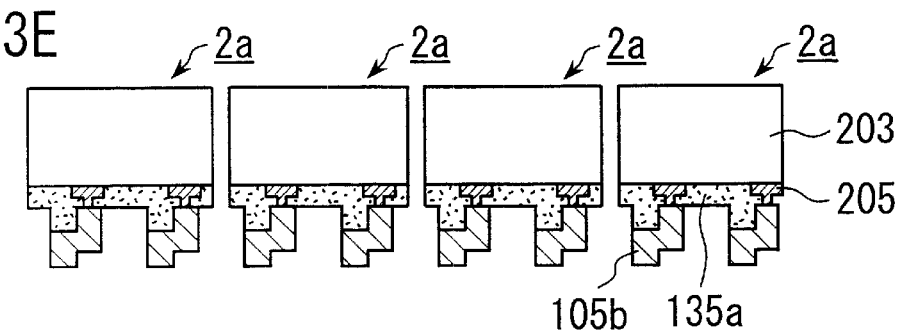
FIG. 23E is a cross sectional view showing a method of manufacturing a semiconductor device by using the metal plate shown in FIG. 21 according to the first variation of the third embodiment.

Thereafter, as shown in FIG. 23E, the silicon wafer 201 and the metal plate 101b are cut at predetermined locations by a dicing saw and divided into pieces each having a predetermined size. Thereby, individual semiconductor devices 2a are formed. In this case, the metal plate 101b is already divided by the process steps described with reference to FIG. 23D. Thus, in practice, it is only necessary to cut the silicon wafer 201 and the resin 135 in the cutting process illustrated in FIG. 23E. In the semiconductor device 2a, each of the lead pad portions 105b has a shape which is bent into a crank-like shape. When the semiconductor device 2a is mounted on a mounting substrate as shown, for example, in FIGS. 3A and 3B, there is a possibility that stress is applied on the lead pad portions 105b due to the difference of thermal expansion coefficients between the mounting substrate and the semiconductor element of the semiconductor device. However, even in such case, it is possible to absorb such stress at the crank-like bent portion of each lead pad portions 105b. Thereby, it is possible to avoid breakage of coupling between the lead pad portions 105b and the mounting substrate. Therefore, reliability of mounting of the semiconductor device can be improved. Although not shown in the drawing, it is possible to fill the spaces between the divided segments 133e with resin and to flatten the backside of the semiconductor device, and, thereafter, to form a solder ball on the backside surface of each of the lead pad portions 105b. Alternatively, in place of the solder ball, it is possible to form a solder plated portion and the like on the backside surface of each of the lead pad portions 105b. Even in such case, it is possible to retain the above-mentioned function of mitigating the stress by the lead pad portions 105b.

Figure 19A:
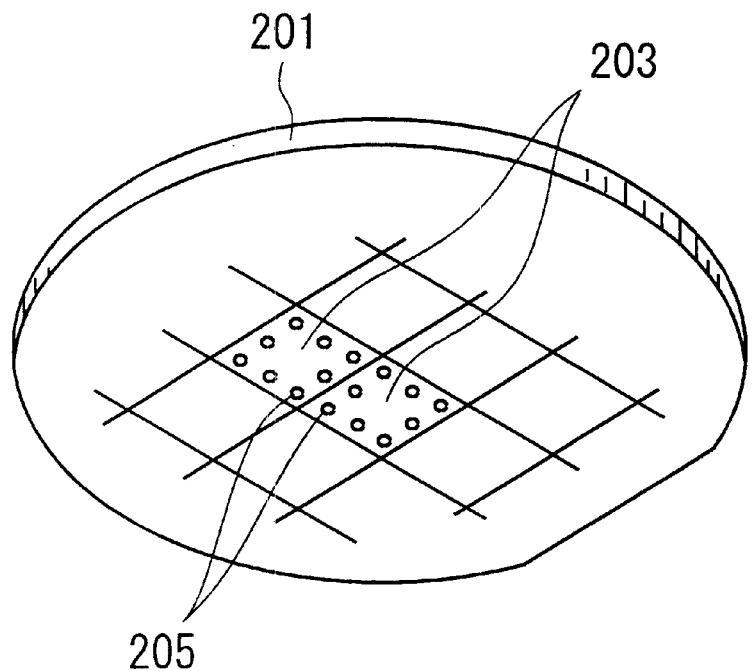
FIG. 19A is a perspective view showing a semiconductor wafer and illustrating a method of manufacturing a semiconductor device according to a third embodiment.
Figure 19B:
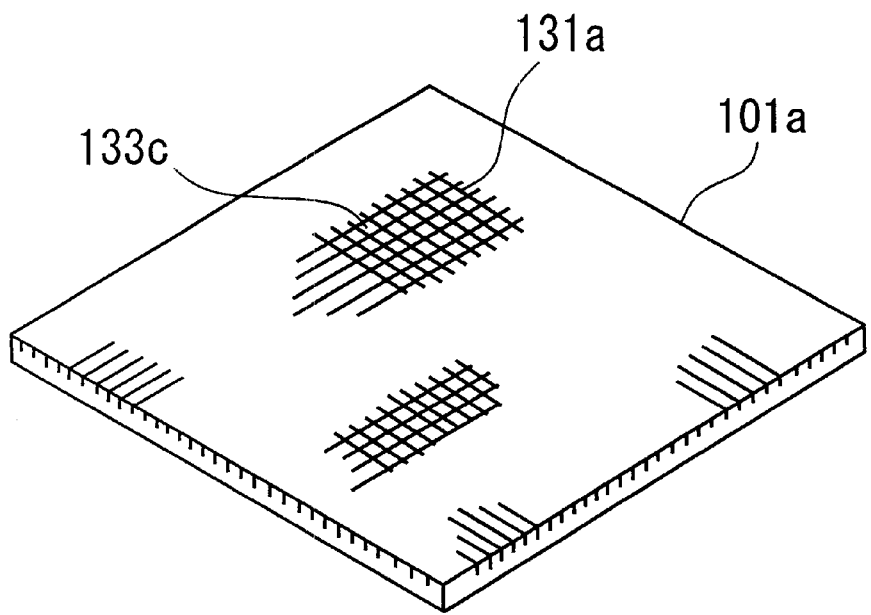
FIG. 19B is a perspective view showing a metal plate and illustrating a method of manufacturing a semiconductor device according to the third embodiment.
Figure 26A:
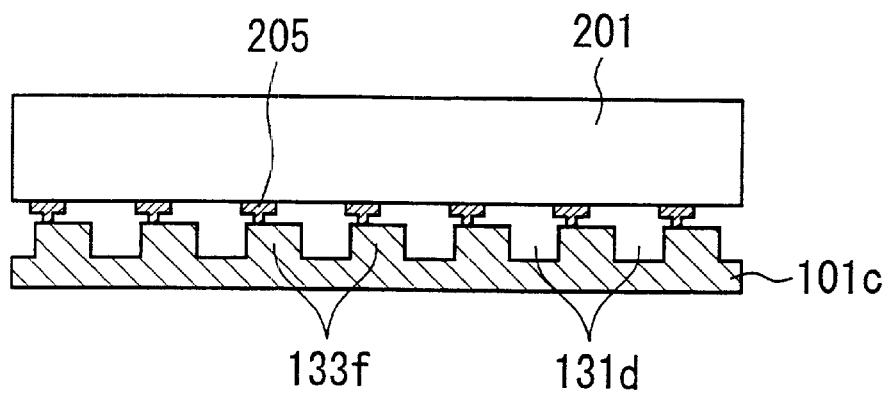
FIG. 26A is a cross sectional view showing a method of manufacturing a semiconductor device according to a second variation of the third embodiment.
Figure 26B:
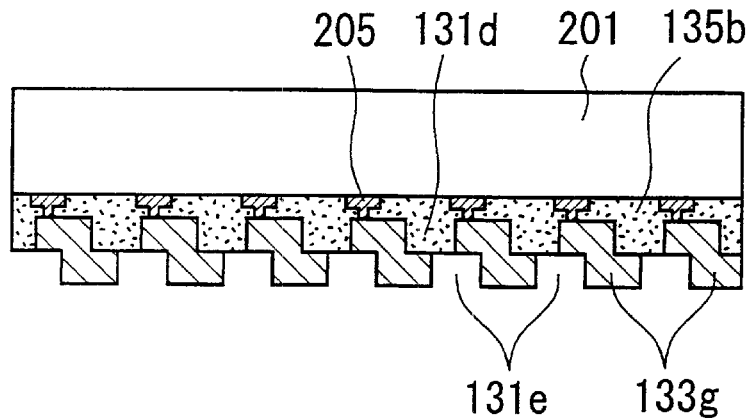
FIG. 26B is a cross sectional view showing a method of manufacturing a semiconductor device according to the second variation of the third embodiment.
Figure 27A:
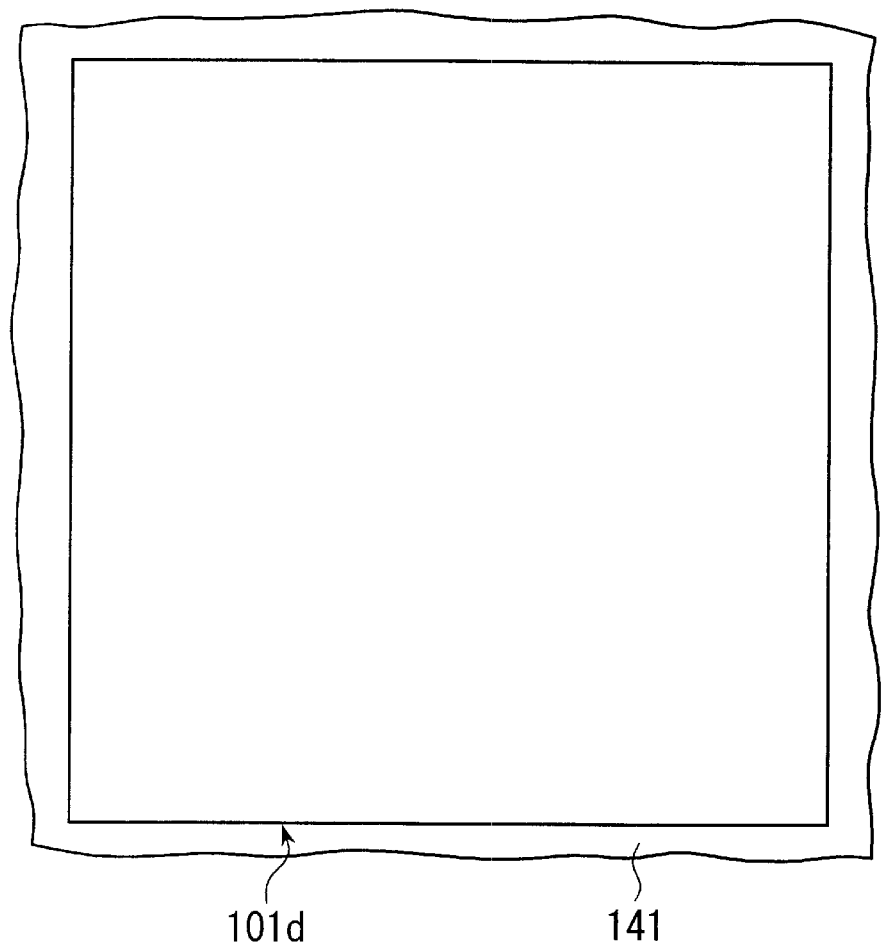
FIG. 27A is a top plan view illustrating a method of manufacturing a semiconductor device according to a fourth embodiment in a first manufacturing step.
Figure 27B:
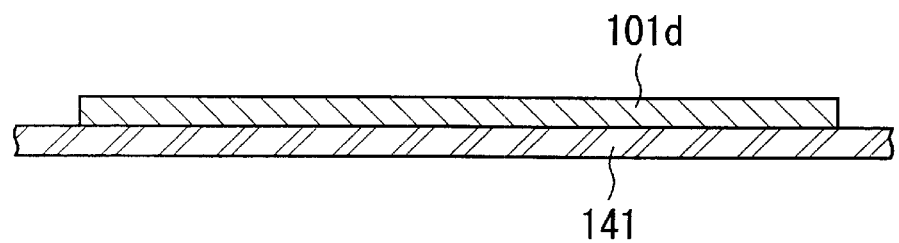
FIG. 27B is a cross sectional view taken along the center line portion of the workpiece of FIG. 27A illustrating a method of manufacturing a semiconductor device according to the fourth embodiment in the first manufacturing step.
Figure 28A:
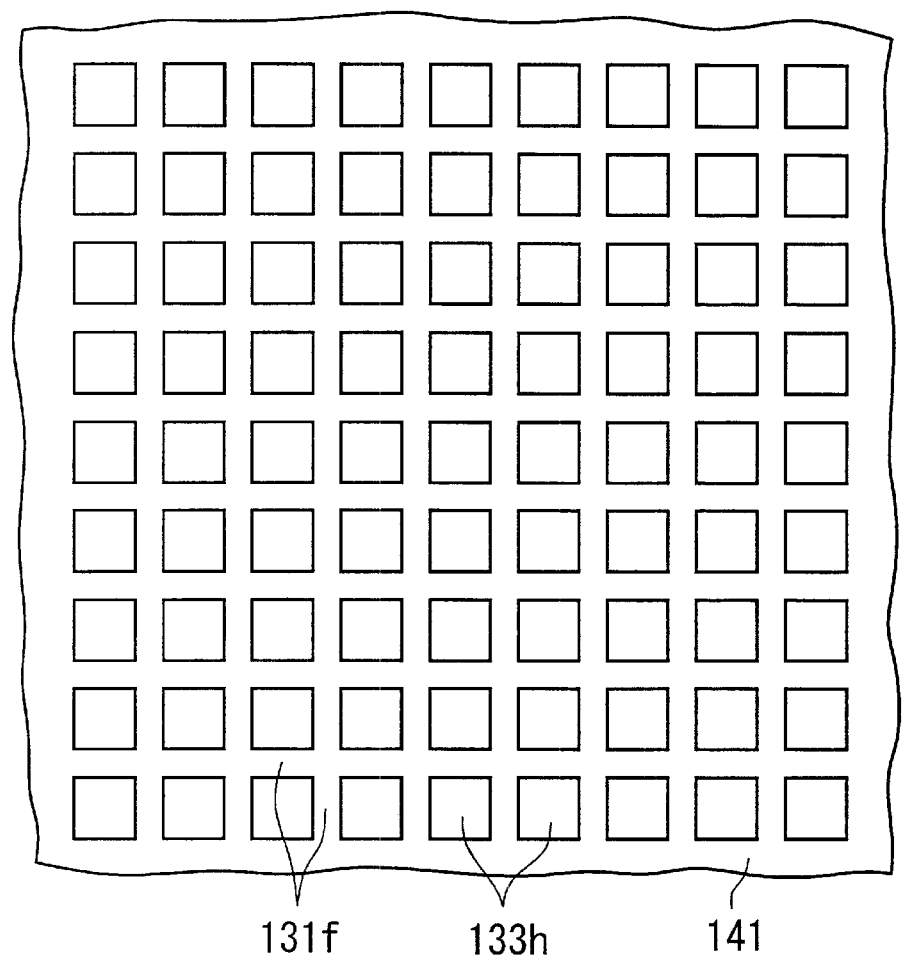
FIG. 28A is a top plan view illustrating a method of manufacturing a semiconductor device according to the fourth embodiment in a second manufacturing step.
Figure 28B:
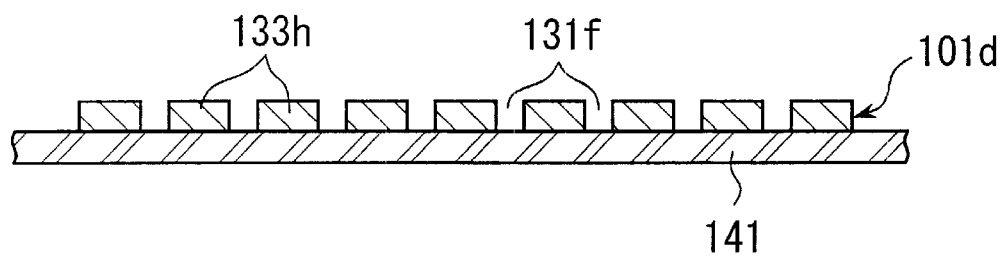
FIG. 28B is a cross sectional view taken along the center line portion of the workpiece of FIG. 28A illustrating a method of manufacturing a semiconductor device according to the fourth embodiment in the second manufacturing step.
Figure 29A:
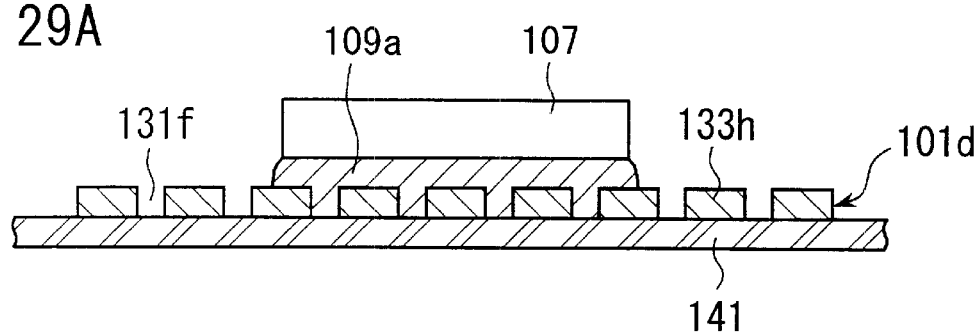
FIG. 29A is a cross sectional view illustrating a method of manufacturing a semiconductor device according to the fourth embodiment in a subsequent manufacturing step.
Figure 29B:
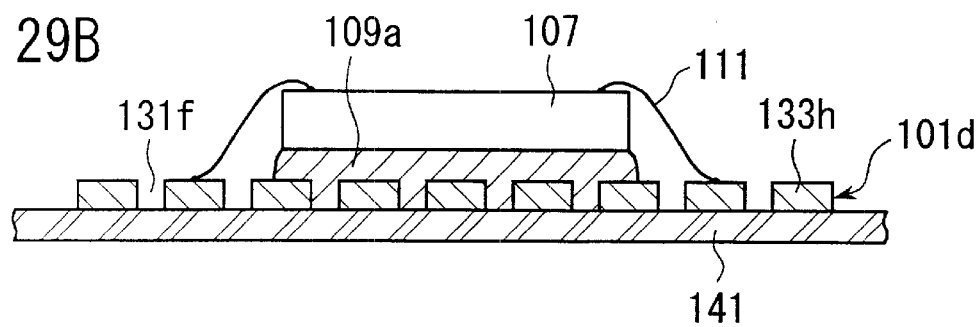
FIG. 29B is a cross sectional view illustrating a method of manufacturing a semiconductor device according to the fourth embodiment in a subsequent manufacturing step.
Figure 29C:
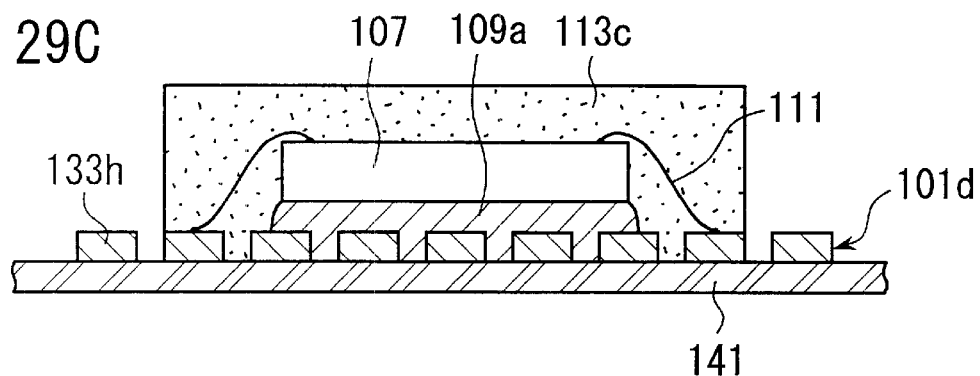
FIG. 29C is a cross sectional view illustrating a method of manufacturing a semiconductor device according to the fourth embodiment in a subsequent manufacturing step.
Figure 29D:
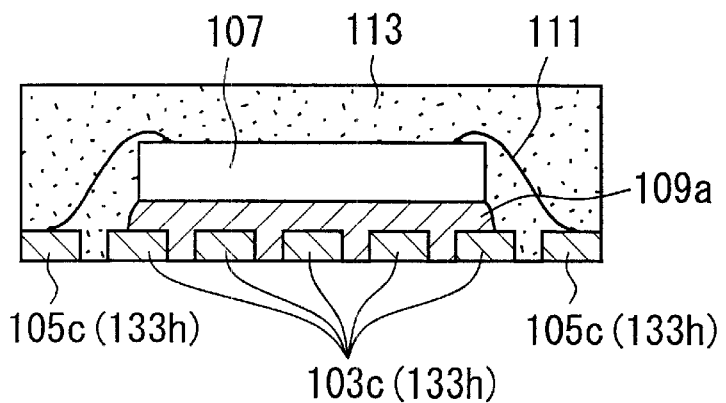
FIG. 29D is a cross sectional view illustrating a method of manufacturing a semiconductor device according to the fourth embodiment in a subsequent manufacturing step.

An explanation will now be made on a second variation of the third embodiment. In the above-mentioned first variation, the semiconductor device 2a is fabricated by forming the photoresist mask on the backside surface of the metal plate 101b and by selectively etching the metal plate 101b. However, if the width of each of the concave trenches formed in lattice shape is enlarged, it is possible to omit the process of selectively removing the metal plate by etching. Such method is explained as the second variation. FIGS. 26A and 26B are cross sectional views showing a method of manufacturing a semiconductor device as the second variation of the third embodiment in order of manufacturing steps. In the second variation, the semiconductor device is formed from a disk shaped semiconductor wafer, here, a silicon wafer 201, as shown in FIG. 19A. As mentioned above, on the silicon wafer 201, there are formed semiconductor elements 203 disposed in a lattice arrangement. Also, as in the third embodiment, bumps 205 are formed in the peripheral portion of each of the semiconductor elements 203. On the other hand, a metal plate 101c is prepared which is a square shaped metal board and which has the side length approximately equal to the diameter of the silicon wafer 201. Then, concave trenches 131d are formed on the face side surface thereof, and thereby divided segments 133f are formed. The concave trenches 131c each have a depth approximately 50 percent of the thickness of the metal plate 101c and are formed in X and Y directions in a lattice shape. In this case, a pitch of disposition of the divided segments 133f is set equal to a pitch of the bumps 205 along the periphery of the semiconductor element 203, or to a pitch of the lattice arrangement of the bumps 205.

As shown in a cross sectional view of FIG. 26A, the backside surface of the silicon wafer 201 is opposed to the metal plate 101c and the silicon wafer 201 is pressed onto the metal plate 101c while heating the silicon wafer 201 and the metal plate 101c. Thereby, the bumps 205 of the silicon wafer 201 are face-down bonded onto the corresponding divided segments 133f of the metal plate 101c. Then, as shown in a cross sectional view of FIG. 26B, resin 135b is injected into a space between the silicon wafer 201 and the metal plate 101c, that is, in each of the concave trenches 131d of the metal plate 101c and between the bumps 205 of the silicon wafer 201, and the space is sealed by the resin 135b. Thereafter, concave trenches 131e are formed on the backside surface of the metal plate 101c. Each of the concave trenches 131d has a depth approximately 50 percent of the thickness of the metal plate 101c and are formed in X and Y directions in a lattice shape. As in the first variation, the concave trenches 131d on the face surface side and the concave trenches 131e on the back side have the same width of the trenches and the same pitch of the trenches. However, the concave trenches 131e are shifted from the concave trenches 131d both in the X and Y directions by distances smaller than the width of the trenches 131d or 131e. That is, the concave trenches 131d and the concave trenches 131e partially overlap with each other. In this way, by forming the concave trenches 131e from the backside of the metal plate 101c, it is possible to form individually divided segments 133g. Each of the divided segments 133g has a crank-like cross section in the direction of the thickness thereof. Thereafter, although not shown in the drawing, the silicon wafer 201 and the metal plate 101c are cut at predetermined locations by a dicing saw and divided into pieces each having a predetermined size. Thereby, individual semiconductor devices are formed. In this case, the metal plate 101c is already divided in the process steps for forming the concave trenches 131e on the backside described with reference to FIG. 26B. Thus, in practice, it is only necessary to cut the silicon wafer 201 and the resin 135b in the cutting process.

With reference to FIGS. 27A and 27B, FIGS. 28A and 28B, and FIGS. 29A–29D, an explanation will be made on a fourth embodiment of the present invention. In this embodiment, a metal plate is at first full-cut diced to form separate divided segments, and the divided segments are used to constitute die pad portions and lead pad portions. As shown in a top plan view of FIGS. 27A and in a cross sectional view of FIG. 27B, an adhesive sheet 141 is stuck on the backside surface of a metal plate 101d having a predetermined size. The adhesive sheet 141 holds divided segments 133h which are divided in a later process. Also, the adhesive sheet 141 has a thickness and a stiffness sufficient to maintain flatness of the sheet. Then, as shown in a top plan view of FIG. 28A and in a cross sectional view of FIG. 28B, the metal plate 101d is full-cut diced from the face side surface, and concave trenches 131f extending in X and Y directions are formed in the metal plate 101d. Thereby, the divided segments 133h are formed which are disposed in a lattice shape. Although these divided segments 133h are completely separated, a condition of initial arrangement of the divided segments 133h is maintained by the adhesive sheet 141.

Thereafter, process steps approximately similar to those shown in FIGS. 6A and 6B through FIGS. 9A and 9B of the first embodiment are performed. That is, as shown in a cross sectional view of FIG. 29A, a semiconductor element 107 is mounted on the surface of the metal plate 101d by using a mounting material 109a. Then, as shown in a cross sectional view of FIG. 29B, electrodes of the semiconductor element 107 and the divided segments 133h which become lead pad portions 105c located in the periphery of the semiconductor element 107 are electrically coupled by bonding wires 111. As shown in the cross sectional view of FIG. 29C, resin is then molded or applied on the surface of the metal plate 101d. Thereby, a package resin portion 113c is formed which molds the semiconductor element 107 and the bonding wires 111. Thereafter, as shown in the cross sectional view of FIG. 29D, the adhesive sheet 141 stuck on the backside surface of the metal plate 101d is peeled off. Thereby, it is possible to fabricate a semiconductor device according to the fourth embodiment which has a structure similar to that of the first embodiment. Differing from the first through third embodiments, in the fourth embodiment, it is not necessary to perform polishing of the backside surface of the metal plate 101d. Although not shown in the drawing, when a plurality of semiconductor elements are molded together by a package resin portion, it is possible to obtain separate semiconductor devices by cutting the package resin portion into individual pieces. Also, as shown in FIGS. 2A and 2B, an insulating resist film may be or may not be selectively applied on the backside surface of each of the divided segments 133h constituting die pad portions 103c.

Figure 30A:
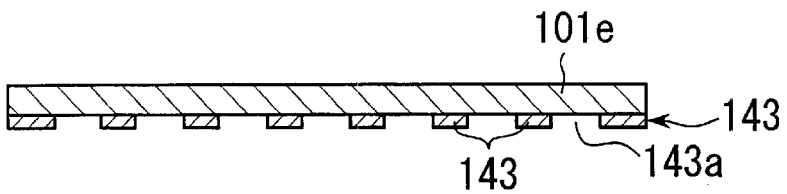
FIG. 30A is a cross sectional view illustrating a condition of workpiece during manufacture in a method of manufacturing a semiconductor device according to a variation of the fourth embodiment.
Figure 30B:
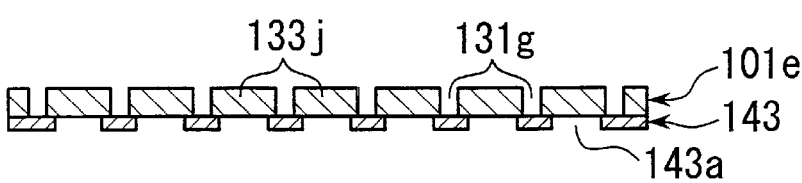
FIG. 30B is a cross sectional view illustrating a condition of workpiece during manufacture in a method of manufacturing a semiconductor device according to the variation of the fourth embodiment.
Figure 30C:
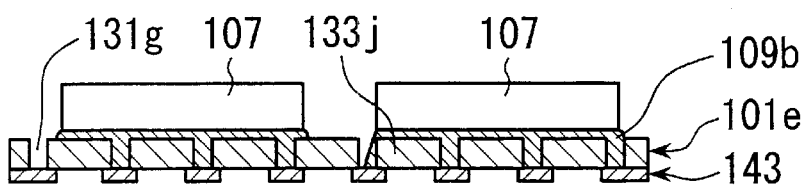
FIG. 30C is a cross sectional view illustrating a condition of workpiece during manufacture in a method of manufacturing a semiconductor device according to the variation of the fourth embodiment.
Figure 30D:
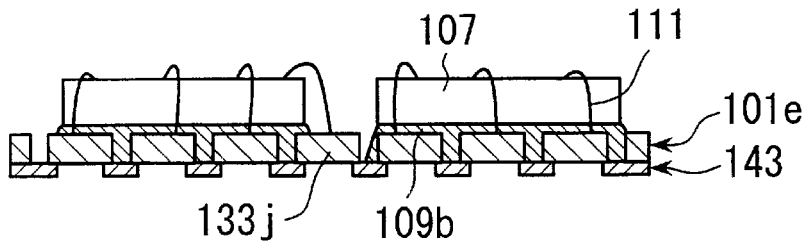
FIG. 30D is a cross sectional view illustrating a condition of workpiece during manufacture in a method of manufacturing a semiconductor device according to the variation of the fourth embodiment.
Figure 30E:
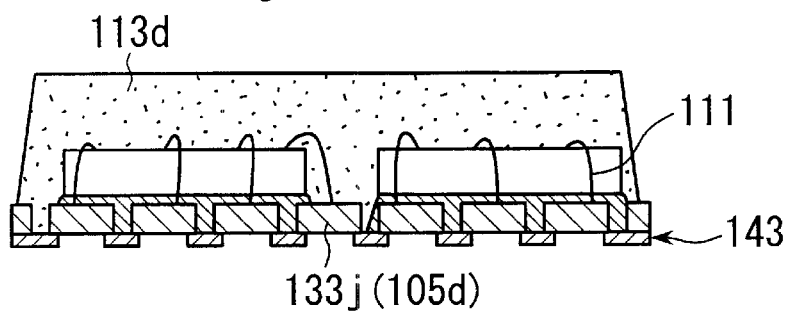
FIG. 30E is a cross sectional view illustrating a condition of workpiece during manufacture in a method of manufacturing a semiconductor device according to the variation of the fourth embodiment.
Figure 30F:
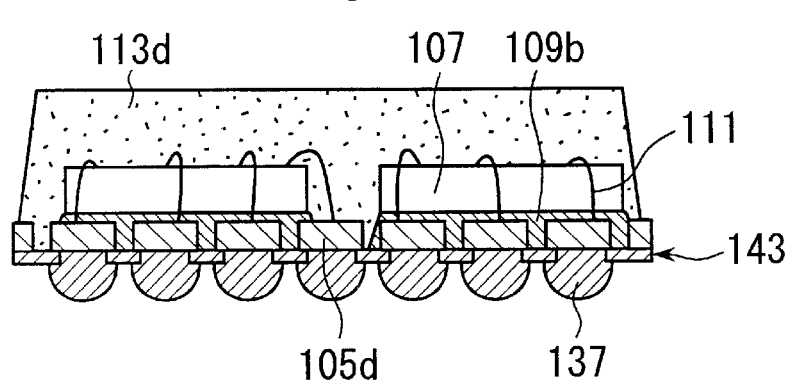
FIG. 30F is a cross sectional view illustrating a condition of workpiece during manufacture in a method of manufacturing a semiconductor device according to the variation of the fourth embodiment.
Figure 31:
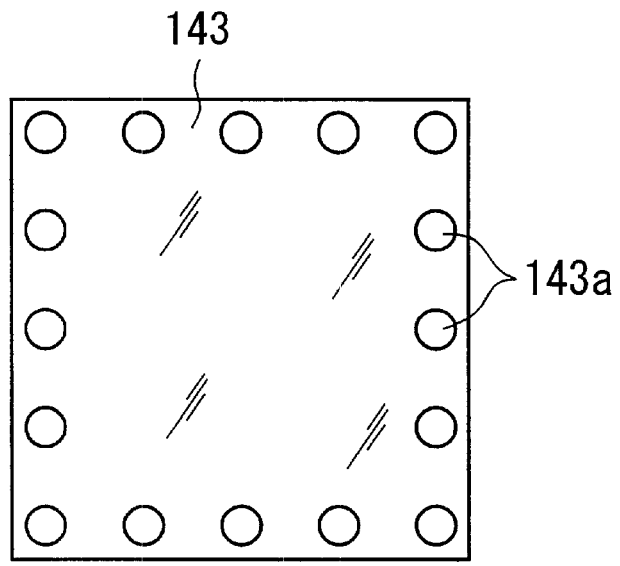
FIG. 31 is a schematic plan view illustrating a resist sheet used in the method according to the variation of the fourth embodiment.
Figure 32:
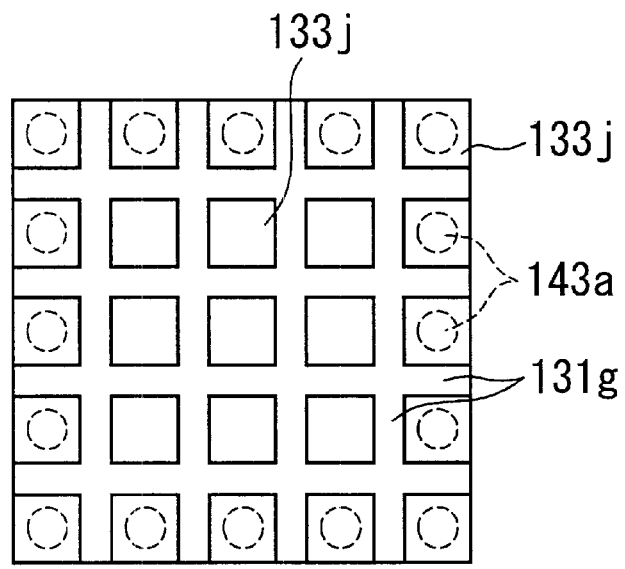
FIG. 32 is a schematic plan view illustrating a positional relationship between opening portions and divided segments in the method according to the variation of the fourth embodiment.
Figure 33A:
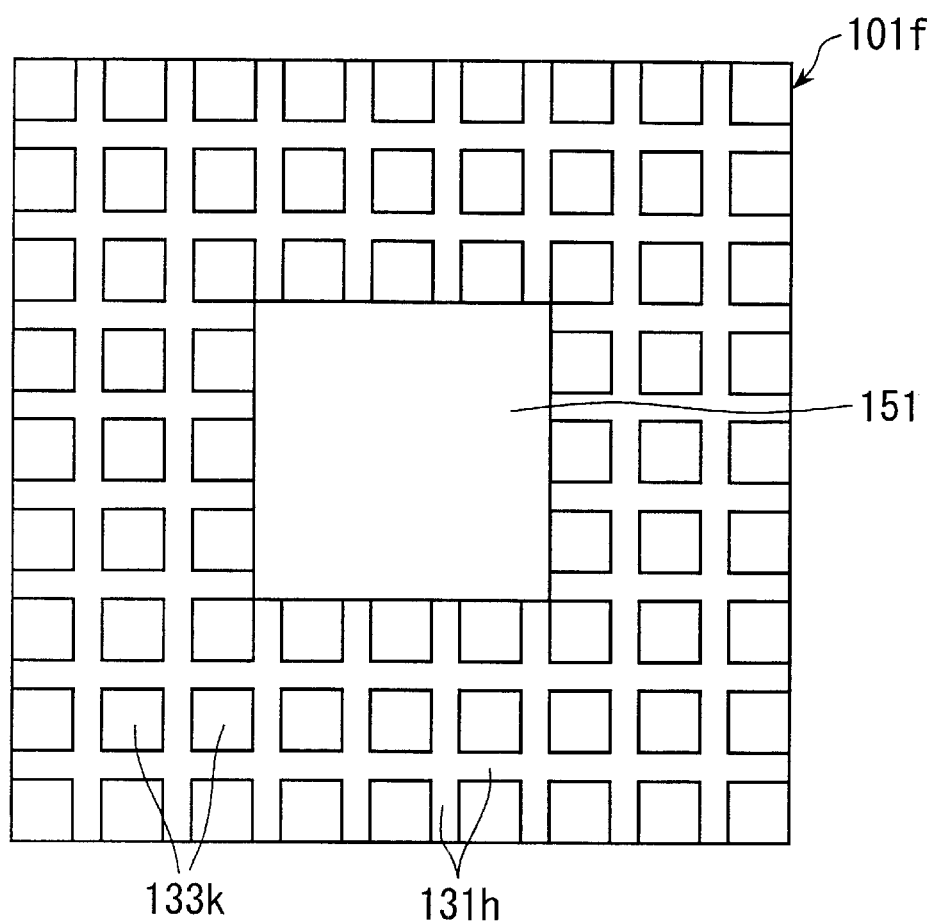
FIG. 33A is a top plan view illustrating a method of manufacturing a semiconductor device according to a fifth embodiment.
Figure 33B:
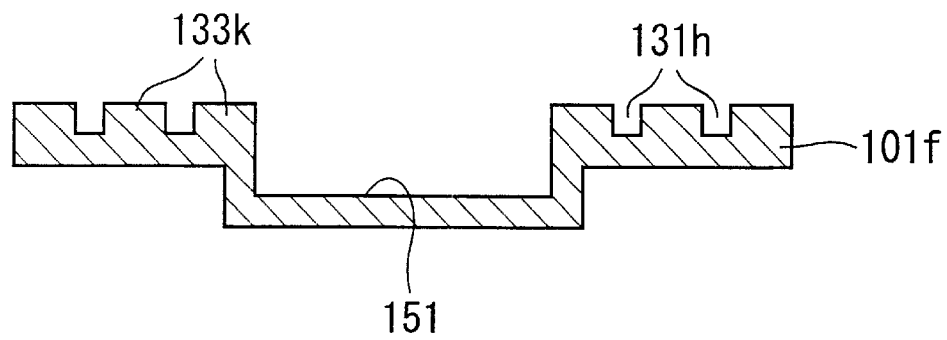
FIG. 33B is a cross sectional view taken along the center line portion of the workpiece of FIG. 33A illustrating a method of manufacturing a semiconductor device according to the fifth embodiment.

In the above-mentioned fourth embodiment, the adhesive sheet 141 is used which is not required as a constituent of the semiconductor device. In this point, the fourth embodiment may not be advantageous in reducing the number of components required for fabricating the semiconductor device. An explanation will now be made on a method of manufacturing a semiconductor device as a variation of the fourth embodiment. This method does not use such unnecessary component, but realizes fabrication of a semiconductor device in a manner similar to the fourth embodiment. FIGS. 30A–30F are schematic cross sectional views illustrating a manufacturing method of this variation in order of manufacturing steps. First, as shown in FIG. 30A, a resist sheet 143 is bonded on the backside surface of the metal plate 101e. The resist sheet 143 is made of material which does not adhere to solder and the like and which has high heat resistance and high moisture resistance. FIG. 31 is a schematic plan view illustrating the resist sheet 143. As shown in FIG. 31, in the resist sheet 143, openings 143a are formed at portions corresponding to locations in which mounting electrodes of a semiconductor device to be fabricated are disposed. As shown in FIG. 30B, as in the fourth embodiment, a metal plate 101e is full-cut diced to form concave trenches 131g extending in X and Y directions and, thereby, separate divided segments 133j are formed in lattice arrangement. FIG. 32 is a schematic plan view illustrating a positional relationship between the opening portions 143*a* and the divided segments 133*j*. As shown in FIG. 32, the concave trenches 131*g* are formed in a predetermined pitch such that locations of portions of the divided segments 133*j* correspond to the locations of the openings 143*a* of the resist sheet 143. The divided segments 133*j* are hold in a unified condition by the resist sheet 143.

Thereafter, process steps approximately similar to those of the above-mentioned fourth embodiment are performed. That is, as shown in a cross sectional view of FIG. 30C, two semiconductor elements 107 are mounted on the surface of the metal plate 101*e* by using mounting material portions 109*b*. Then, as shown in a cross sectional view of FIG. 30D, electrodes of the semiconductor elements 107 and the divided segments 133*j* which become lead pad portions 105*d* located in the periphery of the semiconductor elements 107 are electrically coupled by bonding wires 111. As shown in the cross sectional view of FIG. 30E, resin 113*d* is then molded or applied on the surface of the metal plate 101*e*. Thereby, a package resin portion 113*d* is formed which molds the semiconductor elements 107 and the bonding wires 111. Thereafter, the package resin portion 113*d* is cut and also the resist sheet 143 is cut to fabricate individual semiconductor devices. Then, as shown in FIG. 30F, solder balls 137 are joined on the backside surface of the divided segments 133*j* as the lead pad portions 105*d* exposed via the openings 143*a* of the resist sheet 143. In this case, since the resist sheet 143 does not have adhesiveness with the solder, there is little possibility that the divided segments 133*j* exposing via adjacent openings 143*a* are short-circuited by the solder. As a result, the resist sheet 143 functions like the resist film 115 in the first embodiment. In this variation, the resist sheet 143 which supports the divided segments obtained when the metal plate 101*e* is full-cut diced can be used as the resist film on the backside of the semiconductor device as it is. Therefore, components can be effectively utilized.

In the fourth embodiment and the variation thereof, the semiconductor elements are mounted on the metal plate while keeping the surface of the semiconductor elements on which the electrodes are formed upside. Then, the electrodes of the semiconductor elements are electrically coupled with the divided segments by the bonding wires. However, in these structures, it is also possible to form bumps on the surface of each of the semiconductor elements and to mount the semiconductor elements on the metal plate in the face-down manner, as in the second embodiment, such that the bumps are coupled with the divided segments of the metal plate. In such case, it is also possible to mount a silicon wafer on which a plurality of semiconductor elements are formed on a metal plate, and to perform molding by package resin. Thereafter, the silicon wafer is cut to form separate semiconductor devices.

In the semiconductor devices according to the above-mentioned embodiments and variations thereof, lead pad portions and die pad portions are formed by using divided segments obtained by dividing a metal plate. However, it is also possible to finally remove a portion of the metal plate in an area corresponding to die pad portions, that is, divided segments, and to form the die pad portions by using mounting material. Such method will now be explained as a fifth embodiment. FIGS. 33A and 33B through FIGS. 36A and 36B are plan views and cross sectional views, illustrating a method of manufacturing a semiconductor device as the fifth embodiment in order of manufacturing steps. First, as in the first embodiment mentioned above with reference to FIGS. 4A and 4B, a plurality of concave trenches 131*h* extending in X and Y directions are formed in a square shaped metal plate 101*f* to form divided segments 133*k* in lattice arrangement. Thereafter, as shown in the top plan view of FIG. 33A and in the cross sectional view of FIG. 33B, a central area of the metal plate 101*f* is caved toward the backside of the metal plate 101*f* by press work. Thereby, a concave portion 151 is formed in the central area of the metal plate 101*f*. In this case, the level of the inner bottom portion of the concave portion 151 becomes lower than the level of the backside surface of the metal plate 101*f*, that is, the divided segments 133*k*, at the peripheral portion of the metal plate 101*f* which is not caved.

Figure 34A:
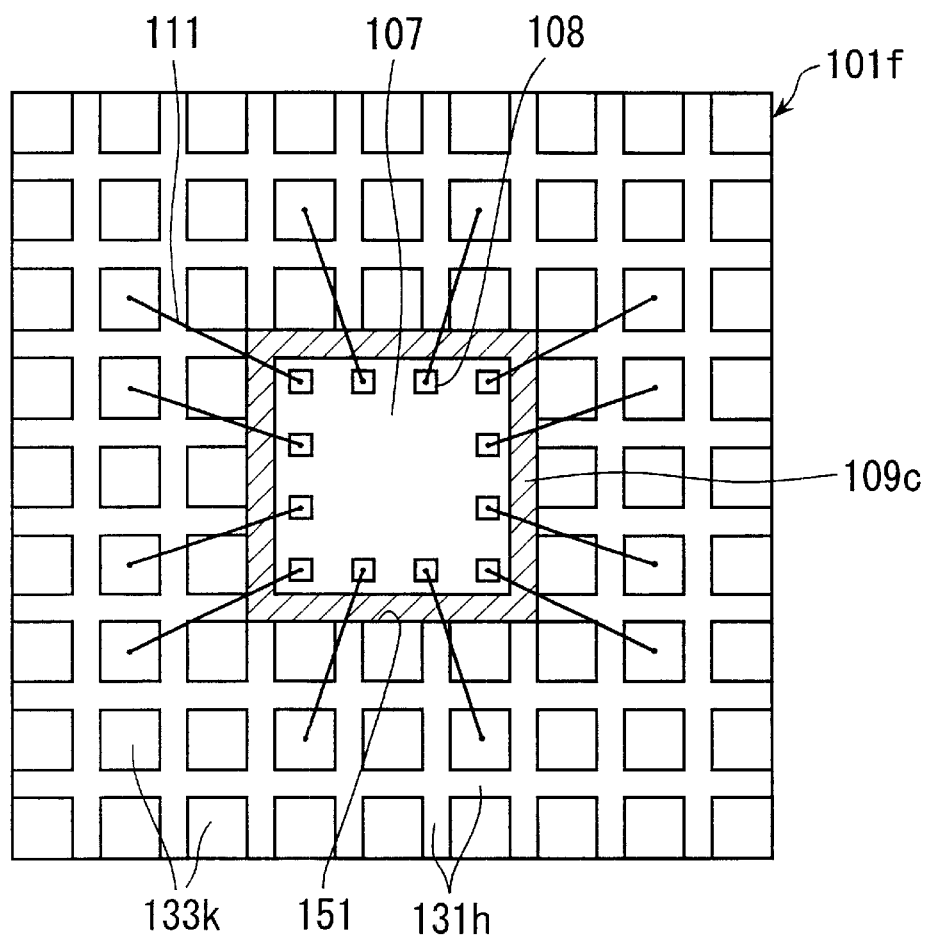
FIG. 34A is a top plan view illustrating a method of manufacturing a semiconductor device according to the fifth embodiment.
Figure 34B:
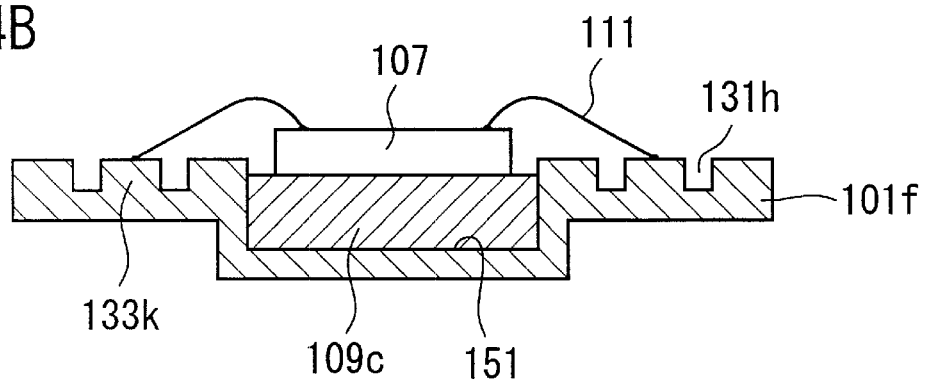
FIG. 34B is a cross sectional view taken along the center line portion of the workpiece of FIG. 34A illustrating a method of manufacturing a semiconductor device according to the fifth embodiment.
Figure 35A:
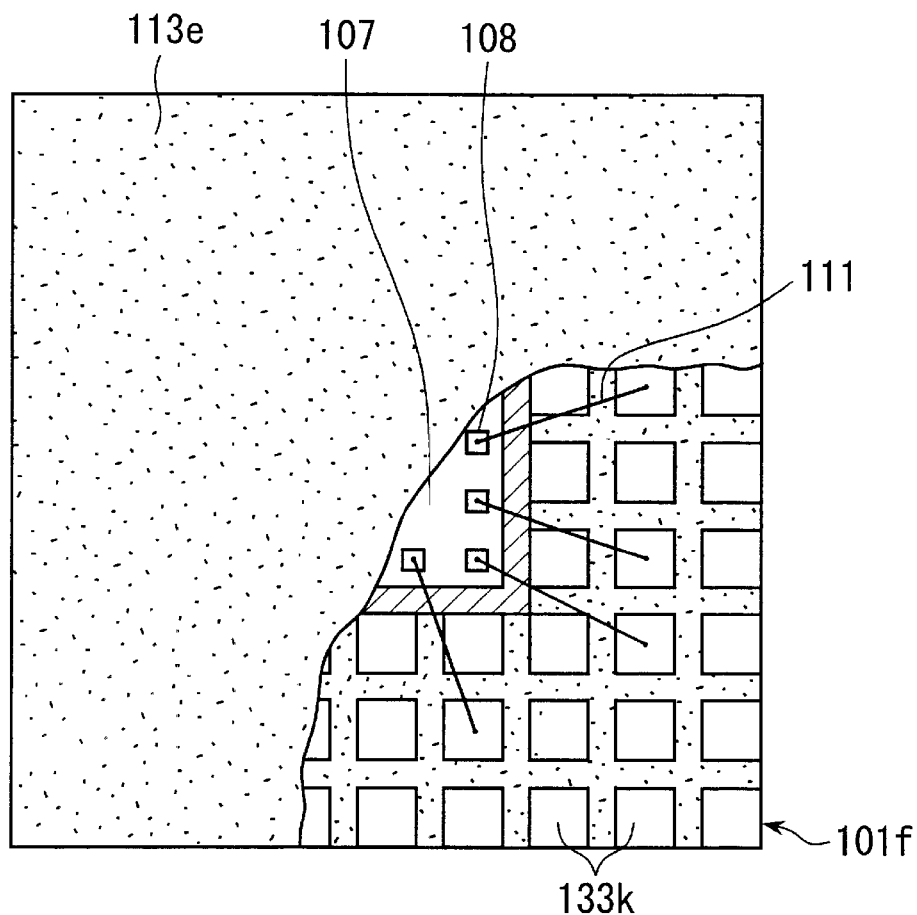
FIG. 35A is a top plan view illustrating a method of manufacturing a semiconductor device according to the fifth embodiment.
Figure 35B:
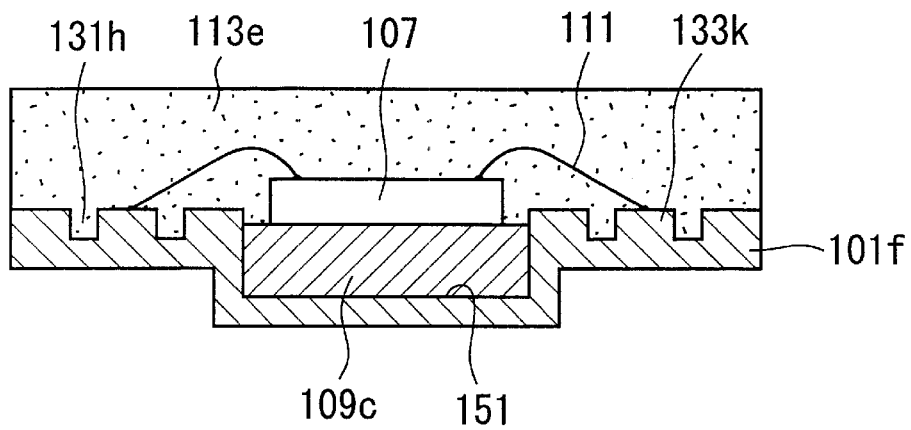
FIG. 35B is a cross sectional view taken along the center line portion of the workpiece of FIG. 35A illustrating a method of manufacturing a semiconductor device according to the fifth embodiment.

As shown in the top plan view of FIG. 34A and in the cross sectional view of FIG. 34B, a semiconductor element 107 is mounted on the concave portion 151 in the central area of the metal plate 101*f* by using mounting material 109*c*. In this case, by adjusting a quantity of the mounting material 109*c*, the level of the backside surface of the mounted semiconductor element 107 becomes higher than the level of the bottom portion of each of the concave trenches 131*h* in the peripheral area external to the concave portion 151. Also, the mounting material 109*c* are made of material such as silver paste and the like which has high moisture resistance and high heat resistance and which has some mechanical strength. Thereafter, electrodes 108 of the semiconductor element 107 and the face side surfaces of the divided segments 133*k* disposed in the periphery of the semiconductor element 107 are electrically coupled via bonding wires 111. Then, as shown in the partially cutaway top plan view of FIG. 35A and in the cross sectional view of FIG. 35B, resin is molded or applied on the face surface of the metal plate 101*f*. Thereby, the package resin portion 113*e* is formed which molds the semiconductor element 107 and the bonding wires 111. In this case, a portion of the package resin portion 113*e* enters into the concave trenches 131*h* in the peripheral area external to the concave portion 151 and, thereby, the divided segments 133*k* are joined together.

Figure 36A:
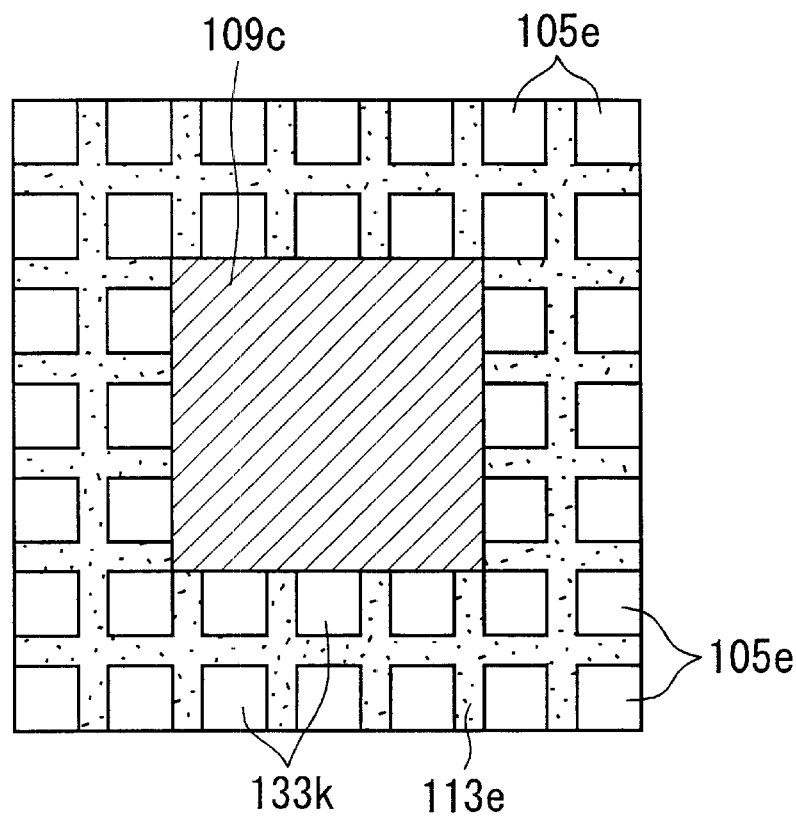
FIG. 36A is a top plan view illustrating a method of manufacturing a semiconductor device according to the fifth embodiment.
Figure 36B:
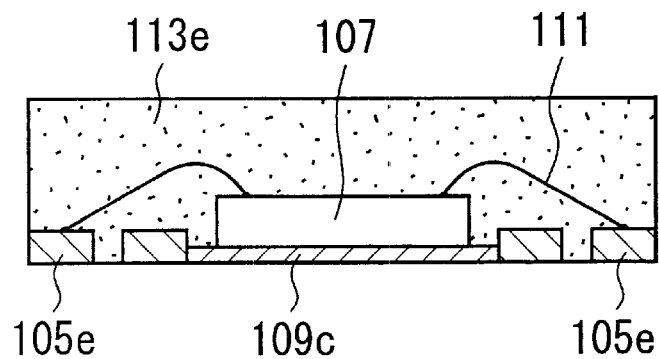
FIG. 36B is a cross sectional view taken along the center line portion of the workpiece of FIG. 36A illustrating a method of manufacturing a semiconductor device according to the fifth embodiment.

As shown in the bottom plan view of FIG. 36A and in the cross sectional view of FIG. 36B, the metal plate 101*f* is polished flat from the backside thereof until reaching the bottom portions of the concave trenches 131*h*. By this polishing, the central portion of the metal plate 101*f* constituting the concave portion 151 is removed. Thereby, the mounting material 109*c* which is used for mounting the semiconductor element 107 on the metal plate 101*f* is exposed. Thus, the semiconductor element 107 is mounted on and supported by the mounting material portion 109*c*. Also, if necessary, the package resin portion 113*e* is cut at predetermined locations by using a dicing saw. The divided segments 133*k* remain only at the peripheral portion of the mounting material 109*c* and form the lead pad portions 105*e*. In the fifth embodiment, by controlling the amount of polishing at the backside of the divided segments 133*k* constituting the lead pad portions 105*e* and by reducing the height of the divided segments 133*k*, it is possible to fabricate very thin semiconductor devices. Also, the fifth embodiment differs from the first through fourth embodiments in that the die pad portion is replaced from the divided segments of the metal plate to the mounting material 109*c*.

Figure 37A:
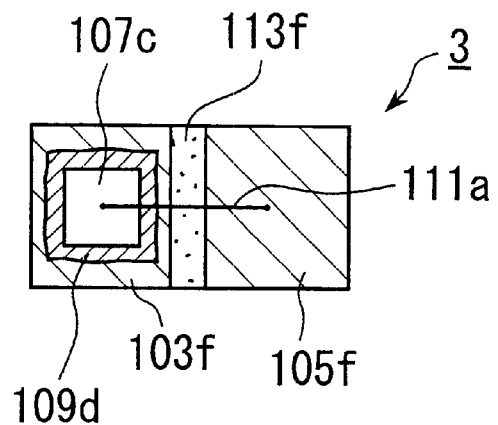
FIG. 37A is a top plan view illustrating a method of manufacturing a semiconductor device according to a sixth embodiment.
Figure 37B:
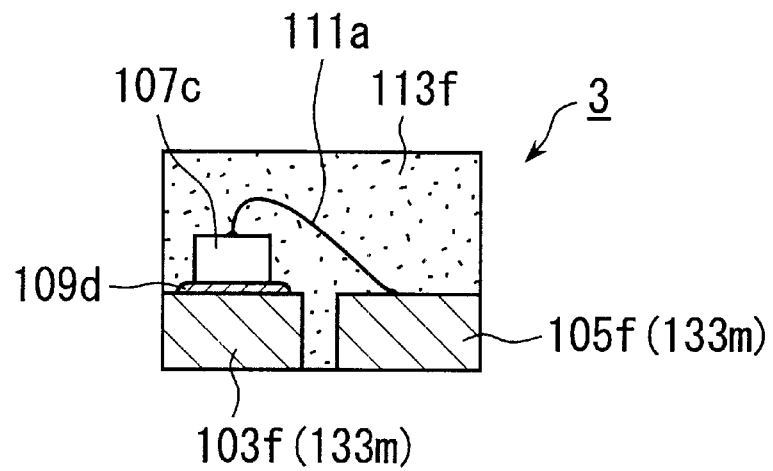
FIG. 37B is a cross sectional view taken along the center line portion of the workpiece of FIG. 37A illustrating a method of manufacturing a semiconductor device according to the sixth embodiment.

In the above-mentioned semiconductor devices according to the first through fifth embodiments and the variations thereof, semiconductor integrated circuit chips are used as semiconductor elements. However, it is possible to apply the present invention to discrete devices such as diodes, transistors and the like. As a sixth embodiment, an explanation will be made on an example in which the present invention is applied to diodes. FIGS. 37A and 37B are a top plan view and a cross sectional view, respectively, illustrating a schematic structure of a diode as the sixth embodiment. In FIG. 37A, for the sake of easy understanding, a package resin portion 113f is removed except a portion between divided segments 133m. As shown in FIGS. 37A and 37B, one of the divided segments 133m is used as a die pad portion 103f (or a lead pad portion on the cathode side), and a diode chip 107c is mounted on the die pad portion 103f via mounting material 109d. The other divided segment 133m adjacent the die pad portion 103f is used as a lead pad portion 105f on the anode side, and the diode chip 107c and the lead pad portion 105f on the anode side are electrically connected via a bonding wire 111a. These divided segments 133m, the diode chip 107c and the like are molded by the package resin 113f. In this way, a discrete diode device 3 is fabricated. As shown in a plan view of FIG. 38A and in a cross sectional view of FIG. 38B, it is possible to apply the present invention to a semiconductor device in which a plurality of diode chips are mounted, that is, to a diode array. In the diode array 3a of FIGS. 38A and 38B, a plurality of divided segments 133m are used as die pad portions 103f, and a diode chip 107c is mounted on each of the die pad portions 103f via mounting material portions 109d. The other divided segments 133m adjacent the die pad portions 103f are used as lead pad portions 105f on the anode side, and the diode chips 107c and the lead pad portions 105f on the anode side are electrically connected via bonding wires 111a. These divided segments 133m, the diode chips 107c and the like are molded and unified by the package resin 113f. In this way, the semiconductor device 3a in which a plurality of diode chips are mounted, that is, the diode array 3a is fabricated. Although not shown in the drawings, it is possible to apply the present invention to a discrete transistor in which a transistor is mounted, or to a transistor array in which a plurality of transistors are mounted. In such case, for example, one divided segment on which a transistor chip is mounted is used as a die pad portion which is also used as a lead pad portion on the collector side. Other two divided segments are used as lead pad portions for a base and an emitter. In case the transistor is a field effect transistor, respective divided segments are used as lead pad portions for a gate, a source and a drain.

Figure 39A:
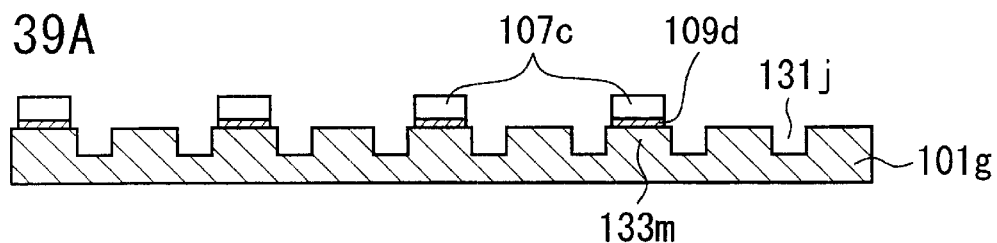
FIG. 39A is a cross sectional view illustrating a condition of workpiece during manufacture in a method of manufacturing a semiconductor device according to the sixth embodiment.
Figure 39B:
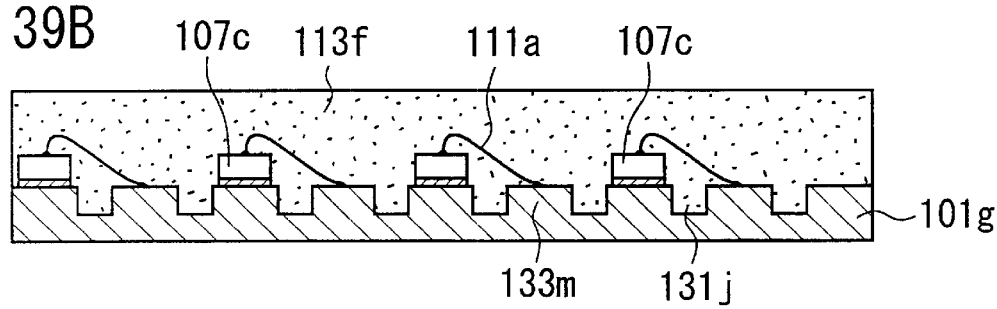
FIG. 39B is a cross sectional view illustrating a condition of workpiece during manufacture in a method of manufacturing a semiconductor device according to the sixth embodiment.

FIGS. 39A through 39D are cross sectional views illustrating a method of manufacturing a discrete diode to which the present invention is applied according to the above-mentioned sixth embodiment. First, as the first embodiment illustrated in FIGS. 4A and 4B, a plurality of concave trenches 131j are formed on the surface of a metal plate 101g in X and Y directions, to form divided segments 133m in a lattice like arrangement. Then, as shown in FIG. 39A, among the divided segments 133m, diode chips 107c are mounted on every other divided segments 133m via mounting material 109d. A substrate portion of each diode chip 107c is composed of an N-type semiconductor, and functions as a cathode of a diode. Thus, the cathode of each diode chip 107 is electrically coupled with the divided segment 133m. Then, an anode electrode provided on the face surface of each of the diode chips 107c not shown in the drawing is electrically coupled via the bonding wire 101a with the divided segment 133m disposed adjacent to the divided segment 133m on which the diode chip 107c is mounted. On the surface of the metal plate 101g, resin is then molded or applied. That is, the diode chips 107c and the bonding wires 101a are molded by a package resin portion 113f. In this case, portions of the package resin 113f enter into the concave trenches 131j.

Figure 38A:
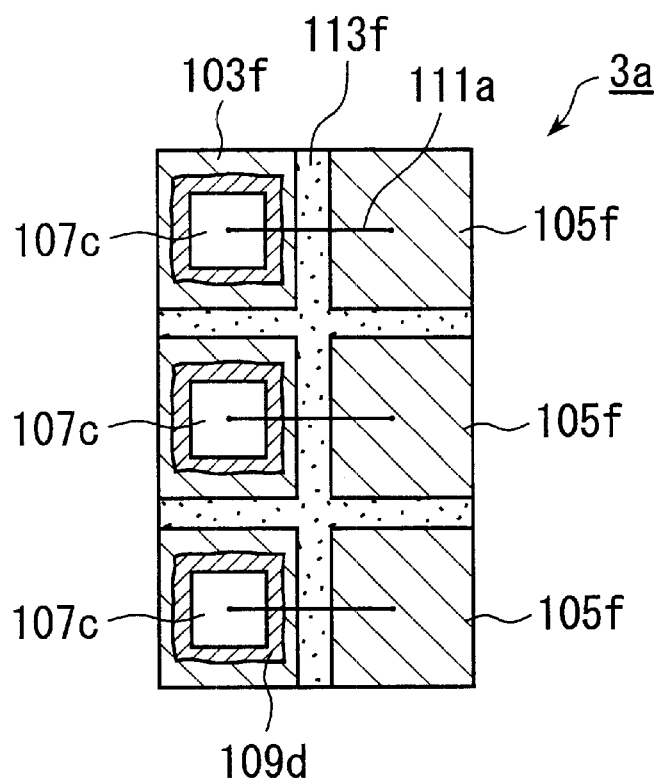
FIG. 38A is a top plan view illustrating a method of manufacturing a semiconductor device including a plurality of diode chips.
Figure 38B:
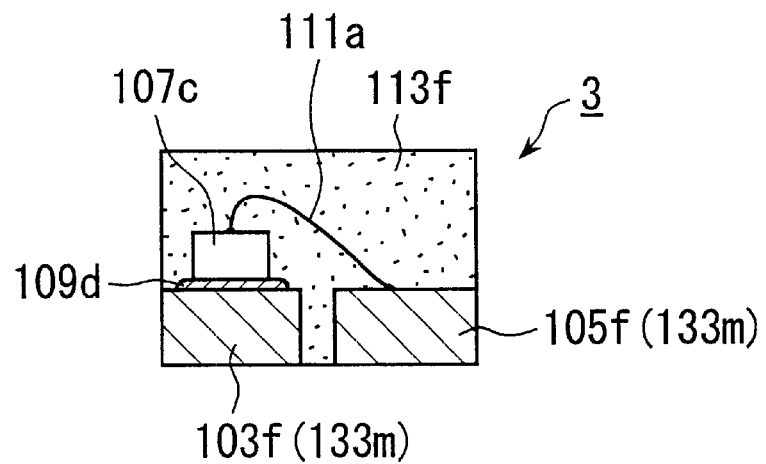
FIG. 38B is a cross sectional view taken along the center line portion of the workpiece of FIG. 38A illustrating a method of manufacturing a semiconductor device including a plurality of diode chips.
Figure 39C:
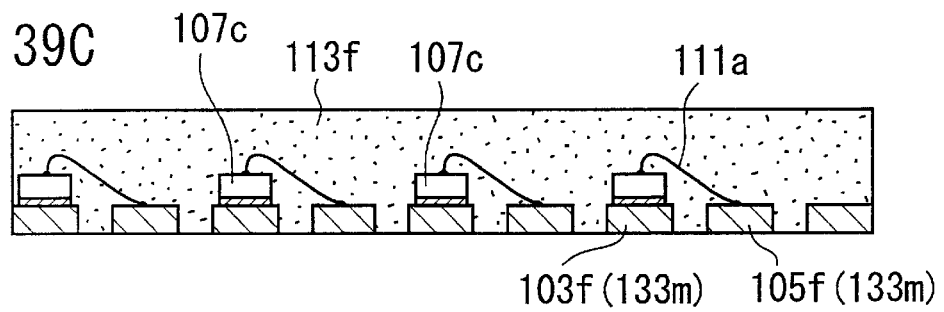
FIG. 39C is a cross sectional view illustrating a condition of workpiece during manufacture in a method of manufacturing a semiconductor device according to the sixth embodiment.
Figure 39D:
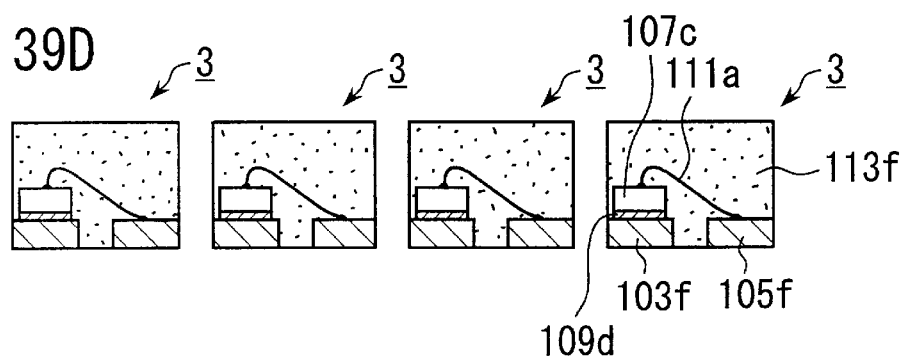
FIG. 39D is a cross sectional view illustrating a condition of workpiece during manufacture in a method of manufacturing a semiconductor device according to the sixth embodiment.
Figure 40:
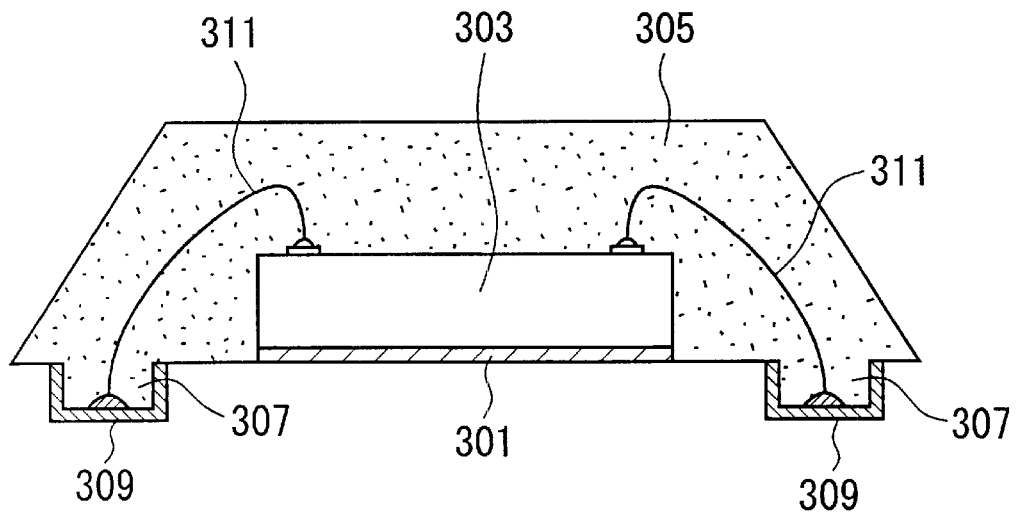
FIG. 40 is a cross sectional view illustrating a first conventional semiconductor device.
Figure 41:
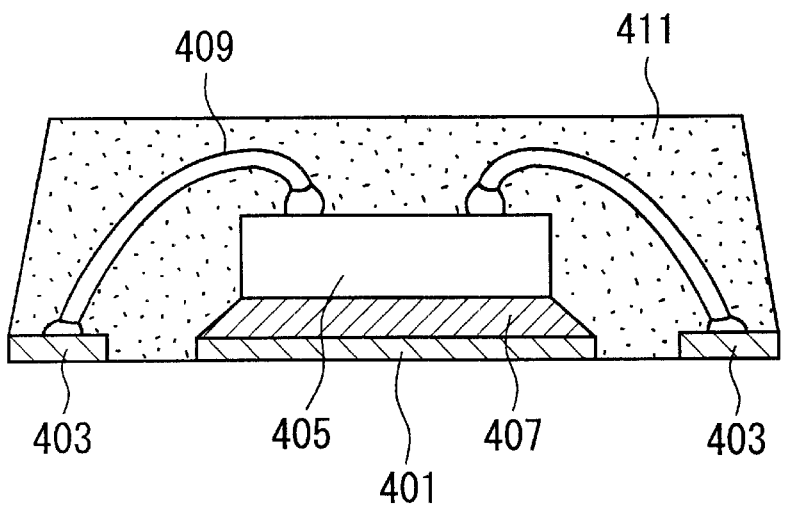
FIG. 41 is a cross sectional view illustrating a second conventional semiconductor device.
Figure 42:
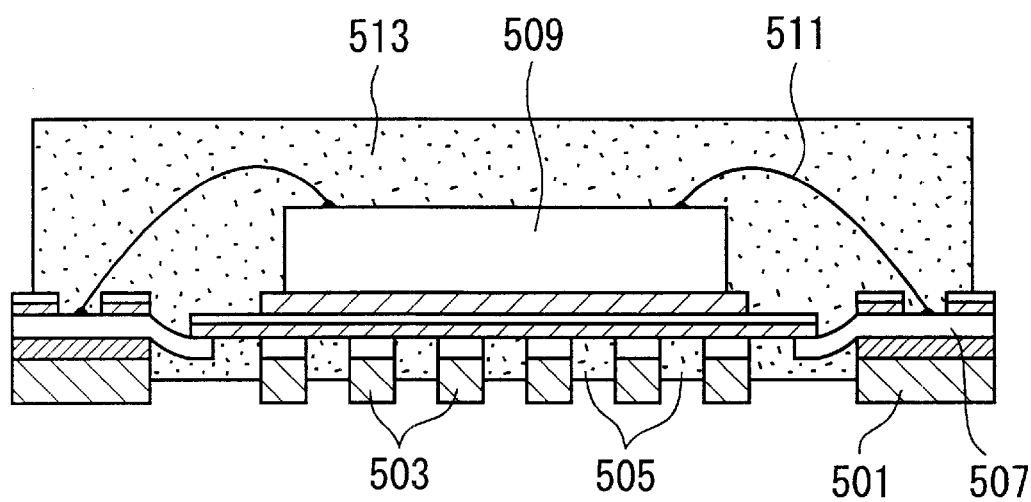
FIG. 42 is a cross sectional view illustrating a third conventional semiconductor device.

As shown in FIG. 39C, the metal plate 101f is polished or etched flat from the backside thereof until reaching the bottom portions of the concave trenches 131j. By this polishing, the divided segments 133m are divided into individual pieces. In this case, the divided segments 133m are unified by the package resin portion 113f but are electrically isolated from each other. Then, as shown in FIG. 39D, the package resin portion 113f is cut into separate pieces by using a dicing saw not shown in the drawing. In this case, the package resin portion 113f can be cut into pieces each having a pair of the divided segments 133m which include the divided segment 133m as the die pad portion 103f and the divided segment 133m as the lead pad portion 105f. By appropriately selecting cutting portions, it is possible to fabricate individual diodes 3 each including one diode chip as shown in FIGS. 37A and 37B, or to fabricate diode arrays 3a each including a plurality of diode chips as shown in FIGS. 38A and 38B.

In the sixth embodiment, it is possible to use a single standardized metal plate 101f even when discrete diodes, or various diode arrays including various number of diode chips are to be fabricated. The diode chips are mounted on such metal plate and molded by package resin. By only changing the portions to be cut finally, it is possible to form discrete diodes, or various diode arrays including various number of diode chips. Therefore, it is not necessary to prepare a plurality kinds of lead members to fabricate a plurality kinds of diode arrays. Also, it is not necessary to prepare a plurality kinds of molding die for package resin. Therefore, it is possible to simplify a manufacturing process, and to reduce costs of semiconductor devices.

The above-mentioned first through sixth embodiments and the variations thereof show typical embodiments or examples of the present invention. By appropriately combining these embodiments and the like, it is possible to provide further diversified semiconductor devices and method of manufacturing the same. Also, with respect to a technique in each of the process steps described in the embodiments and variations thereof, it is possible to replace it by any of various conventionally proposed techniques while retaining advantageous effects mentioned above.

As mentioned above, in a semiconductor device according w to the present invention, a plurality of divided segments are formed from a conductor plate or board, and lead pad portions are constituted of the divided segments which are electrically coupled with electrodes of a semiconductor element. Therefore, by appropriately determining which divided segments are used as lead pad portions depending on the size and kind of each of the semiconductor elements, it is possible to commonly utilize the divided segments for the semiconductor elements having different sizes and kinds to form device packages. Also, it is possible to form die pad portions by using portions of the divided segments and to mount a semiconductor element on the die pad portions. In this case, other portions of the divided segments are used as lead pad portions and electrodes of the semiconductor element are electrically coupled with the lead pad portions via the bonding wires. Alternatively, it is possible to electrically couple bumps provided on electrodes of a semiconductor element with divided segments to form lead pad portions. Thereby, it is possible to mount or dispose a semiconductor element in face-up condition or in face-down condition. The lead pad portions may be disposed in the periphery of the package, or may be disposed in the bottom portion of the package in lattice-like arrangement. The same standard conducting plate can be utilized to fabricate surface-mount type semiconductor devices having lead-less structure, even if the semiconductor devices have different sizes and/or kinds.

In the method of manufacturing a semiconductor device according to the present invention, divided segments are defined by forming concave trenches in a conductor plate. A semiconductor element is mounted on the divided segments, and the semiconductor element and the divided segments are electrically coupled. Thereafter, the backside portion of the conductor plate is removed to form individual divided segments. Therefore, it is possible to easily perform a process of mounting a semiconductor element, a process of electrical connection between the semiconductor element and the divided segments, and a process of forming a package resin portion. Also, it is possible to fabricate a semiconductor device which has a plurality of lead pad portions finally insulated from each other. Therefore, according to the present invention, the number of parts and the number of process steps do not increase uselessly, and manufacturing process can be simplified.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor device comprising:
    a semiconductor element;
    at least one die pad on which said semiconductor element is mounted;
    at least one lead pad; and
    a resin material portion having a grid area, said resin material portion supporting said die pad, said lead pad, and said semiconductor element together;
    wherein said die pad and said lead pad collectively comprise a plurality of segments arranged in a plurality of rows and columns, each said segment having a generally rectangular or square cross-section taken along any plane intersecting said segment;
    wherein at least one said segment of said lead pad and at least one said segment of said die pad are electrically coupled, respectively, with at least two said electrodes of said semiconductor element;
    wherein at least one said segment of said die pad is located directly and completely underneath said semiconductor element, such that no part of said segment extends beyond the perimeter of said semiconductor element, said perimeter defined as the cross-section of said semiconductor element taken along a plane parallel to any plane intersecting all of said plurality of segments;
    wherein said segments are separated from one another by the grid area of said resin material portion, wherein said grid area has a plurality of generally rectangular or square cross-sections taken along any plane intersecting no more than a single said row or column of said segments.

2. A semiconductor device as set forth in claim 1, wherein said at least one said segment of said lead pad and said at least one said segment of said die pad electrically coupled to said electrodes of said semiconductor element are electrically coupled thereto via bonding wires.

3. A semiconductor device comprising:
    a semiconductor element;
    a plurality of segments formed by dividing a conductive plate, at least one of said segments being electrically coupled with an electrode of said semiconductor element; and
    a resin material portion supporting said plurality of segments and said semiconductor element together, wherein (a) said at least one of said segments electrically coupled with said electrodes of said semiconductor element constitute lead pad portions as mounting electrodes, and at least one of other segments among said plurality of segments constitute die pad portions on which said semiconductor element is mounted, and (b) a part of said segments located under said semiconductor element constitute die pad portions, and other part of said segments located under said semiconductor element are electrically coupled with electrodes of said semiconductor element via bumps and constitute lead pad portions;
    wherein, among said plurality of segments, at least one of said segments located under said semiconductor element constitute die pad portions, and at least one of said segments which are disposed in the peripheral portion of said segments constituting said die pad portions and which are electrically coupled with said electrodes of said semiconductor element via bonding wires constitute lead pad portions; and
    wherein said resin material portion seals said semiconductor element and said bonding wires, and fills the space between said segments as said lead pad portions among said plurality of segments.

4. A semiconductor device as set forth in claim 1, wherein said semiconductor element is mounted on said at least one of said segments via mounting material or tape-like adhesive.

5. A semiconductor device comprising:
    a semiconductor element;
    a plurality of segments formed by dividing a conductive plate, at least one of said segments being electrically coupled with an electrode of said semiconductor element; and
    a resin material portion supporting said plurality of segments and said semiconductor element together, wherein (a) said at least one of said segments electrically coupled with said electrodes of said semiconductor element constitute lead pad portions as mounting electrodes, and at least one of other segments among said plurality of segments constitute die pad portions on which said semiconductor element is mounted, and (b) a part of said segments located under said semiconductor element constitute die pad portions, and other part of said segments located under said semiconductor element are electrically coupled with electrodes of said semiconductor element via bumps and constitute lead pad portions;
    wherein said resin material portion seals said semiconductor element, and fills the space between said semiconductor element and said segments located under said semiconductor element and the space between said segments located under said semiconductor element.

6. A semiconductor device comprising:
    a semiconductor element;
    at least one die pad on which said semiconductor element is mounted;

at least one lead pad; and a resin material portion having a grid area, said resin material portion supporting said die pad, said lead pad, and said semiconductor element together;

wherein said die pad and said lead pad collectively comprise a plurality of segments arranged in a plurality of rows and columns, each said segment having at least one crank-like cross-section taken along a plane intersecting no more than a single said row or column said segments;

wherein at least one said segment of said lead pad and at least one said segment of said die pad are electrically coupled, respectively, with at least two said electrodes of said semiconductor element;

wherein said segments are separated from one another by the grid area of said resin material portion, wherein said grid area has a plurality of generally rectangular or square cross-sections taken along any plane intersecting no more than a single said row or column of said segments.

7. A semiconductor device comprising:

a semiconductor element;

a plurality of segments formed by dividing a conductive plate, at least one of said segments being electrically coupled with an electrode of said semiconductor element; and a resin material portion supporting said plurality of segments and said semiconductor element together, wherein (a) said at least one of said segments electrically coupled with said electrodes of said semiconductor element constitute lead pad portions as mounting electrodes, and at least one of other segments among said plurality of segments constitute die pad portions on which said semiconductor element is mounted, and (b) a part of said segments located under said semiconductor element constitute die pad portions, and other part of said segments located under said semiconductor element are electrically coupled with electrodes of said semiconductor element via bumps and constitute lead pad portions;

wherein said plurality of segments are disposed around said semiconductor element but are not disposed under said semiconductor element, at least one of said segments are electrically coupled with electrodes of said semiconductor element via bonding wires and constitute lead pad portions as mounting electrodes, and said resin material portion seals said semiconductor element and said bonding wires and fills the space between respective segments of said plurality of segments.

8. A semiconductor device as set forth in claim 1, wherein said semiconductor element is a semiconductor integrated circuit chip, and electrodes of said semiconductor integrated circuit chip are respectively coupled with said segments of said lead pad.

9. A semiconductor device as set forth in claim 1, wherein said semiconductor element is a diode chip, said diode chip is mounted on at least one of said plurality of segments, and an electrode of said diode chip is electrically coupled with other one of said segments adjacent said segment on which said diode chip is mounted.

10. A semiconductor device as set forth in claim 1, wherein said semiconductor element is a transistor chip, said transistor chip is mounted on one of said plurality of segments, and electrodes of said transistor chip are electrically coupled with two of said segments adjacent said segment on which said transistor chip is mounted.

11. A semiconductor device as set forth in claim 1, wherein a ball-like electrode is formed on the backside surface of at least one of said segments of said lead pad.

12. A semiconductor device as set forth in claim 1, wherein at least one bump, solder bump or studbump connects at least one segment of said lead pad to an electrode of said semiconductor element.

13. A semiconductor device as set forth in claim 1, wherein a resist film is formed on the backside surface of said at least one said segment of said die pad.

14. A semiconductor device as set forth in claim 1, wherein an outer dimension of a group of said segments which constitute said die pad and said lead pad is larger than an outer dimension of said semiconductor element.

15. A semiconductor device as set forth in claim 1, wherein an outer dimension of a group of said segments which constitute said die pad and said lead pad is substantially equal to an outer dimension of said semiconductor element.

16. A semiconductor device comprising:

a semiconductor element;

a plurality of segments formed by dividing a conductive plate, at least one of said segments being electrically coupled with an electrode of said semiconductor element; and a resin material portion supporting said plurality of segments and said semiconductor element together, wherein said plurality of segments are disposed around said semiconductor element but are not disposed under said semiconductor element, at least one of said segments are electrically coupled with electrodes of said semiconductor element via bonding wires and constitute lead pad portions as mounting electrodes, and said resin material portion seals said semiconductor element and said bonding wires and fills the space between respective segments of said plurality of segments.

17. A semiconductor device as set forth in claim 16, wherein said at least one of said segments electrically coupled with said electrodes of said semiconductor element constitute lead pad portions as mounting electrodes, and at least one of other segments among said plurality of segments constitute die pad portions on which said semiconductor element is mounted.

18. A semiconductor device as set forth in claim 16, wherein, among said plurality of segments, at least one of said segments located under said semiconductor element constitute die pad portions, and at least one of said segments which are disposed in the peripheral portion of said segments constituting said die pad portions and which are electrically coupled with said electrodes of said semiconductor element via bonding wires constitute lead pad portions.

19. A semiconductor device as set forth in claim 18, wherein said resin material portion seals said semiconductor element and said bonding wires, and fills the space between said segments as said lead pad portions among said plurality of segments.

20. A semiconductor device as set forth in claim 17, wherein said semiconductor element is mounted on said at least one of said segments as die pad portions via mounting material or tape-like adhesive.

21. A semiconductor device as set forth in claim 17, wherein a part of said segments located under said semiconductor element constitute die pad portions, and other part of said segments located under said semiconductor element are electrically coupled with electrodes of said semiconductor element via bumps and constitute lead pad portions.

22. A semiconductor device as set forth in claim 21, wherein said resin material portion seals said semiconductor element, and fills the space between said semiconductor element and said segments located under said semiconductor element and the space between said segments located under said semiconductor element.

23. A semiconductor device as set forth in claim 16, wherein said plurality of segments are formed by dividing a conductive plate into a lattice-like arrangement.

24. A semiconductor device as set forth in claim 16, wherein each of said segments has a crank-like cross section in the direction of thickness of said conductive plate.

25. A semiconductor device as set forth in claim 17, wherein said semiconductor element is a semiconductor integrated circuit chip, and electrodes of said semiconductor integrated circuit chip are respectively coupled with said segments as lead pad portions among said plurality of segments.

26. A semiconductor device as set forth in claim 17, wherein said semiconductor element is a diode chip, said diode chip is mounted on one of said plurality of segments, and an electrode of said diode chip is electrically coupled with other one of said segments adjacent said divided segment on which said diode chip is mounted.

27. A semiconductor device as set forth in claim 17, wherein said semiconductor element is a transistor chip, said transistor chip is mounted on one of said plurality of segments, and electrodes of said transistor chip are electrically coupled with two of said segments adjacent said divided segment on which said transistor chip is mounted.

28. A semiconductor device as set forth in claim 17, wherein a ball-like electrode is formed on the backside surface of said at least one of said segments constituting said lead pad portions.

29. A semiconductor device as set forth in claim 21, wherein said bumps are solder bumps or studbumps.

30. A semiconductor device as set forth in claim 17, wherein a resist film is formed on the backside surface of said at least one of said segments constituting said die pad portions.

31. A semiconductor device as set forth in claim 17, wherein an outer dimension of a group of said segments which constitute said die pad portions and said lead pad portions is larger than an outer dimension of said semiconductor element.

32. A semiconductor device as set forth in claim 21, wherein an outer dimension of a group of said segments which constitute said die pad portions and said lead pad portions is substantially equal to an outer dimension of said semiconductor element.

33. A semiconductor device comprising:
 a semiconductor element;
 a plurality of segments formed by dividing a conductive plate, at least one of said segments being electrically coupled with an electrode of said semiconductor element, and
 a resin material portion supporting said plurality of segments and said semiconductor element together, wherein each of said segments comprise rigid, flat walled elements having a crank-like cross section in the direction of thickness of said conductive plate.

34. A semiconductor device as set forth in claim 33, wherein said at least one of said segments electrically coupled with said electrodes of said semiconductor element constitute lead pad portions as mounting electrodes, and at least one of other segments among said plurality of segments constitute die pad portions on which said semiconductor element is mounted.

35. A semiconductor device as set forth in claim 34, wherein, among said plurality of segments, at least one of said segments located under said semiconductor element constitute die pad portions, and at least one of said segments which are disposed in the peripheral portion of said segments constituting said die pad portions and which are electrically coupled with said electrodes of said semiconductor element via bonding wires constitute lead pad portions.

36. A semiconductor device, wherein, among said plurality of segments, at least one of said segments located under said semiconductor element constitute die pad portions, and at least one of said segments which are disposed in the peripheral portion of said segments constituting said die pad portions and which are electrically coupled with said electrodes of said semiconductor element via bonding wires constitute lead pad portions, and wherein said resin material portion seals said semiconductor element and said bonding wires, and fills the space between said segments as said lead pad portions among said plurality of segments.

37. A semiconductor device as set forth in claim 34, wherein said semiconductor element is mounted on said at least one of said segments as die pad portions via mounting material or tape-like adhesive.

38. A semiconductor device as set forth in claim 34, wherein a part of said segments located under said semiconductor element constitute die pad portions, and other part of said segments located under said semiconductor element are electrically coupled with electrodes of said semiconductor element via bumps and constitute lead pad portions.

39. A semiconductor device, wherein a part of said segments located under said semiconductor element constitute die pad portions, and other part of said segments located under said semiconductor element are electrically coupled with electrodes of said semiconductor element via bumps and constitute lead pad portions, and wherein said resin material portion seals said semiconductor element, and fills the space between said semiconductor element and said segments located under said semiconductor element and the space between said segments located under said semiconductor element.

40. A semiconductor device as set forth in claim 33, wherein said plurality of segments are formed by dividing a conductive plate into a lattice-like arrangement.

41. A semiconductor device comprising:
 a semiconductor element;
 a plurality of segments formed by dividing a conductive plate, at least one of said segments being electrically coupled with an electrode of said semiconductor element; and
 a resin material portion supporting said plurality of segments and said semiconductor element together, wherein each of said segments comprise rigid, flat walled elements having a crank-like cross section in the direction of thickness of said conductive plate, wherein said plurality of segments are disposed around said semiconductor element but are not disposed under said semiconductor element, at least one of said segments are electrically coupled with electrodes of said semiconductor element via bonding wires and constitute lead pad portions as mounting electrodes, and said resin material portion seals said semiconductor element and said bonding wires and fills the space between respective segments of said plurality of segments.

42. A semiconductor device as set forth in claim 34, wherein said semiconductor element is a semiconductor integrated circuit chip, and electrodes of said semiconductor integrated circuit chip are respectively coupled with said segments as lead pad portions among said plurality of segments.

43. A semiconductor device as set forth in claim 34, wherein said semiconductor element is a diode chip, said diode chip is mounted on one of said plurality of segments, and an electrode of said diode chip is electrically coupled with other one of said segments adjacent said divided segment on which said diode chip is mounted.

44. A semiconductor device as set forth in claim 34, wherein said semiconductor element is a transistor chip, said transistor chip is mounted on one of said plurality of segments, and electrodes of said transistor chip are electrically coupled with two of said segments adjacent said divided segment on which said transistor chip is mounted.

45. A semiconductor device as set forth in claim 34, wherein a ball-like electrode is formed on the backside surface of said at least one of said segments constituting said lead pad portions.

46. A semiconductor device as set forth in claim 38, wherein said bumps are solder bumps or studbumps.

47. A semiconductor device as set forth in claim 34, wherein a resist film is formed on the backside surface of said at least one of said segments constituting said die pad portions.

48. A semiconductor device as set forth in claim 34, wherein an outer dimension of a group of said segments which constitute said die pad portions and said lead pad portions is larger than an outer dimension of said semiconductor element.

49. A semiconductor device as set forth in claim 38, wherein an outer dimension of a group of said segments which constitute said die pad portions and said lead pad portions is substantially equal to an outer dimension of said semiconductor element.

* * * * *

UNITED STATES PATENT AND TRADEMARK OFFICE
CERTIFICATE OF CORRECTION

PATENT NO. : 6,498,392 B2
DATED : December 24, 2002
INVENTOR(S) : Azuma

It is certified that error appears in the above-identified patent and that said Letters Patent is hereby corrected as shown below:

<u>Column 33,</u>
Line 13, "column said" should be -- column of said --.

<u>Column 36,</u>
Line 5, "arc" should be -- are --.

Signed and Sealed this

Sixth Day of July, 2004

JON W. DUDAS
*Acting Director of the United States Patent and Trademark Office*